United States Patent
Higuchi et al.

(10) Patent No.: US 6,768,064 B2
(45) Date of Patent: Jul. 27, 2004

(54) MULTILAYER WIRING BOARD ASSEMBLY, MULTILAYER WIRING BOARD ASSEMBLY COMPONENT AND METHOD OF MANUFACTURE THEREOF

(75) Inventors: Reiji Higuchi, Chiba (JP); Shouji Itou, Chiba (JP); Osamu Nakao, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 10/190,496

(22) Filed: Jul. 9, 2002

(65) Prior Publication Data

US 2003/0019662 A1 Jan. 30, 2003

(30) Foreign Application Priority Data

| Jul. 10, 2001 | (JP) | P2001-209595 |
| Jun. 27, 2002 | (JP) | P2002-188639 |
| Jun. 27, 2002 | (JP) | P2002-188640 |
| Jun. 27, 2002 | (JP) | P2002-188660 |
| Jun. 27, 2002 | (JP) | P2002-188664 |

(51) Int. Cl.[7] .......................... H01R 12/04; H05K 1/11
(52) U.S. Cl. ........................ 174/267; 174/258; 174/261
(58) Field of Search .................. 174/258–267; 361/792–795, 778; 29/846–852; 428/209–210

(56) References Cited

U.S. PATENT DOCUMENTS

| 5,129,142 A | * | 7/1992 | Bindra et al. ............... 29/852 |
| 5,435,480 A | * | 7/1995 | Hart et al. ............... 228/180.1 |
| 5,473,120 A | * | 12/1995 | Ito et al. ..................... 174/264 |
| 5,601,672 A | * | 2/1997 | Casey et al. ............. 156/89.16 |
| 6,083,340 A | * | 7/2000 | Nomura et al. ............. 156/253 |
| 6,108,903 A | * | 8/2000 | Nakatani et al. ............... 29/852 |
| 6,125,531 A | * | 10/2000 | Farquhar et al. ............... 29/852 |
| 6,195,883 B1 | * | 3/2001 | Bhatt et al. ................... 29/852 |
| 6,440,542 B1 | * | 8/2002 | Kariya ........................ 428/209 |
| 6,465,084 B1 | * | 10/2002 | Curcio et al. ............... 428/209 |

OTHER PUBLICATIONS

K. Takagi, pps. 77–79, "Build–Up Multilayered Printed Circuit Board Technology" (with English translation).

* cited by examiner

*Primary Examiner*—Carl Whitehead, Jr.
*Assistant Examiner*—Tuan Dinh
(74) *Attorney, Agent, or Firm*—Oblon, Spivak, McClelland, Maier & Neustadt, P.C.

(57) ABSTRACT

A multilayer wiring board assembly, a multilayer wiring board assembly component and a method of manufacture thereof are described in which it is possible to easily laminate together flexible FPCs having highly packing densities by via-on-via and chip-on-via. The multilayer wiring board assembly is laminated by laminating together a plurality of multilayer wiring board assembly components, each of which is made by preparing a copper plated resin film 10 made of a copper plated resin film made of a resin film having adhesivity which is provided with a copper foil bonded to one surface thereof and in which a through hole is opened through said copper foil and said resin film, and a conductive paste embedded by screen printing in the through hole of said copper plated resin film from said copper foil with a leading end of said conductive paste being projected from said resin film.

6 Claims, 25 Drawing Sheets

FIG.9
(a)
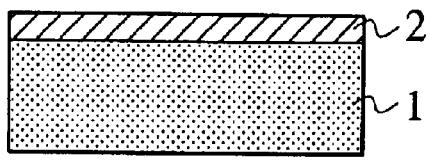
(b)
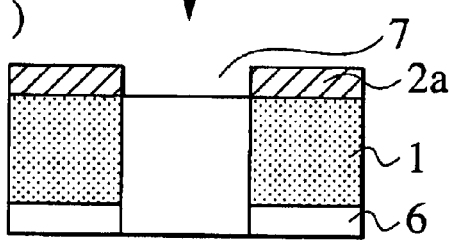
(c)
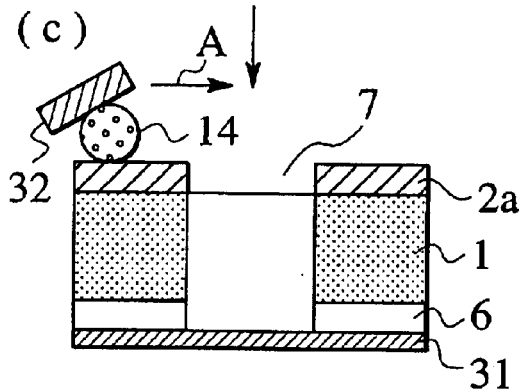
(d)
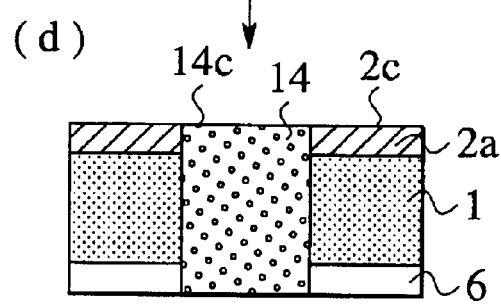
(e)
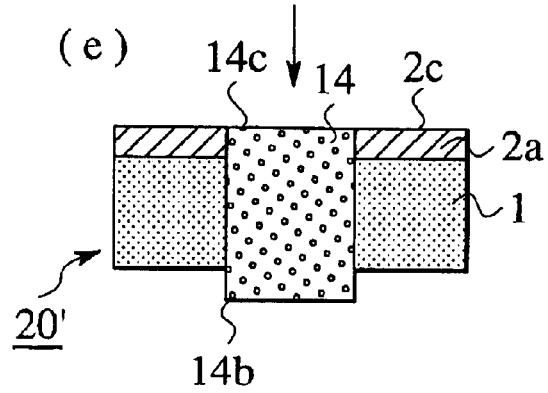

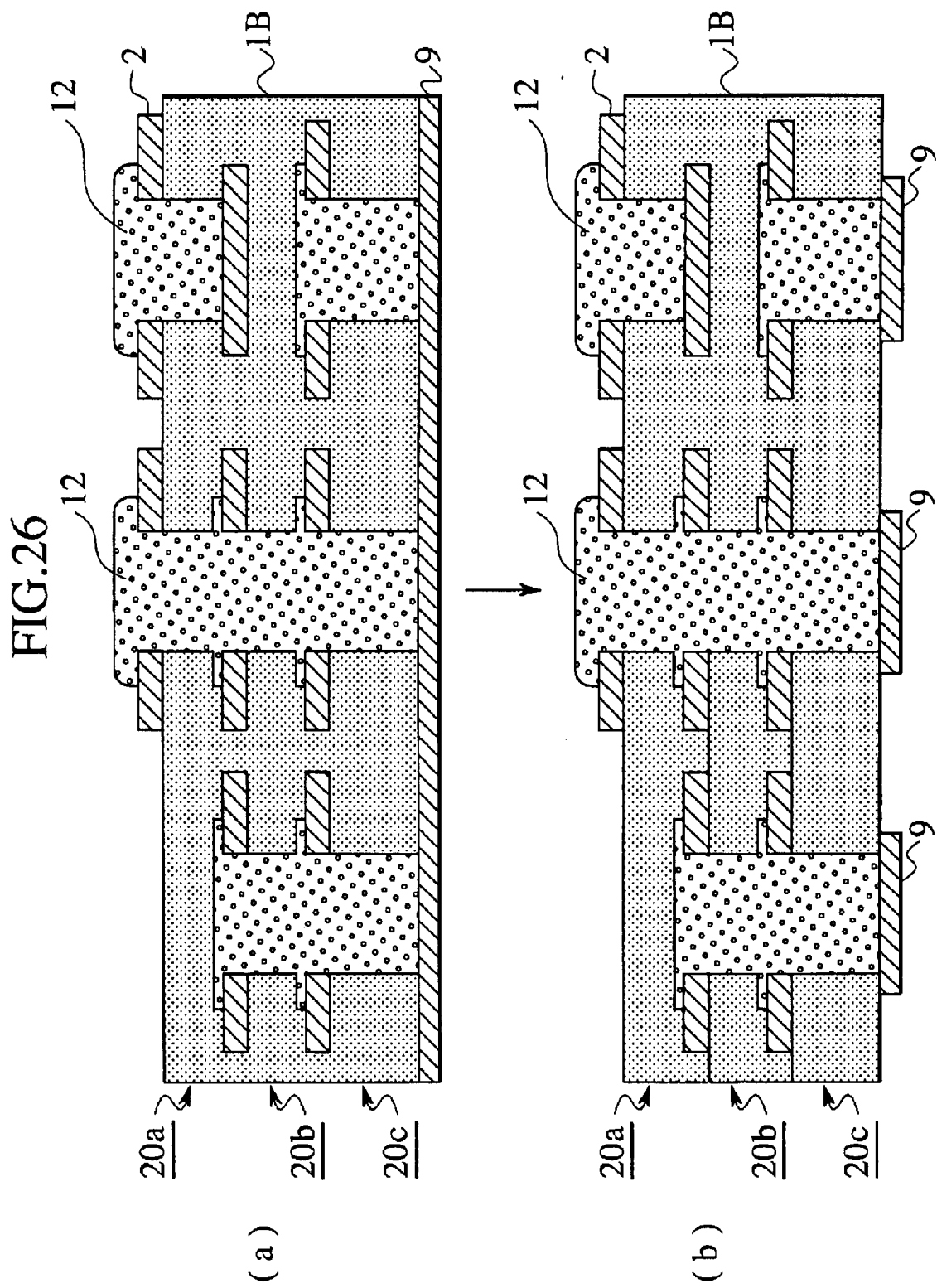

MULTILAYER WIRING BOARD ASSEMBLY, MULTILAYER WIRING BOARD ASSEMBLY COMPONENT AND METHOD OF MANUFACTURE THEREOF

CROSS REFERENCE TO RELATED APPLICATIONS

This application is based upon and claims the benefit of priority from prior Japanese Patent Application P2001-209595 filed on Jul. 10th, 2001, prior Japanese Patent Application P2002-188639 filed on Jun. 27th, 2002, prior Japanese Patent Application P2002-188660 filed on Jun. 27th, 2002, prior Japanese Patent Application P2002-188640 filed on Jun. 27th, 2002, prior Japanese Patent Application P2002-188664 filed on Jun. 27th, 2002; the entire contents of which are incorporated by reference herein.

BACKGROUND OF THE INVENTION

1. Field of the invention

The present invention relates to a multilayer wiring board assembly composed of a plurality of printed circuit boards in a multilayered structure, a multilayer wiring board assembly component for use in laminating the same and the manufacturing method of the same. In particular, the present invention relates to a multilayer wiring board assembly, a multilayer wiring board assembly component for use in laminating the same and the manufacturing method of the same, wherein the multilayer wiring board assembly is flexible and implemented with a highly packing density by the Flip Chip Mounting technique and so forth.

2. Description of the Related Art

A flexible printed circuit board (which is simply referred to as an "FPC" in this description) is composed of a resin film having a small thickness for the purpose of maintaining the flexibility thereof. Because of this, in the case of such FPCs, it is essentially very difficult to assemble a plurality of FPCs in a multilayered structure (a multilayer wiring board assembly). However, along with the advent of the implementation of FPCs with a highly packing density, the need for multilayered structures of FPCs has increased in recent years, for example, in consideration of the arrangement of lead wirings as connected to flip chips mounted on FPCs. In this situation, a multilayer wiring board assembly has been manufactured by multilayering a plurality of FPCs with an intervening glass epoxy prepreg sheet and so forth between each adjacent boards while one or both surface of each FPC has been formed with a circuit pattern, forming holes through the entirety of all the layers by means of a drill and the like, and interlayer interconnecting the layers by the use of a through hall plating and the like.

However, in the case of such a conventional method of manufacturing multilayer wiring board assemblies by the use of is a through hall plating, it is impossible to form a via hole anew on another via hole and to mount a chip on a via hole, generally called as via-on-via since a hole remains in the center of a through hall even after plating. Because of this, when a multilayer wiring board assembly is implemented with a highly packing density, there are several impediments such that a lead can not be extended from the position just below the chip while interlayer interconnection tends to excessively occupy a substantial area.

On the other hand, for example, ALIVH (Any Layer Interstitial Via Hole: a registered trademark of Matsushita Electric Industrial Co., Ltd.) is a rigid multilayer wiring board assembly in which via-on-via is possible while a conductive paste is used for interlayer interconnection between each adjacent layers. An ALIVH board is formed by repeating the process sequence including opening a through hole in an uncured resin board, filling the through hole with a conductive paste, joining a copper foil to the uncured resin board, hardening the resin while compression bonding in order to form a multilayered structure and etching the copper foil in order to form a circuit pattern.

However, while via-on-via is possible in the case of the manufacturing method as described above to form ALIVH boards since the interlayer interconnection is made by means of a conductive paste, it is extremely difficult to manufacture FPCs in the form of a multilayer wiring board assembly by applying the manufacturing method to FPCs because it is necessary to open a hole through a resin film such as a polyimide film having a small thickness followed by filling up the hole with a conductive paste. This is because, when opening a hole in a resin film having a small thickness, the position and the size of the hole tend to change due to distortion of the resin film, the sucking force of a drill and the like so that the necessary accuracy of alignment is hardly achieved during the printing operation of the conductive paste and the positioning of the respective layers.

Also, while via-on-via is possible in the case of the manufacturing method making use of a conductive paste for the interlayer interconnection like ALIVH, it is difficult to make electric connection between a copper foil and a conductive paste without compromising the electric characteristics of the copper foil and the conductive paste so that the respective venders make use of proprietary methods respectively. Namely, generally speaking, when interlayer interconnection is made by via-on-via, a copper foil and a conductive paste are connected to each other by inserting the copper foil between adjacent conductive paste layers. In this case, the conductive paste is arranged to pierce the copper foil for the purpose of preserving electric connectivity between the copper foil and the conductive paste. For example, in the case of an ALIVH board, a conductive paste is printed in order to form a projection while the thickness of the board is reduced during thermocompression for bonding because of the use of an uncured resin board so that it becomes possible to make electric connection of a copper foil pierced by the projection of the conductive paste.

However, in the case of a board made of such a substance that the thickness of the board is not reduced during thermocompression for bonding, like a polyimide used for making a resin film in the case of FPCs, the projection of a conductive paste is less effective in piecing the copper foil. As a result, it is difficult to make electric connection between a copper foil and a conductive paste without compromising the electric characteristics.

Furthermore, in the case where a through hole is filled with a conductive paste, the conductive paste is printed in the condition that the surface of the conductive paste is slightly depressed since the conductive paste is pressed during printing. Because of this, there is a problem that, even if boards having through holes filled with a conductive paste are joined to each other, it is impossible to achieve sufficient electric connectivity between the fillers of the conductive paste.

Also, while the resin film having adhesivity is contracted or expanded during heating, the contraction or expansion can be cancelled out if there is a center line of symmetry in the cross section thereof. However, in the case of an adhesive layer having no center line of symmetry, there is observed curl in the cross section of the board during heating for lamination. Particularly, a polyimide film is a highly flexuous material and therefore tends to be significantly curled.

BRIEF SUMMARY OF THE INVENTION

The present invention has been made in order to solve the shortcomings as described above. It is an object of the present invention to provide a multilayer wiring board assembly, a multilayer wiring board assembly component and a method of manufacture thereof in which it is possible to easily laminate together flexible FPCs having highly packing densities by via-on-via and chip-on-via.

It is another object of the present invention to provide a multilayer wiring board assembly which can be manufactured by joining multilayer wiring board assembly components to each other with a uniform pressure and therefore it is possible to fixedly laminate the multilayer wiring board assembly with a better electric connectivity.

It is a further object of the present invention to provide a multilayer wiring board assembly which is manufactured in order that the opening of a through hole near a copper foil is placed on a plane table having a hole of a diameter larger than that of the through hole followed by filling the through hole with a conductive paste from a masking tape in order to form a brim laterally extending beyond the perimeter of the opening of the copper foil, and therefore it is possible to form the brim having a desired profile with a high degree of accuracy and having a smaller thickness than that in the case utilzing a mask, and therefore possible to fixedly laminate the multilayer wiring board assembly with a better electric connectivity.

It is a still further object of the present invention to provide a multilayer wiring board assembly in which the contact area of a conductive paste with a copper foil is increased when compression bonding multilayer wiring board assembly components to each other, and therefore it is possible to improve electric connectivity.

It is a still further object of the present invention to provide a multilayer wiring board assembly in which it is possible to manufacture a multilayer wiring board assembly having a good heat resisting property with little damage to the respective boards during the manufacturing process by the use of a resin film having adhesivity made of a thermosetting resin.

It is a still further object of the present invention to provide a multilayer wiring board assembly in which it is possible to manufacture a multilayer wiring board assembly having a good heat resisting property without damaging the conductive resin components (the conductive paste) by the use of a resin film having adhesivity formed of a thermoplastic resin to which is given a thermosetting property.

In accordance with an aspect of the present invention, a multilayer wiring board assembly component comprises:

a copper plated resin film made of a resin film having adhesivity which is provided with a copper foil bonded to one surface thereof and in which a through hole is opened through said copper foil and said resin film; and a conductive paste embedded by screen printing in the through hole of said copper plated resin film from said copper foil with a leading end of said conductive paste being projected from said resin film.

In accordance with another aspect of the present invention, a multilayer wiring board assembly laminated with a plurality of multilayer wiring board assembly components, at least one of said multilayer wiring board assembly components comprises:

a copper plated resin film made of a resin film having adhesivity which is provided with a copper foil bonded to one surface thereof and in which a through hole is opened through said copper foil and said resin film; and a conductive paste embedded by screen printing in the through hole of said copper plated resin film from said copper foil with a leading end of said conductive paste being projected from said resin film, wherein the leading end of said conductive paste of said at least one of said multilayer wiring board assembly components makes electric contact with the copper foil or the conductive paste of an adjacent one of said multilayer wiring board assembly components.

In accordance with a further aspect of the present invention, a manufacturing method of a multilayer wiring board assembly component comprises:

a step of forming a through hole in a copper plated resin film made of a resin film having adhesivity which is provided with a copper foil bonded to one surface thereof and in which said through hole is opened through said copper foil and said resin film; and a step of embedding a conductive paste by screen printing in the through hole of said copper plated resin film from said copper foil with a leading end of said conductive paste being projected from said resin film.

In accordance with a still further aspect of the present invention, a manufacturing method of a multilayer wiring board assembly component comprises:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of embedding a conductive paste by screen printing in the through hole of said copper plated resin film from said copper foil; and a step of removing said mask layer.

In accordance with a still further aspect of the present invention, in a manufacturing method of a multilayer wiring board assembly laminated with a plurality of multilayer wiring board assembly components, at least one of said multilayer wiring board assembly components comprises:

a copper plated resin film made of a resin film having adhesivity which is provided with a copper foil bonded to one surface thereof and in which a through hole is opened through said copper foil and said resin film; and a conductive paste embedded by screen printing in the through hole of said copper plated resin film from said copper foil with a leading end of said conductive paste being projected from said resin film, wherein said multilayer wiring board assembly is laminated with a plurality of said multilayer wiring board assembly components through said resin film in order that the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a multilayer wiring board assembly component comprises:

a copper plated resin film made of a resin film having adhesivity which is provided with a copper foil bonded to one surface thereof and in which a through hole is opened through said copper foil and said resin film; and a conductive paste embedded in the through hole of said copper plated resin film from said copper foil with a leading end of said conductive paste being projected from said resin film.

In accordance with a still further aspect of the present invention, a manufacturing method of a multilayer wiring board assembly component comprises:

a step of forming a through hole in a copper plated resin film made of a resin film having adhesivity which is provided with a copper foil bonded to one surface thereof and in which said through hole is opened through said copper foil and said resin film; and a step of embedding a conductive paste in the through hole from said copper foil with a leading end of said conductive paste being projected from said resin film.

In accordance with a still further aspect of the present invention, a multilayer wiring board assembly component comprises:

a copper plated resin film made of a resin film having adhesivity which is provided with a copper foil bonded to one surface thereof and in which a through hole is opened through said copper foil and said resin film; and a conductive paste embedded in the through hole of said copper plated resin film with one end of said conductive paste being projected from said resin film and the tail end of said conductive paste being projected to the same height as said copper foil.

In accordance with a still further aspect of the present invention, a multilayer wiring board assembly component comprises:

a copper plated resin film made of a resin film having adhesivity which is provided with a copper foil bonded to one surface thereof and in which a through hole is opened through said copper foil and said resin film; and a conductive paste embedded by screen printing in the through hole of said copper plated resin film from said copper foil with a leading end of said conductive paste being projected from said resin film and with part of said conductive paste being laterally extending beyond the perimeter of the opening of the through hole of said copper foil.

In accordance with a still further aspect of the present invention, a multilayer wiring board assembly laminated with a plurality of multilayer wiring board assembly components, the most outer layer of said multilayer wiring board assembly components comprises:

a copper plated resin film made of a resin film having adhesivity which is provided with a copper foil bonded to one surface thereof and in which a through hole is opened through said copper foil and said resin film; and a conductive paste embedded in the through hole of said copper plated resin film from said copper foil with one end of said conductive paste being projected from said resin film and the tail end of said conductive paste being projected to the same height as said copper foil, wherein the leading end of said conductive paste of said most outer multilayer wiring board assembly components makes electric contact with said copper foil or said conductive paste of an adjacent one of said multilayer wiring board assembly components.

In accordance with a still further aspect of the present invention, a multilayer wiring board assembly laminated with a plurality of multilayer wiring board assembly components includes:

a first multilayer wiring board assembly component comprising a copper plated resin film made of a resin film having adhesivity which is provided with a copper foil bonded to one surface thereof and in which a through hole is opened through said copper foil and said resin film, and a conductive paste embedded in the through hole of said copper plated resin film from said copper foil with a leading end of said conductive paste being projected from said resin film and with part of said conductive paste being laterally extending beyond the perimeter of the opening of the through hole of said copper foil; and a second multilayer wiring board assembly component comprising a copper plated resin film made of a resin film having adhesivity which is provided with a copper foil bonded to one surface thereof and in which a through hole is opened through said copper foil and said resin film, and a conductive paste embedded in the through hole of said copper plated resin film from said copper foil with a leading end of said conductive paste being projected from said resin film and the tail end of said conductive paste being projected to the same height as said copper foil, wherein said second multilayer wiring board assembly component is located as the most outer layer of the multilayer wiring board assembly while said first multilayer wiring board assembly component is located as an inner layer of the multilayer wiring board assembly other than said second multilayer wiring board assembly, and wherein the leading end of said conductive paste of one of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly laminated with a plurality of multilayer wiring board assembly components includes:

a first multilayer wiring board assembly component comprising a copper plated resin film made of a resin film having adhesivity which is provided with a copper foil bonded to one surface thereof and in which a through hole is opened through said copper foil and said resin film, and a conductive paste embedded in the through hole of said copper plated resin film from said copper foil with a leading end of said conductive paste being projected from said resin film and with part of said conductive paste being laterally extending beyond the perimeter of the opening of the through hole of said copper foil; and a second multilayer wiring board assembly component comprising a copper plated resin film made of a resin film having adhesivity which is provided with a copper foil bonded to one surface thereof and in which a through hole is opened through said copper foil and said resin film, and a conductive paste embedded in the through hole of said copper plated resin film from said copper foil with a leading end of said conductive paste being projected from said resin film and the tail end of said conductive paste being projected to the same height as said copper foil, wherein said second multilayer wiring board assembly component is located as the most outer layer of the multilayer wiring board assembly while said first multilayer wiring board assembly component is located as an inner layer of the multilayer wiring board assembly other than said second multilayer wiring board assembly, and wherein said multilayer wiring board assembly is laminated with a plurality of said multilayer wiring board assembly components through said resin film in order that the leading end of said conductive paste of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly component comprises:

a step of forming a through hole in a copper plated resin film made of a resin film having adhesivity which is provided with a copper foil bonded to one surface thereof and in which said through hole is opened through said copper foil and said resin film; and a step of embedding a conductive paste in the through hole of said copper plated resin film from said copper foil with a leading end of said conductive paste being projected from said resin film and the tail end of said conductive paste being projected-to the same height as said copper foil.

In accordance with a still further aspect of the present invention, a manufacturing method of a multilayer wiring board assembly component comprises:

a step of forming a mask layer on an adhesive layer bonded to one surface of a copper plated resin film made of a resin film having adhesivity which is provided with a copper foil bonded to the other surface thereof;

a step of forming a through hole opened through said copper foil, said resin film and said mask layer;

a step of embedding a conductive paste in the through hole with the tail end of said conductive paste being located at the same height as said copper foil; and a step of removing said mask layer to leave the tail end of said conductive paste being projected from said resin film.

In accordance with a still further aspect of the present invention, a manufacturing method of a multilayer wiring board assembly component comprises:

a step of forming a through hole in a copper plated resin film made of a resin film having adhesivity which is provided with a copper foil bonded to one surface thereof and in which said through hole is opened through said copper foil and said resin film; and a step of embedding a conductive paste by screen printing in the through hole of said copper plated resin film from said copper foil with a leading end of said conductive paste being projected from said resin film with part of said conductive paste being laterally extending beyond the perimeter of the opening of the through hole of said copper foil.

In accordance with a still further aspect of the present invention, a manufacturing method of a multilayer wiring board assembly component comprises:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of embedding a conductive paste by screen printing in the through hole of said copper plated resin film from said copper foil with part of said conductive paste being laterally extending beyond the perimeter of the opening of the through hole of said copper foil; and a step of removing said mask layer to leave the tail end of said conductive paste being projected from said resin film.

In accordance with a still further aspect of the present invention, a manufacturing method of a multilayer wiring board assembly component comprises:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

is a step of placing, on said copper foil over said through hole, a mask of a thickness larger than that of said through hole;

a step of embedding a conductive paste in said through hole with the tail end of said conductive paste being located at the same height as said mask;

a step of removing said mask to leave said tail end of said conductive paste being projected from said copper foil with part of said conductive paste being laterally extending beyond the perimeter of the opening of the through hole of said copper foil; and a step of removing said mask to leave the tail end of said conductive paste being projected from said resin film.

In accordance with a still further aspect of the present invention, in a multilayer wiring board assembly laminated with a plurality of multilayer wiring board assembly components, at least one of said multilayer wiring board assembly components is manufactured by:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of placing, on said copper foil over said through hole, a mask of a thickness larger than that of said through hole;

a step of embedding a conductive paste in said through hole with the tail end of said conductive paste being located at the same height as said mask;

a step of removing said mask to leave said tail end of said conductive paste being projected from said copper foil with part of said conductive paste being laterally extending beyond the perimeter of the opening of the through hole of said copper foil; and a step of removing said mask to leave the tail end of said conductive paste being projected from said resin film, wherein the leading end of said conductive paste of said at least one of said multilayer wiring board assembly components makes electric contact with said copper foil or said conductive paste of an adjacent one of said multilayer wiring board assembly components.

In accordance with a still further aspect of the present invention, in a manufacturing method of a multilayer wiring board assembly laminated with a plurality of multilayer wiring board assembly components, at least one of said multilayer wiring board assembly components is manufactured by:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of placing, on said copper foil over said through hole, a mask of a thickness larger than that of said through hole;

a step of embedding a conductive paste in said through hole with the tail end of said conductive paste being located at the same height as said mask;

a step of removing said mask to leave said tail end of said conductive paste being projected from said copper foil with part of said conductive paste being laterally extending beyond the perimeter of the opening of the through hole of said copper foil; and a step of removing said mask to leave the tail end of said conductive paste being projected from said resin film, wherein said multilayer wiring board assembly is laminated with a plurality of said multilayer wiring board assembly components through said resin film in order that the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly component comprises:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of placing said copper plated resin film on a plane table in which a hole is opened with a thickness larger than that of said through hole in order that said copper foil is located in a lower position with the through hole located over the hole of said plane table;

a step of embedding a conductive paste by screen printing in the through hole of said copper plated resin film from said mask layer with a leading end of said conductive paste being projected from said copper foil with part of said conductive paste being laterally extending beyond the perimeter of the opening of the through hole of said copper foil; and a step of removing said mask layer to leave the leading end of said conductive paste being projected from said resin film.

In accordance with a still further aspect of the present invention, in a multilayer wiring board assembly laminated with a plurality of multilayer wiring board assembly components, at least one of said multilayer wiring board assembly components is manufactured by:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of placing said copper plated resin film on a plane table in which a hole is opened with a thickness larger than that of said through hole in order that said copper foil is located in a lower position with the through hole located over the hole of said plane table;

a step of embedding a conductive paste in the through hole of said copper plated resin film from said mask layer with a leading end of said conductive paste being projected from said copper foil with part of said conductive paste being laterally extending beyond the perimeter of the opening of the through hole of said copper foil; and a step of removing said mask layer to leave the tail end of said conductive paste being projected from said resin film, wherein said tail end of said conductive paste of said at least one of said multilayer wiring board assembly components makes electric contact with said copper foil or said conductive paste of an adjacent one of said multilayer wiring board assembly components.

In accordance with a still further aspect of the present invention, in a manufacturing method of a multilayer wiring board assembly laminated with a plurality of multilayer wiring board assembly components, at least one of said multilayer wiring board assembly components is manufactured by:

a step of etching a copper plated resin film made of a resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of placing said copper plated resin film on a plane table in which a hole is opened with a thickness larger than that of said through hole in order that said copper foil is located in a lower position with the through hole located over the hole of said plane table;

a step of embedding a conductive paste in the through hole of said copper plated resin film from said mask layer with a leading end of said conductive paste being projected from said copper foil with part of said conductive paste being laterally extending beyond the perimeter of the opening of the through hole of said copper foil; and a step of removing said mask layer to leave the tail end of said conductive paste being projected from said resin film, wherein said multilayer wiring board assembly is laminated with a plurality of said multilayer wiring board assembly components through said resin film in order that said tail end of said conductive paste of said at least one of said multilayer wiring board assembly components makes electric contact with said copper foil or said conductive paste of an adjacent one of said multilayer wiring board assembly components.

In accordance with a still further aspect of the present is invention, a multilayer wiring board assembly component comprises:
- a copper plated resin film made of a resin film having adhesivity which is provided with a copper foil bonded to one surface thereof and in which a through hole is opened through said copper foil and said resin film; and
- a conductive paste embedded in the through hole of said copper plated resin film from said copper foil with a leading end of said conductive paste being projected from said resin film and with the tail end of said conductive paste being projected from said copper foil.

In accordance with a still further aspect of the present invention, in a multilayer wiring board assembly laminated with a plurality of multilayer wiring board assembly components, at least one of said multilayer wiring board assembly components comprises:
- a copper plated resin film made of a resin film having adhesivity which is provided with a copper foil bonded to one surface thereof and in which a through hole is opened through said copper foil and said resin film; and
- a conductive paste embedded in the through hole of said copper plated resin film from said copper foil with a leading end of said conductive paste being projected from said resin film and with the tail end of said conductive paste being projected from said copper foil, wherein the leading end of said conductive paste of said at least one of said multilayer wiring board assembly components makes electric contact with said copper foil or said conductive paste of an adjacent one of said multilayer wiring board assembly components.

In accordance with a still further aspect of the present invention, in a multilayer wiring board assembly laminated with a plurality of multilayer wiring board assembly components, at least one of said multilayer wiring board assembly components comprises:
- a copper plated resin film made of a resin film having adhesivity which is provided with a copper foil bonded to one surface thereof and in which a through hole is opened through said copper foil and said resin film; and
- a conductive paste embedded in the through hole of said copper plated resin film from said copper foil with a leading end of said conductive paste being projected from said resin film and with the tail end of said conductive paste being projected from said copper foil, wherein said multilayer wiring board assembly is laminated with a plurality of said multilayer wiring board assembly components through said resin film in order that the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly component comprises:
- a step of forming a through hole in a copper plated resin film made of a resin film having adhesivity which is provided with a copper foil bonded to one surface thereof and in which said through hole is opened through said copper foil and said resin film; and
- a step of embedding a conductive paste in the through hole of said copper plated resin film from said copper foil with a leading end of said conductive paste being projected from said resin film with the tail end of said conductive paste being projected from said copper foil.

In accordance with a still further aspect of the present invention, a manufacturing method of a multilayer wiring board assembly component comprises:
- a step of preparing a copper plated resin film made of a resin film having adhesivity which is provided with a copper foil bonded to one surface thereof and forming first and second mask layers on said one surface and the other surface opposed to said one surface of said copper plated resin film;
- a step of forming a through hole opened through said copper foil, said resin film and said first and second mask layers;
- a step of embedding a conductive paste in said through hole with the leading and tail ends of said conductive paste being located at the same height as said mask layers; and
- a step of removing said first and second mask layers to leave the leading end of said conductive paste being projected from said resin film with the tail end of said conductive paste being projected from said copper foil.

In accordance with a still further aspect of the present invention, a multilayer wiring board assembly component comprises:
- a copper plated resin film made of a thermosetting resin film having adhesivity which is provided with a copper foil bonded to one surface thereof and in which a through hole is opened through said copper foil and said resin film; and
- a conductive paste embedded in the through hole of said copper plated resin film from said copper foil with a leading end of said conductive paste being projected from said resin film.

In accordance with a still further aspect of the present invention, in a multilayer wiring board assembly laminated with a plurality of multilayer wiring board assembly components, at least one of said multilayer wiring board assembly components comprises:
- a copper plated resin film made of a thermosetting resin film having adhesivity which is provided with a copper foil bonded to one surface thereof and in which a through hole is opened through said copper foil and said resin film; and
- a conductive paste embedded in the through hole of said copper plated resin film from said copper foil with a leading end of said conductive paste being projected from said resin film, wherein the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly component comprises:
- a step of forming a through hole in a copper plated resin film made of a thermosetting resin film having adhesivity which is provided with a copper foil bonded to one surface thereof and in which said through hole is opened through said copper foil and said resin film; and a step of embedding a conductive paste in the through hole of said copper plated resin film from said copper foil with a leading end of said conductive paste being projected from said resin film.

In accordance with a still further aspect of the present invention, a manufacturing method of a multilayer wiring board assembly component comprises:

a step of etching a copper plated resin film made of a thermosetting resin film having adhesivity which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of embedding a conductive paste in the through hole of said copper plated resin film from said copper foil; and a step of removing said mask layer.

In accordance with a still further aspect of the present invention, a multilayer wiring board assembly laminated with a plurality of multilayer wiring board assembly components, at least one of said multilayer wiring board assembly components comprises:

a copper plated resin film made of a thermosetting resin film having adhesivity which is provided with a copper foil bonded to one surface thereof and in which a through hole is opened through said copper foil and said resin film; and a conductive paste embedded in the through hole of said copper plated resin film from said copper foil with a leading end of said conductive paste being projected from said resin film, wherein said multilayer wiring board assembly is laminated with a plurality of said multilayer wiring board assembly components through said resin film in order that the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a multilayer wiring board assembly component comprises:

a copper plated resin film made of a thermosetting resin film having adhesivity and which is provided with a copper foil bonded to one surface thereof and in which a through hole is opened through said copper foil and said resin film; and a conductive paste embedded in the through hole of said copper plated resin film from said copper foil with a leading end of said conductive paste being projected from said resin film.

In accordance with a still further aspect of the present invention, a multilayer wiring board assembly laminated with a plurality of multilayer wiring board assembly components, at least one of said multilayer wiring board assembly components comprises:

a copper plated resin film made of a resin film to which is given a thermosetting property and which is provided with a copper foil bonded to one surface thereof and in which a through hole is opened through said copper foil and said resin film; and a conductive paste embedded in the through hole of said copper plated resin film from said copper foil with a leading end of said conductive paste being projected from said resin film, wherein the leading end of said conductive paste of said at least one of said multilayer wiring board assembly components makes electric contact with said copper foil or said conductive paste of an adjacent one of said multilayer wiring board assembly components.

In accordance with a still further aspect of the present invention, a manufacturing method of a multilayer wiring board assembly component comprises:

a step of forming a through hole in a copper plated resin film made of a resin film to which is given a thermosetting property and which is provided with a copper foil bonded to one surface thereof and in which said through hole is opened through said copper foil and said resin film; and a step of embedding a conductive paste in the through hole of said copper plated resin film from said copper foil with a leading end of said conductive paste being projected from said resin film.

In accordance with a still further aspect of the present invention, a manufacturing method of a multilayer wiring board assembly component comprises:

a step of etching a copper plated resin film made of a resin film to which is given a thermosetting property and which is provided with a copper foil bonded to one surface thereof in order to form a predetermined circuit pattern;

a step of forming a mask layer on said resin film of the copper plated resin film having been formed with said circuit pattern;

a step of forming a through hole opened through said copper foil, said resin film and said mask layer;

a step of embedding a conductive paste by screen printing in the through hole of said copper plated resin film from said copper foil; and a step of removing said mask layer.

In accordance with a still further aspect of the present invention, in a manufacturing method of a multilayer wiring board assembly laminated with a plurality of multilayer wiring board assembly components, at least one of said multilayer wiring board assembly components comprises:

a copper plated resin film made of a resin film to which is given a thermosetting property and which is provided with a copper foil bonded to one surface thereof and in which a through hole is opened through said copper foil and said resin film; and a conductive paste embedded in the through hole of said copper plated resin film from said copper foil with a leading end of said conductive paste being projected from said resin film, wherein said multilayer wiring board assembly is laminated with said resin film having adhesivity by thermocompression at about 180° C. in order that said leading end of said conductive paste of said at least one of said multilayer wiring board assembly components makes electric contact with said copper foil or said conductive paste of an adjacent one of said multilayer wiring board assembly components.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 9 shows cross sectional views of the intermediate structures of a second multilayer wiring board assembly component for use in manufacturing a multilayer wiring board assembly in accordance with an still further embodiment of the present invention in the order of the manufacturing steps.

FIG. 26 shows cross sectional views showing the multilayer wiring board assembly in accordance with the still further embodiment of the present invention in the order of the manufacturing steps.

DETAILED DESCRIPTION OF THE INVENTION

In the followings, various preferred embodiments of the present invention will be described with reference to the accompanying drawings.

Figure 1:
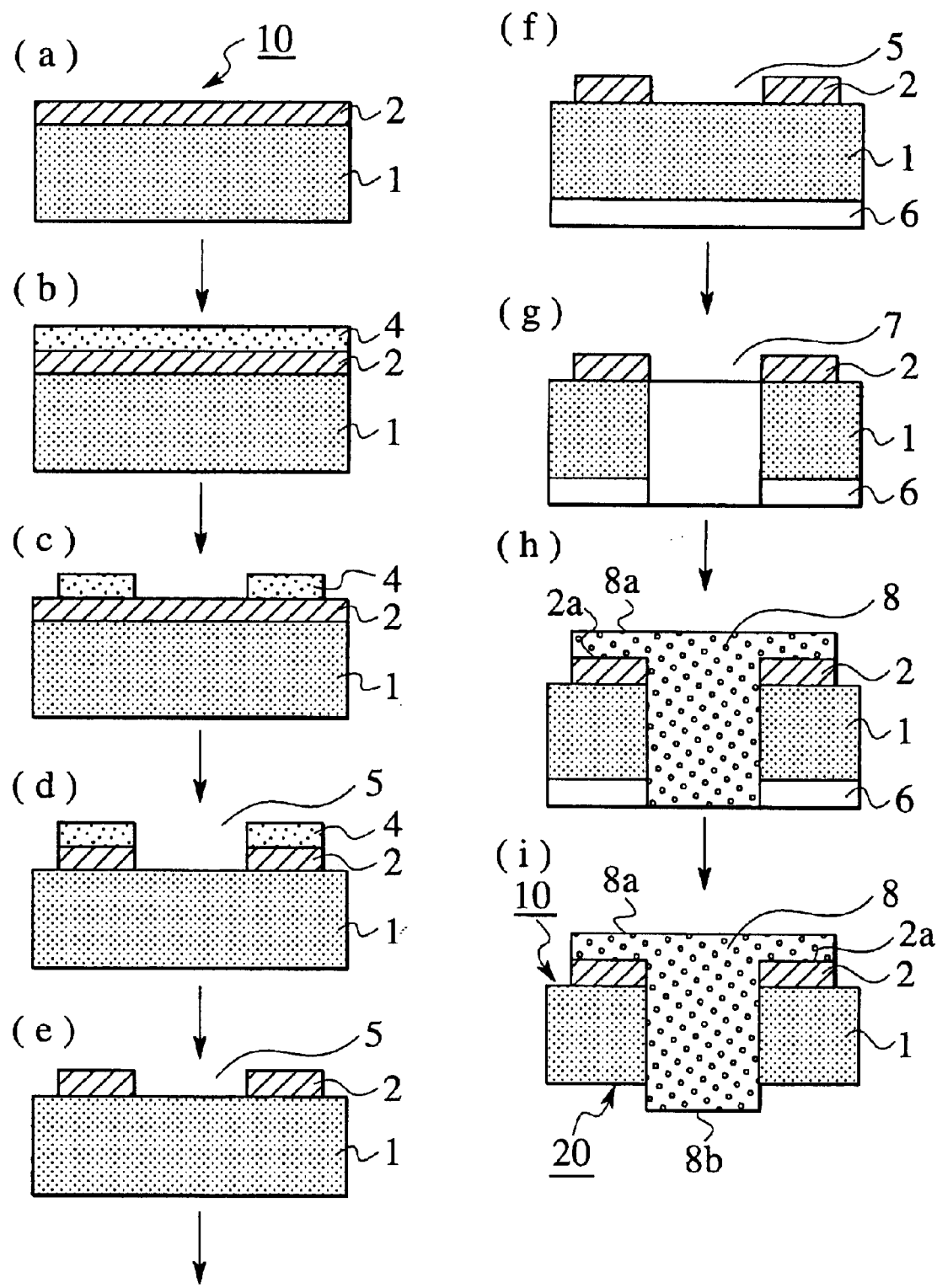
FIG. 1 shows cross sectional views of the intermediate structures of a multilayer wiring board assembly component for use in manufacturing a multilayer wiring board assembly in accordance with an embodiment of the present invention in the order of the manufacturing steps.
Figure 2:
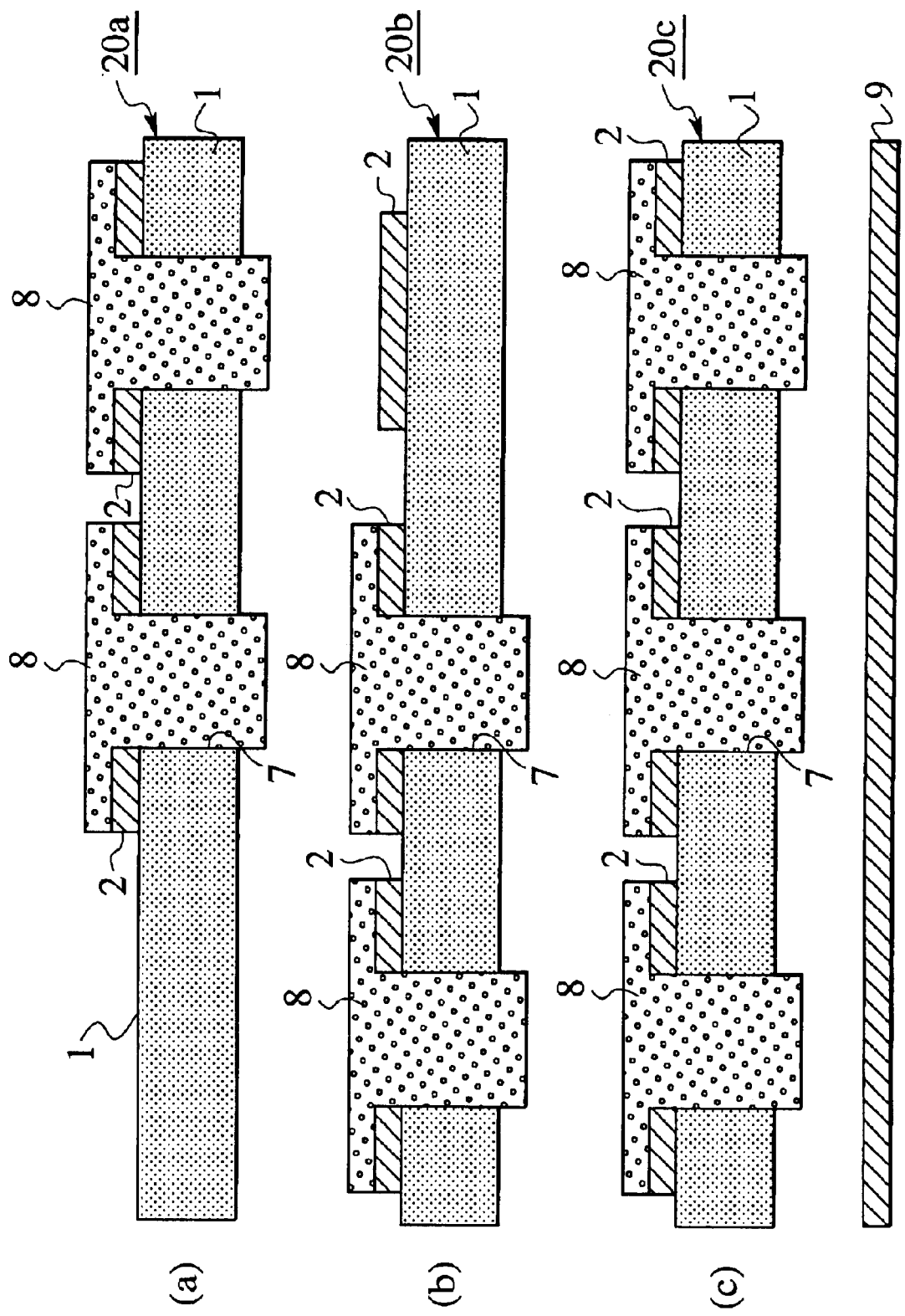
FIG. 2 shows cross sectional views showing the multilayer wiring board assembly in accordance with the embodiment of the present invention in the order of the manufacturing steps.
Figure 3:
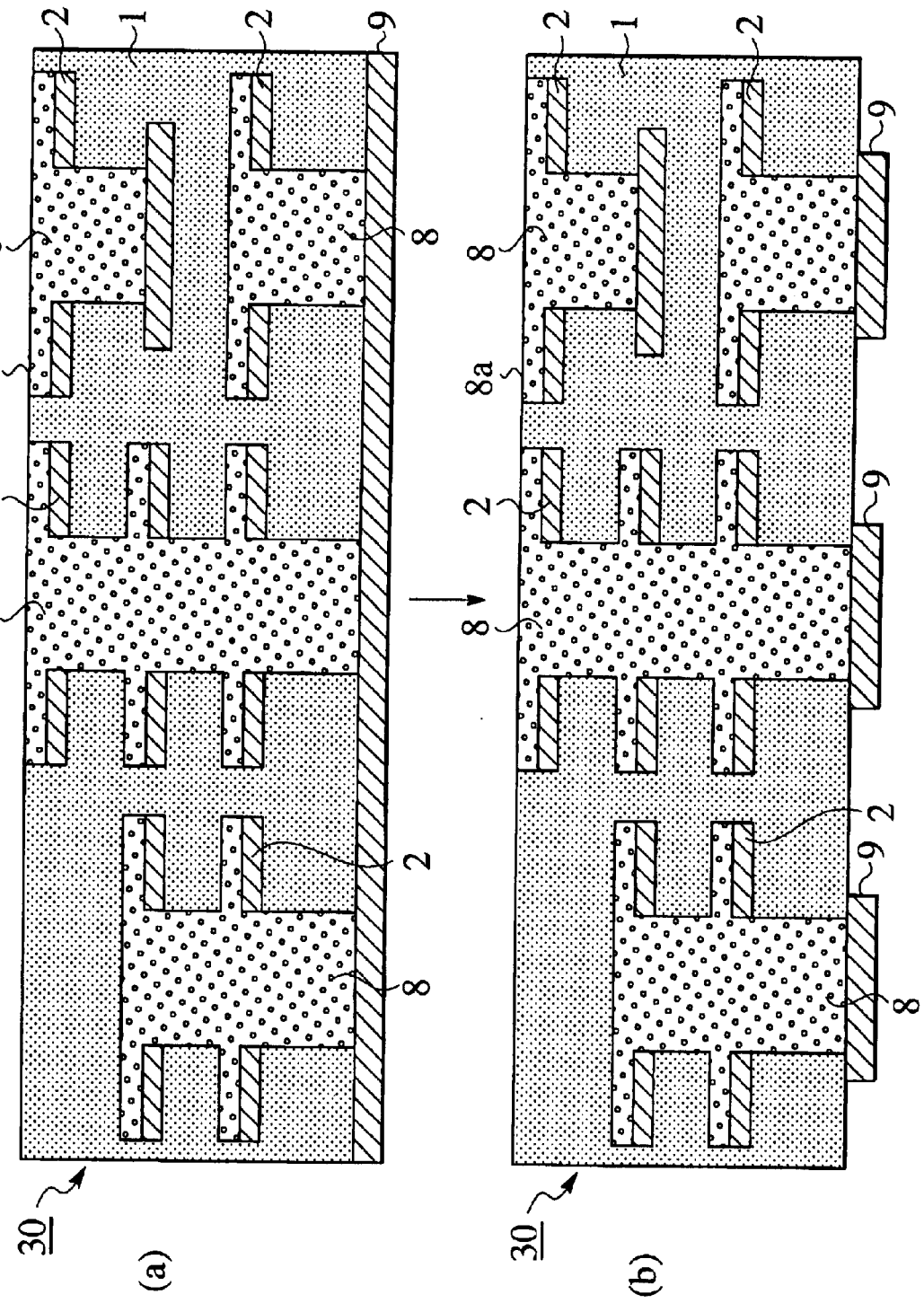
FIG. 3 shows cross sectional views showing the multilayer wiring board assembly in accordance with the embodiment of the present invention in the order of the manufacturing steps.

FIG. 1 shows cross sectional views of the intermediate structures of a multilayer wiring board assembly component for use in manufacturing a multilayer wiring board assembly in accordance with an embodiment of the present invention in the order of the manufacturing steps. FIG. 2 and FIG. 3 are cross sectional views showing the multilayer wiring board assembly in accordance with the embodiment of the present invention in the order of the manufacturing steps.

The multilayer wiring board assembly component 20 is a connection unit for use in the process of laminating a multilayer wiring board assembly and comprises an FPC as a base element made of a single sided copper plated resin film. Namely, as illustrated in FIG. 1(*i*), the multilayer wiring board assembly component 20 is composed of a copper plated resin film 10 composed of a flexible resin film 1 having adhesivity and made of a thermoplastic polyimide (TPI) and the like and provided with a copper foil 2 bonded to one surface thereof, and a conductive paste 8 embedded in a through hole 7 (refer to FIG. 1(*g*)) passed through the resin film 10 to form an inner via hole. A predetermined circuit pattern is formed in the copper foil 2 by etching and the like. The conductive paste 8 is embedded in the through hole 7 from the surface of the copper foil 2 by screen printing and so forth with a brim formed laterally extending on the upper surface of the copper foil 2 beyond the perimeter of the opening thereof in order that the leading end thereof is projected through the opposed surface of the copper plated resin film 10 having the resin film 1.

A multilayer wiring board assembly is laminated by stacking a plurality of the multilayer wiring board assembly components as illustrated in FIG. 1(*i*) (three units in the case of the embodiment as illustrated in FIG. 2 and FIG. 3). As illustrated in FIG. 2 and FIG. 3, since the through hole 7 of the multilayer wiring board assembly component is filled with the conductive paste 8, it is possible to make interlayer connection via-on-via.

Also, as illustrated in FIG. 1(*i*), the conductive paste 8 is printed in order that a projection is formed in the surface opposed to the printing surface. Meanwhile, the height of the projection of the conductive paste 8 depends on the size of the recess and is preferably 10 micrometer or thereabout.

In this manner, when the interlayer interconnection is made by via-on-via, the conductive paste 8 are connected directly to each other rather than through an intervening copper foil therebetween.

Also, as illustrated in FIG. 1(*h*), the conductive paste 8 is embedded in the opening 5 in order to make electric contact with the inner side surface and the upper surface of the copper foil 2 beyond the perimeter of the opening 5 thereof since the printing surface of the conductive paste 8 is extended laterally beyond the surface of the copper foil 2 (while sometimes indented slightly lower than the surface of the brim 8*a*) after the filing printing operation.

Next, the manufacturing process (method) of the multilayer wiring board assembly in accordance with the present invention will be explained with reference to FIG. 1 through FIG. 3.

(1) The manufacturing process of a multilayer wiring board assembly component (FIG. 1):

At first, as illustrated in FIG. 1(*a*), a single sided copper plated resin film 10 is provided or prepared as the resin film 1 made of a thermoplastic polyimide (TPI) having a thickness of 30 to 100 micrometer with the copper foil 2 having a thickness of 5 to 18 micrometer bonded to one surface.

Next, as illustrated in FIG. 1(*b*), a dry film (resist) 4 is laminated to the copper foil 2 bonded to the resin film 1 with a vacuum laminator or a roll laminator. Next, as illustrated in FIG. 1(*c*), the dry film 4 is exposed to radiation of a circuit pattern followed by developing the dry film 4.

Next, as illustrated in FIG. 1(*d*), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 1(*e*), a masking tape 6 having a thickness of 10 to 50 micrometer is bonded as a mask to the surface of the resin film 1 as opposed to the copper foil 2 as illustrated in FIG. 1(*f*). The masking tape 6 may be made of a PET and the like. Alternatively, a resin film can be used for the same purpose in place of the masking tape.

Next, as illustrated in FIG. 1(*g*), the through hole 7 of 0.05 to 0.3 mm diameter is opened in the resin film 1 through the resin film 1 and the masking tape 6 by exposing them to a laser light through the opening 5 by means of a $CO_2$ laser and is the like. Meanwhile, the through hole 7 may be opened by means of a drill in place of the laser exposure process.

Next, as illustrated in FIG. 1(*h*), a conductive paste is screen printed to fill the through hole 7 with the conductive paste 8. At this time, the conductive paste 8 is screen printed with a diameter larger than the opening 5 (the through hole 7) by a factor of about 1.1 to 2.0 so that part of the conductive paste remains on the upper surface of the copper foil 2 beyond the perimeter of the opening 5 thereof. By this configuration, there is formed the brim 8*a* which is connected to the land surface 2*a* of the copper foil 2 in the direction normal to the surface. Meanwhile, Ag, Cu, C, Cu coated with Ag and other conductive pastes can be used to form the conductive paste 8.

Next, the projection 8*b* of the conductive paste 8 which is projecting through the resin film 1 in the surface opposed to the printing surface is formed by heating the conductive paste 8 in an oven at 80° C. for an hour to partially cure the conductive paste 8 and removing the masking tape 6 as illustrated in FIG. 1(*i*). By this process, the multilayer wiring board assembly component 20 is completely formed.

(2) The press process of the multilayer wiring board assembly (FIG. 2 and FIG. 3):

As illustrated in FIGS. 2(*a*), (*b*) and (*c*), a plurality of circuit patterns and a plurality of through holes 7 are formed on each of the multilayer wiring board assembly components (three multilayer wiring board assembly components) 20*a*, 20*b* and 20*c*. Also, the through holes 7 are filled with the conductive paste 8.

The formation of the multilayer wiring board assembly 30 in accordance with the present embodiment is completed by laminating together the respective multilayer wiring board assembly components 20*a* to 20*c* as illustrated in FIG. 3(*a*) by thermocompression with a most outer copper foil 9 at the same time and forming a circuit on the most outer copper foil 9 as illustrated in FIG. 3(*b*). The step of laminating the respective multilayer wiring board assembly components 20*a* to 20*c* and the most outer copper foil 9 to each other by thermocompression is carried out by heating them at 280° C. or thereabout and pressing them at 9 MPa or thereabout in order to embed the circuit pattern of the copper foil 2 and the brim 8*a* of the conductive paste 8 in the resin film 1 made of a thermoplastic polyimide having adhesivity and fluidity. At this time, the copper foil 2 opposed to the copper foil 9 as the outermost layer and the brim 8*a* of the conductive paste 8 are filled with the resin film 1. Also, the conductive paste 8 of the respective multilayer wiring board assembly components 20*a* to 20*c* are fixedly pressed and finally cured by thermocompression at the same time. By this configuration, the multilayer wiring board assembly components 20*a* to 20*c* are united together with the copper foil 9.

As explained in the above, in accordance with this embodiment as described above, since the through holes 7 of the multilayer wiring board assembly component 20a to 20c are filled with the conductive paste 8, it is possible to make the interlayer interconnection between each adjacent layers by via-on-via. Also, since the projection 8b of the conductive paste 8 is formed in the rare surface opposed to the printing surface, it is possible to make the printing surface of the conductive paste 8 to be in close contact with the projection 8a when the interlayer interconnection is made by via-on-via and therefore it becomes easy to make the electric connection between the conductive paste 8 having good electric connectivity.

Also, since the conductive paste 8 is embedded in the through hole 7 during printing operation in order that the printing surface thereof is laterally extended from the opening 5 of the copper foil 2, the brim 8a of the conductive paste 8 makes reliable electric contact with the inner side surface and the upper surface of the copper foil 2 beyond the perimeter of the opening 5 thereof, and therefore it is possible to-connect the copper foil 2 to the conductive paste 8 without compromising the electric connectivity between the fillers of the conductive paste.

Furthermore, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film (the polyimide film) having a small thickness as it is. However, in accordance with this embodiment, the respective steps of holding a sample, opening a hole and filling the hole are conducted after bonding the copper foil 2 to the resin film 1 and therefore it becomes easy to open and fill holes with the conductive paste 8.

Figure 4:
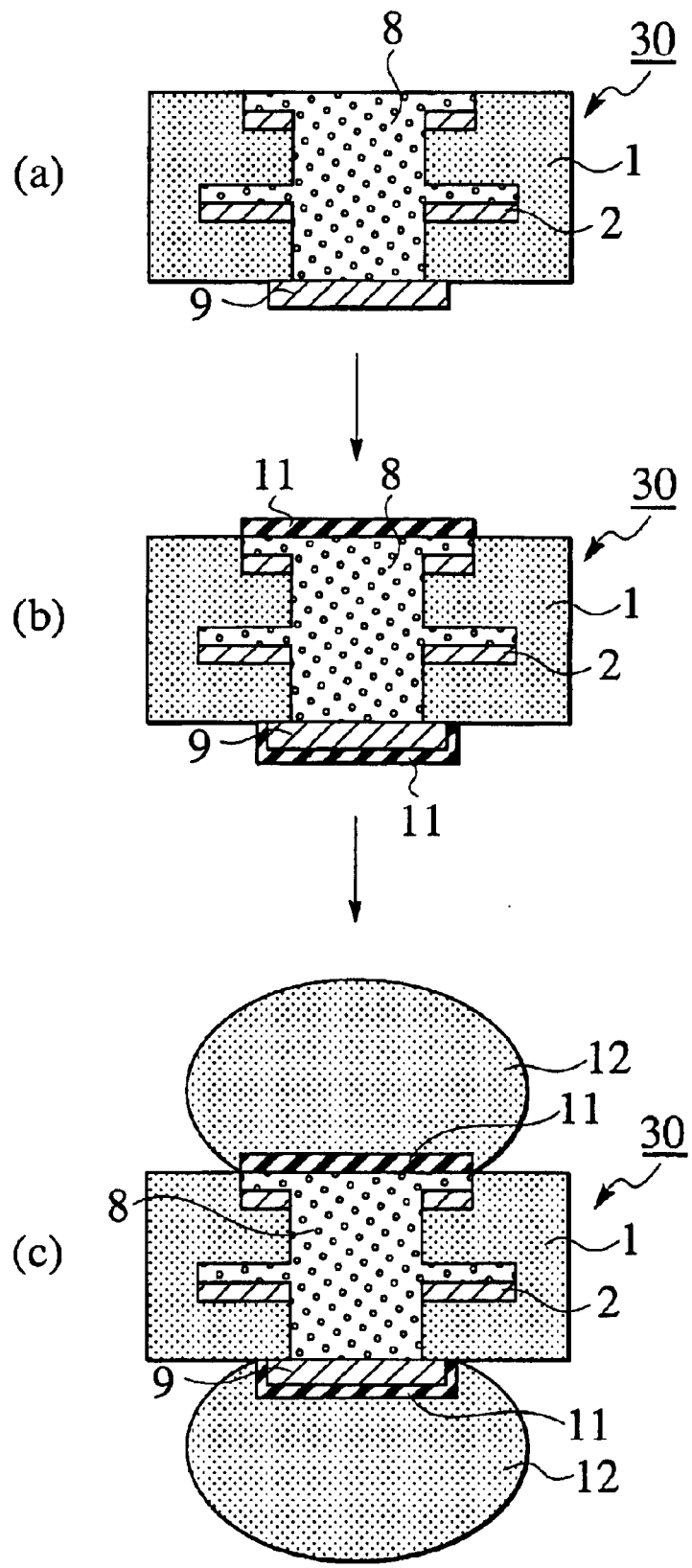
FIG. 4 shows cross sectional views of an exemplary connection terminal structure of the multilayer wiring board assembly in accordance with an embodiment of the present invention.
Figure 5:
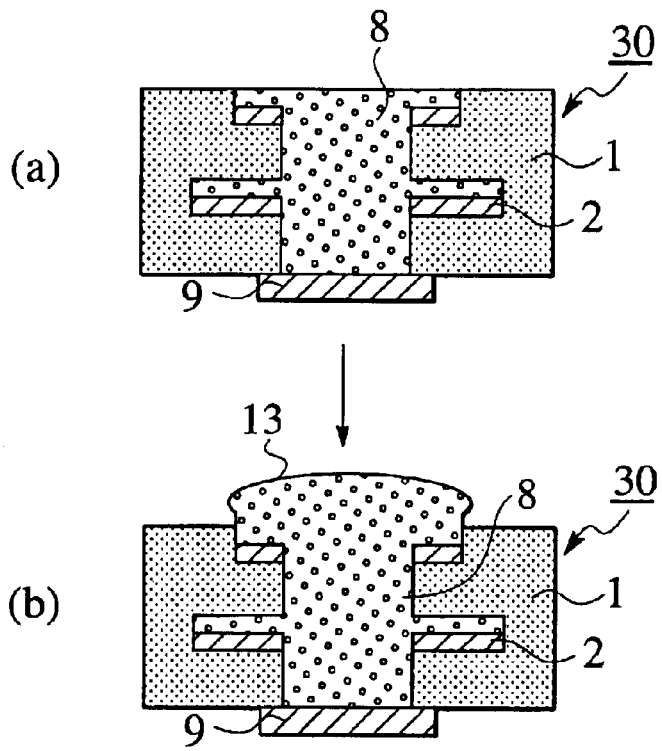
FIG. 5 shows cross sectional views of another exemplary connection terminal structure of the multilayer wiring board assembly in accordance with an embodiment of the present invention.
Figure 6:
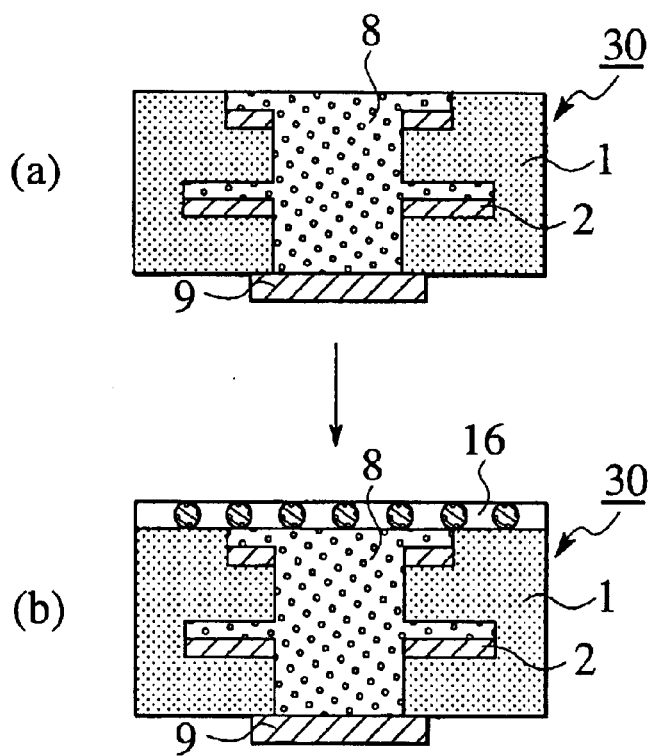
FIG. 6 shows cross sectional views of a further exemplary connection terminal structure of the multilayer wiring board assembly in accordance with an embodiment of the present invention.

FIG. 4 to FIG. 6 are cross sectional views showing the connection terminal structure of a multilayer wiring board assembly in accordance with the present invention on which an IC chip is mounted or which is used as an interposer.

In FIG. 4, by electroless gold plating with the multilayer wiring board assembly 30 as illustrated in (a) of the same figure, a plating layer 11 is formed on the external exposed surfaces of the conductive paste 8 and the copper foil 9 as illustrated in (b) of the same figure, followed by further forming a solder bump 12 thereon in (c) of the same figure. Meanwhile, any other type of plating technique available than gold plating for plating solder can be used for this purpose such as nickel-gold plating.

In FIG. 5, a bump 13 is formed by printing the conductive paste on top of the external exposed portion of the conductive paste 8 of the multilayer wiring board assembly 30 as illustrated in (a) of the same figure.

In FIG. 6, as illustrated in (b) of the same figure, an anisotropic conductive film 16 is attached to at least the vicinity of the connection terminal of the external exposed portion of the conductive paste 8 of the multilayer wiring board assembly 30 as illustrated in (a) of the same figure.

In this manner, since it is possible to provide an FPC in the form of a high density and flexible multilayered structure in accordance with the present invention, the size of an electronic appliance can be reduced by making use of the FPC according to the multilayer wiring board assembly while an electronic appliance having a curved profile can be provided with additional functionality, for example, by implementing a printed circuit board in a watch strap with high density circuits.

Next, with reference to FIG. 7, FIG. 8, FIG. 9 and FIG. 10, a multilayer wiring board assembly component and the multilayer wiring board assembly in accordance with a further embodiment of the present invention will be explained.

In the case of this embodiment, a multilayer wiring board assembly is laminated by the use of first and second multilayer wiring board assembly components. The first multilayer wiring board assembly component is formed by making use of a screen printing technique in order that a through hole is filled with a conductive paste which is laterally extending on the upper surface of the copper foil beyond the perimeter of the opening of the through hole. On the other hand, a screen printing technique is not used for forming the second multilayer wiring board assembly component in order that a through hole is filled with a conductive paste of which surface is flush with the surface of the copper foil. More specifically explained, the second multilayer wiring board assembly component as described above is used as the most outer unit of the multilayer wiring board assembly while the first multilayer wiring board assembly component as described above is used as at least one of the inner layers.

Figure 7:
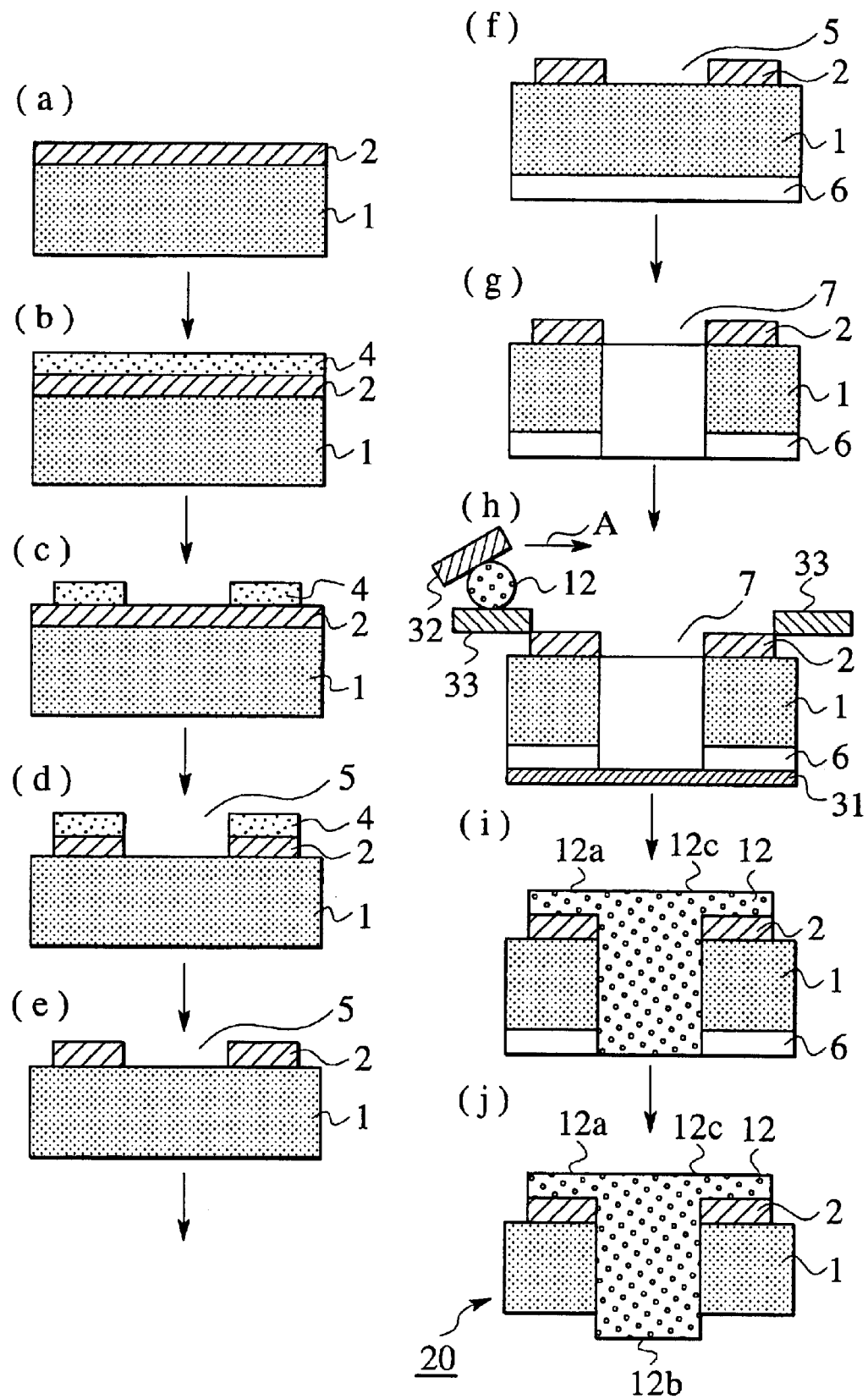
FIG. 7 shows cross sectional views of the intermediate structures of a first multilayer wiring board assembly component for use in manufacturing a multilayer wiring board assembly in accordance with a further embodiment of the present invention in the order of the manufacturing steps.

Next, the first multilayer wiring board assembly component as described above will be explained with reference to FIG. 7. The first multilayer wiring board assembly component 20 is a connection unit for use in the process of laminating a multilayer wiring board assembly and comprises an FPC as a base element made of a single sided copper plated resin film. Namely, as illustrated in FIG. 7(j), the multilayer wiring board assembly component 20 is composed of a copper plated resin film 10 composed of a resin film 1 having adhesivity and made of a thermoplastic polyimide (TPI) and the like and provided with a copper foil 2 bonded to one surface thereof, and a conductive paste 12 embedded in a through hole 7 (refer to FIG. 7(g)) passed through the resin film 10 to form an inner via hole. A predetermined circuit pattern is formed in the copper foil 2 by etching and the like. The conductive paste 12 is embedded in the through hole 7 from the surface of the copper foil 2 by screen printing and so forth and laterally extending on the upper surface of the copper foil 2 as a brim 12a beyond the perimeter of the opening thereof with the printing surface of the conductive paste 12 being flat and flush therewith in order that the leading end thereof is projected as a projection 12b through the opposed surface of the copper plated resin film 10 having the resin film 1.

While the resin film 1 is made of a material which is flexible, i.e., bendable in the case of the above described embodiment, the resin film 1 can be made of a rigid material such as a glass epoxy prepreg, an aramid-epoxy prepreg. Also, a BT resin, a PPO, a PPE and the like can be used as the material for forming the above described resin film 1.

Figure 10:
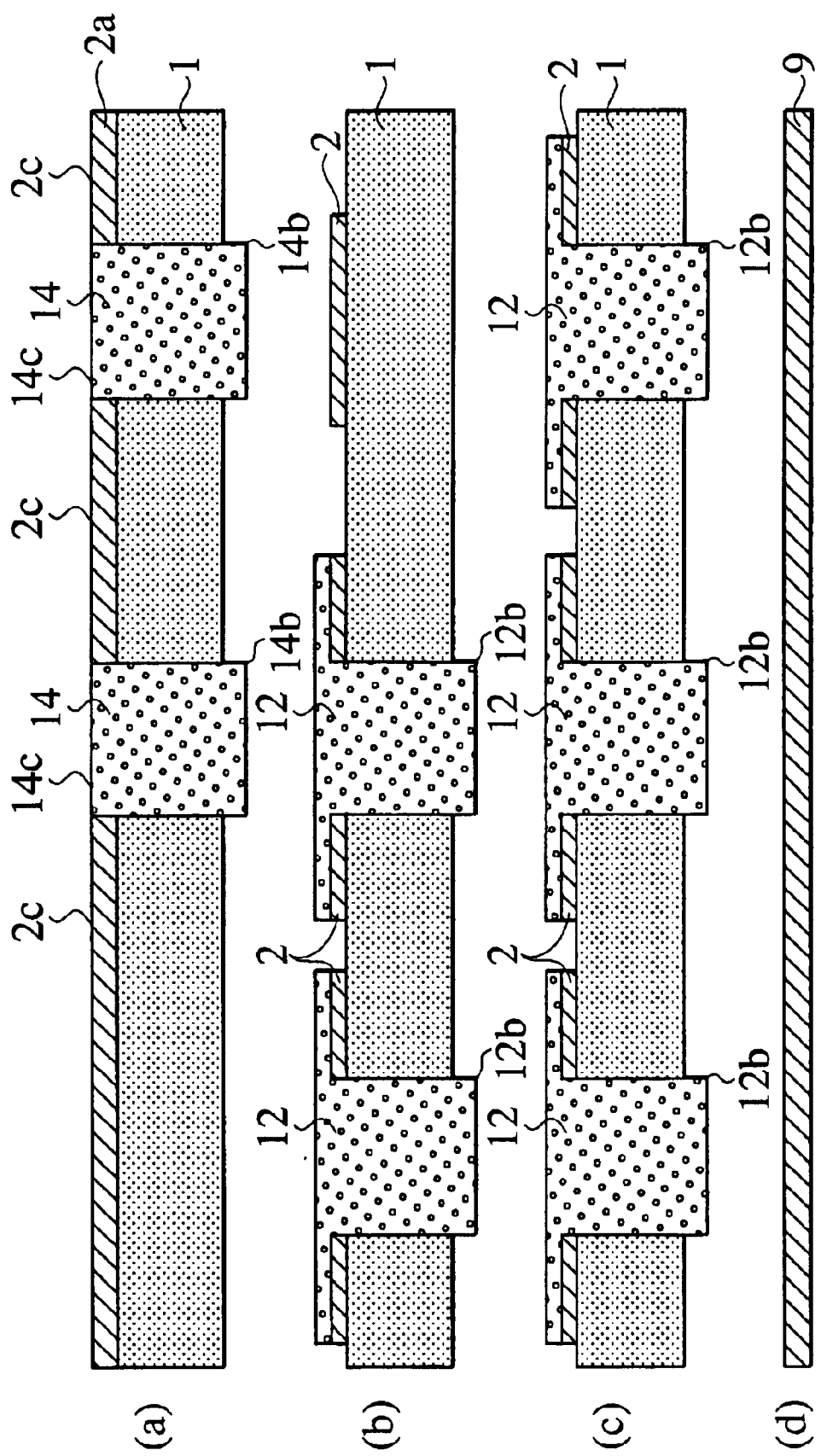
FIG. 10 shows cross sectional views showing the multilayer wiring board assembly in accordance with a still further embodiment of the present invention in the order of the manufacturing steps.

The multilayer wiring board assembly is laminated by stacking, as inner layers, a plurality of the first multilayer wiring board assembly components as illustrated in FIG. 7(j) (it the respective layers are called as first, second and third layers from the upper outer layer in the case of the embodiment as illustrated in FIG. 9 and FIG. 10, the second and third layers are prepared in the form of the first multilayer wiring board assembly component). As illustrated in FIG. 9 and FIG. 10, since the through hole 7 of the multilayer wiring board assembly component is filled with the conductive paste 12 and 14, it is possible to make interlayer connection via-on-via.

In this manner, when the interlayer interconnection is made by via-on-via, the conductive paste 12 are connected directly to each other rather than through an intervening copper foil therebetween.

Next, the manufacturing process of the first multilayer wiring board assembly component as described above will be explained with reference to FIG. 7.

At first, as illustrated in FIG. 7(a), a single sided copper plated resin film 10 is provided or prepared as the resin film 1 made of a thermoplastic polyimide film having a thickness of 30 to 100 micrometer with the copper foil 2 having a thickness of 5 to 18 micrometer bonded to one surface.

Next, as illustrated in FIG. 7(b), a dry film (resist) 4 is laminated to the copper foil 2 bonded to the resin film 1 with a vacuum laminator or a roll laminator. Next, as illustrated in FIG. 7(c), the dry film 4 is exposed to radiation of a circuit pattern followed by developing the dry film 4.

Next, as illustrated in FIG. 7(d), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 7(e), a masking tape 6 having a thickness of 10 to 50 micrometer is bonded as a mask to the surface of the resin film 1 as illustrated in FIG. 7(f). The masking tape 6 may be made of a PET and the like.

Next, as illustrated in FIG. 7(g), the through hole 7 of 0.05 to 0.3 mm diameter is opened in the resin film 1 through the resin film 1 and the masking tape 6 by exposing them to a laser light the opening 5 by means of a $CO_2$ laser and the like. Meanwhile, the through hole 7 may be opened by means of a drill in place of the laser exposure process.

In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not be formed in advance, a $CO_2$ laser (capable of opening holes of 50 to 250 micrometer diameter) is not used for this purpose and therefore a larger hole of 200 micrometer diameter or larger has to be opened by means of a drill (capable of opening holes of 200 micrometer diameter or larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, as illustrated in FIGS. 7(h) and (i), the conductive paste 12 is placed on the copper foil 2 and the mask 33 and spread to fill the through hole 7 therewith by moving a squeezee 32 made of an urethane, silicone and the like in the direction of arrow A. At this time, a breathable separate paper 31 as siliconized or fluoridized is placed for the purpose of preserving the conductive paste 12 at the leading end of the through hole 7 near the resin film 1.

In this case, the separate paper 31 is provided with breathability for the purpose of enabling air to escape when the through hole 7 is filled with the conductive paste 12. Also, at least the upper surface of the separate paper 31 is siliconized or fluoridized as described above for the purpose of making easy to remove the separate paper 31 from the conductive paste 12 in contact with the separate paper 31 and preventing the conductive paste 12 from being detached from the through hole 7 when the separate paper 31 is removed.

At this time, the conductive paste 12 is screen printed with a diameter larger than the opening 5 (the through hole 7) by about 10% to 50% so that part of the conductive paste remains on the upper surface of the copper foil 2 beyond the perimeter of the opening 5 thereof. By this configuration, there is formed the brim 12a which is connected to the land surface 2a of the copper foil 2 in the direction normal to the surface. In this case, however, the printing surface of the conductive paste 12 is made flat.

Meanwhile, Ag, Cu, C, Cu coated with Ag and other conductive pastes can be used to form the conductive paste 12.

Next, after removing the separate paper 31, the projection 12b of the conductive paste 12 which is projecting through the resin film 1 in the surface opposed to the printing surface is formed by heating the conductive paste 12 in an oven at 80° C. for an hour to partially cure the conductive paste 12 and removing the masking tape 6 as illustrated in FIG. 7(j). By this process, the first multilayer wiring board assembly component 20 is completely formed.

Figure 8:
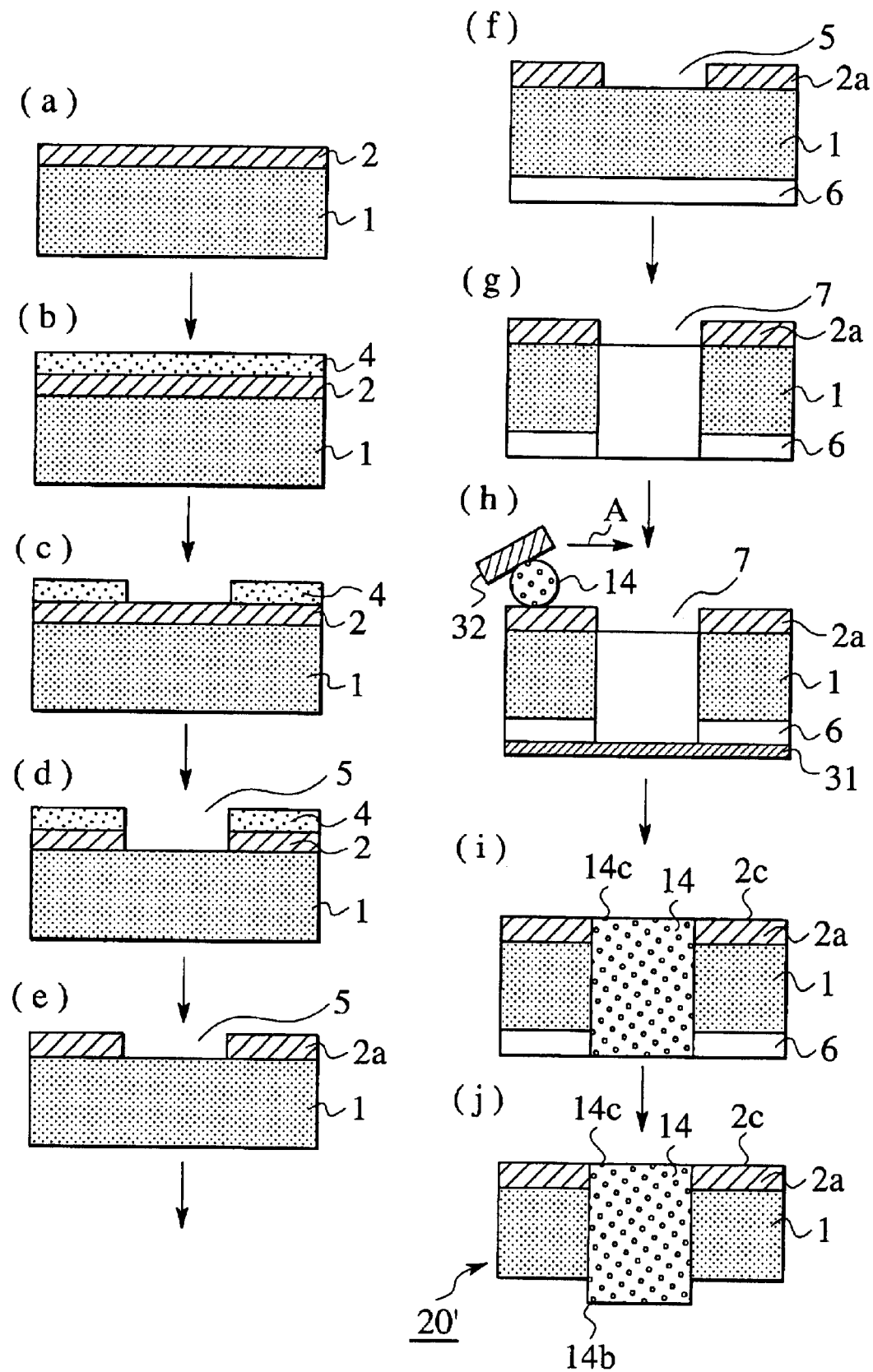
FIG. 8 shows cross sectional views of the intermediate structures of a second multilayer wiring board assembly component for use in manufacturing a multilayer wiring board assembly in accordance with the further embodiment of the present invention in the order of the manufacturing steps.

Next, the second multilayer wiring board assembly component as described above will be explained with reference to FIG. 8. The second multilayer wiring board assembly component 20' is a connection unit for use in the process of laminating a multilayer wiring board assembly and comprises an FPC as a base element made of a single sided copper plated resin film. Namely, as illustrated in FIG. 8(j), the multilayer wiring is board assembly component 20 is composed of a copper plated resin film 10 composed of a resin film 1 having adhesivity and made of a thermoplastic polyimide (TPI) and the like and provided with a copper foil 2 bonded to one surface thereof, and a conductive paste 12 embedded in a through hole 7 (refer to FIG. 8(g)) passed through the resin film 10 to form an inner via hole. A predetermined circuit pattern is formed in the copper foil 2 by etching and the like. The conductive paste 14 is embedded in the through hole 7 from the surface of the copper foil 2a by printing with the printing surface 14c of the conductive paste 14 being flat and flush with the upper surface 2c of the copper foil 2a in order that the leading end thereof is projected as a projection 14b through the opposed surface of the copper plated resin film 10 having the resin film 1. Namely, as illustrated in FIG. 8(j), the upper surface 2c of the copper foil 2a and the printing surface 14c of the conductive paste 14 are connected to form a continuous flat surface having the same height.

While the resin film 1 is made of a material which is flexible, i.e., bendable in the case of the above described embodiment, the resin film 1 can be made of a rigid material such as a glass epoxy prepreg, an aramid-epoxy prepreg.

Also, a BT resin, a PPO, a PPE and the like can be used as the material for forming the above described resin film 1.

Figure 11:
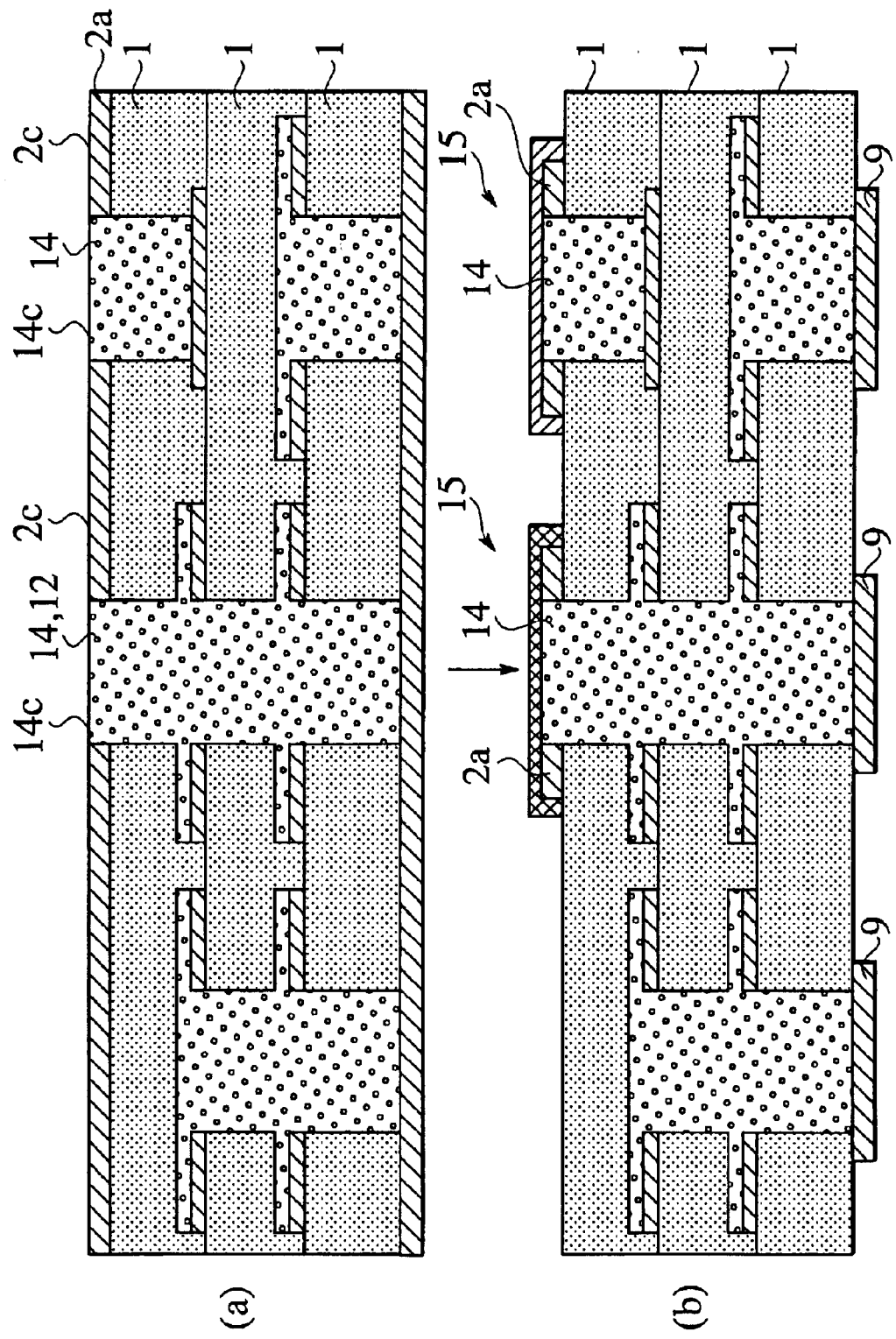
FIG. 11 shows cross sectional views showing the multilayer wiring board assembly in accordance with the still further embodiment of the present invention in the order of the manufacturing steps.

The multilayer wiring board assembly is laminated by stacking, as an outer layer, the second multilayer wiring board assembly component as illustrated in FIG. 8(j) (if the respective layers are called as first, second and third layers from the upper outer layer in the case of the embodiment as illustrated in FIG. 10 and FIG. 11, the second multilayer wiring board assembly component is the first layer). As illustrated in FIG. 10 and FIG. 11, since the through hole 7 of the multilayer wiring board assembly component is filled with the conductive paste 12 and 14, it is possible to make interlayer connection via-on-via.

Next, the manufacturing process of the second multilayer wiring board assembly component as described above will be explained with reference to FIG. 8.

At first, as illustrated in FIG. 8(a), a single sided copper plated resin film 10 is provided or prepared as the resin film 1 made of a thermoplastic polyimide film having a thickness of 30 to 100 micrometer with the copper foil 2 having a thickness of 5 to 18 micrometer bonded to one surface.

Next, as illustrated in FIG. 8(b), a dry film (resist) 4 is laminated to the copper foil 2 bonded to the resin film 1 with a vacuum laminator or a roll laminator. Next, as illustrated in FIG. 8(c), the dry film 4 is exposed to radiation of a pattern of the opening of the through hole 7, followed by developing the dry film 4. In the case, the dry film 4a is developed in order to be continuous except for the opening 5.

Next, as illustrated in FIG. 8(d), the copper foil 2 is etched with the dry film 4a as a mask to form the copper foil 2a having the predetermined opening 5. In this step, the opening 5 is formed by the same etching process for use in the subsequent step of opening the through hole 7. By this configuration, as illustrated in FIG. 9(a), the copper foil 2a is formed in a continuous fashion in the locations other than the conductive paste 14.

Next, after the dry film 4a is removed from the copper foil 2a as illustrated in FIG. 8(e), a masking tape 6 having a thickness of 10 to 50 micrometer is bonded as a mask to the surface of the resin film 1 as illustrated in FIG. 8(f). The masking tape 6 may be made of a PET and the like.

Next, as illustrated in FIG. 8(g), the through hole 7 of 0.05 to 0.3 mm diameter is opened in the resin film 1 through the resin film 1 and the masking tape 6 by exposing them to a laser light through the opening 5 by means of a $CO_2$ laser and the like.

Since the through hole 7 is opened after forming the opening 5, it is possible to form a small hole as described above.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, as illustrated in FIGS. 8(h) and (i), the conductive paste 14 is placed on the copper foil 2 and spread to fill the through hole 7 therewith by moving a squeezee 32 made of an urethane, silicone and the like in the direction of arrow A. At this time, a breathable separate paper 31 as siliconized or fluoridized is placed for the purpose of preserving the conductive paste 14 at the leading end of the through hole 7 near the resin film 1.

In this case, the separate paper 31 is provided with breathability for the purpose of enabling air to escape when the through hole 7 is filled with the conductive paste 14. Also, at least the upper surface of the separate paper 31 is siliconized or fluoridized as described above for the purpose of making easy to remove the separate paper 31 from the conductive paste 14 in contact with the separate paper 31 and preventing the conductive paste 14 from being detached from the through hole 7 when the separate paper 31 is removed.

In this case, as illustrated in FIG. 8(j), the upper surface 2c of the copper foil 2a and the printing surface 14c of the conductive paste 14 are connected to form a continuous flat surface having the same height.

Meanwhile, Ag, Cu, C, Cu coated with Ag and other conductive pastes can be used to form the conductive paste 14.

Next, after removing the separate paper 31, the projection 14b of the conductive paste 14 which is projecting through the resin film 1 in the surface opposed to the printing surface is formed by heating the conductive paste 14 in an oven at 80° C. for an hour to partially cure the conductive paste 14 and removing the masking tape 6 as illustrated in FIG. 8(i). By this process, the second multilayer wiring board assembly component 20' is completely formed.

FIG. 9 shows a modification of the manufacturing process of the multilayer wiring board assembly component 20' as described above.

In this modification, while the opening 5 is not formed in the copper foil 2, the through hole 7 is opened also in the copper foil 2. By this configuration, the step of forming the opening 5 is dispensed with so that it is possible to decrease the number of the manufacturing steps.

Namely, as illustrated in FIG. 9(a), a single sided copper plated resin film 10 is provided or prepared as the resin film 1 made of a thermoplastic polyimide film having a thickness of 30 to 100 micrometer with the copper foil 2 having a thickness of 5 to 18 micrometer bonded to one surface.

Next, as illustrated in FIG. 9(b), the through hole 7 of 0.2 mm diameter is opened in the copper foil 2 and the masking tape 6 through the resin film 1.

Next, as illustrated in FIGS. 9(c) and (d), the conductive paste 14 is placed on the copper foil 2 and spread to fill the through hole 7 therewith by moving a squeezee 32 made of an urethane, silicone and the like in the direction of arrow A. At this time, a breathable separate paper 31 as siliconized or fluoridized is placed for the purpose of preserving the conductive paste 14 at the leading end of the through hole 7 near the resin film 1.

In this case, the separate paper 31 is provided with breathability for the purpose of enabling air to escape when the through hole 7 is filled with the conductive paste 14. Also, at least the upper surface of the separate paper 31 is siliconized or fluoridized as described above for the purpose of making easy to remove the separate paper 31 from the conductive paste 14 in contact with the separate paper 31 and is preventing the conductive paste 14 from being detached from the through hole 7 when the separate paper 31 is removed.

Meanwhile, Ag, Cu, C, Cu coated with Ag and other conductive pastes can be used to form the conductive paste 14.

Next, after removing the separate paper 31, the projection 14b of the conductive paste 14 which is projecting through the resin film 1 in the surface opposed to the printing surface is formed by heating the conductive paste 14 in an oven at 80° C. for an hour to partially cure the conductive paste 14 and removing the masking tape 6 as illustrated in FIG. 9(e). By this process, the second multilayer wiring board assembly component 20' is completely formed.

Next, the press step for manufacturing a multilayer wiring board assembly by joining the first and second multilayer wiring board assembly components 20 and 20' together will be explained with reference to FIG. 10 and FIG. 11.

As illustrated in FIG. 10, the multilayer wiring board assembly is composed of the second multilayer wiring board assembly component 20' as illustrated in FIG. 8(j) or FIG. 9(e) arranged as a most outer layer (most upper layer) and the first multilayer wiring board assembly component 20 as illustrated in FIG. 7(j) arranged as the other layers (inner layers) which are laminated with the second multilayer wiring board assembly component 20'. The respective layers are formed with a plurality of circuit patterns and through holes 7 which are filled with the conductive paste 12 and 14.

The formation of the multilayer wiring board assembly in accordance with the present embodiment is completed by laminating together, at a time or successively, the respective first and second multilayer wiring board assembly components 20a to 20c by thermocompression with a most outer copper foil 9 as illustrated in FIG. 11(a) and forming a circuit on the most outer copper foil 9.

In this case, as illustrated in FIG. 11(a), the upper surface of the most outer layer (most upper layer) is formed in order that the upper surface 2c of the copper foil 22a and the leading end of the conductive paste 14, i.e., the printing surface 14c, are arranged to form a continuous flat surface having the same height so that it is possible to apply a uniform pressure to the entirety of the multilayer wiring board assembly during thermocompression. By this configuration, the multilayer wiring board assembly is fixedly laminated with a better electric connectivity.

The step of laminating the respective multilayer wiring board assembly components 20 and 20' and the most outer copper foil 9 to each other by thermocompression is carried out by heating them at 280° C. or thereabout and pressing them at 9 MPa or thereabout in order to embed the circuit pattern of the copper foil 2 and the brim 12a of the conductive paste 12 in the resin film 1 made of a thermoplastic polyimide having adhesivity and fluidity. At this time, the conductive paste 12 and 14 of the respective multilayer wiring board assembly components 20 and 20' are fixedly pressed and finally cured by thermocompression at the same time.

Finally, as illustrated in FIG. 11(b), a circuit pattern is formed in the most outer copper foil 2a by etching and the like followed by plating the copper foil 2a with a metallic layer 15 for the purpose of increasing the area available for electric contact with the conductive paste 14. While the metallic layer 15 may be formed of any conductive material such as Au, Ni, Hg, Ag, Rh and Pd, the use of Au is particularly preferable in consideration of oxidation-proof and facilitating bonding.

In accordance with this embodiment as described above, since the through holes 7 of the first and second multilayer wiring board assembly component 20 and 20' are filled with the conductive paste 12 and 14, it is possible to make the interlayer interconnection between each adjacent layers by via-on-via. Also, since the projections 12b and 14b of the conductive paste 12 and 14 is formed, it becomes easy to make the electric connection between the conductive paste 12 and 14 having good electric connectivity when the interlayer interconnection is made by via-on-via.

Also, since the conductive paste 12 of the first multilayer wiring board assembly component 20 is embedded in the through hole 7 during printing operation in order that the printing surface thereof is laterally extended from the opening 5 of the copper foil 2, the brim 12a of the conductive paste 12 makes reliable electric contact with the inner side surface and the upper surface of the copper foil 2 beyond the perimeter of the opening 5 thereof, and therefore it is possible to connect the copper foil 2 to the conductive paste 12 without compromising the electric connectivity between the copper foil 2 and the fillers of the conductive paste.

Furthermore, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film (the polyimide film) having a small thickness as it is. However, in accordance with this embodiment, the respective steps of holding a sample, opening a hole and filling the hole are conducted after bonding the copper foil 2 to the resin film 1 and therefore it becomes easy to open and fill holes with the conductive paste 12.

Furthermore, since a desired multilayer wiring board assembly can be formed only by preparing multilayer wiring board assembly components as described above and combining and joining them together, the press step for a multilayer wiring board assembly becomes easy without need for conducting press steps of multilayer wiring board assembly components.

As described above, the upper surface of the most outer layer (most upper layer) is formed in order that the upper surface of the copper foil and the leading end of the conductive paste, i.e., the printing surface, are arranged to form a continuous flat surface having the same height so that it is possible to apply a uniform pressure to the entirety of the multilayer wiring board assembly during thermocompression. By this configuration, the multilayer wiring board assembly is fixedly laminated with a better electric connectivity.

Next, with reference to FIG. 12, FIG. 13 and FIG. 14, a multilayer wiring board assembly component and the multilayer wiring board assembly in accordance with a further embodiment of the present invention will be explained.

In the case of this embodiment, a multilayer wiring board assembly is laminated by the use of a plurality of multilayer wiring board assembly components, each of which is prepared by embedding a conductive paste in a through hole by screen printing with a mask in order that the conductive paste is laterally extending beyond the perimeter of the opening of the through hole.

Next, the above described multilayer wiring board assembly component will be explained with reference to FIG. 12.

The multilayer wiring board assembly component 20 is a connection unit for use in the process of laminating a multilayer wiring board assembly and comprises an FPC as a base element made of a single sided copper plated resin film. Namely, as illustrated in FIG. 12(j), the multilayer wiring board assembly component 20 is composed of a copper plated resin film 10 composed of a resin film 1 having adhesivity and made of a thermoplastic polyimide (TPI) and the like and provided with a copper foil 2 bonded to one surface thereof, and a conductive paste 12 embedded in a through hole 7 (refer to FIG. 12(g)) passed through the resin film 10 to form an inner via hole. A predetermined circuit pattern is formed in the copper foil 2 by etching and the like. The conductive paste 12 is embedded in the through hole 7 from the surface of the copper foil 2 by screen printing and so forth with a mask and is laterally extending on the upper surface of the copper foil 2 as a brim 12a beyond the perimeter of the opening thereof with the printing surface 12c of the conductive paste 12 being flat and flush therewith in order that the leading end thereof is projected as a projection 12b through the opposed surface of the copper plated resin film 10 having the resin film 1.

While the resin film 1 is made of a material which is flexible, i.e., bendable in the case of the above described embodiment, the resin film 1 can be made of a rigid material such as a glass epoxy prepreg, an aramid-epoxy prepreg. Also, a BT resin, a PPO, a PPE and the like can be used as the material for forming the above described resin film 1.

Figure 12:
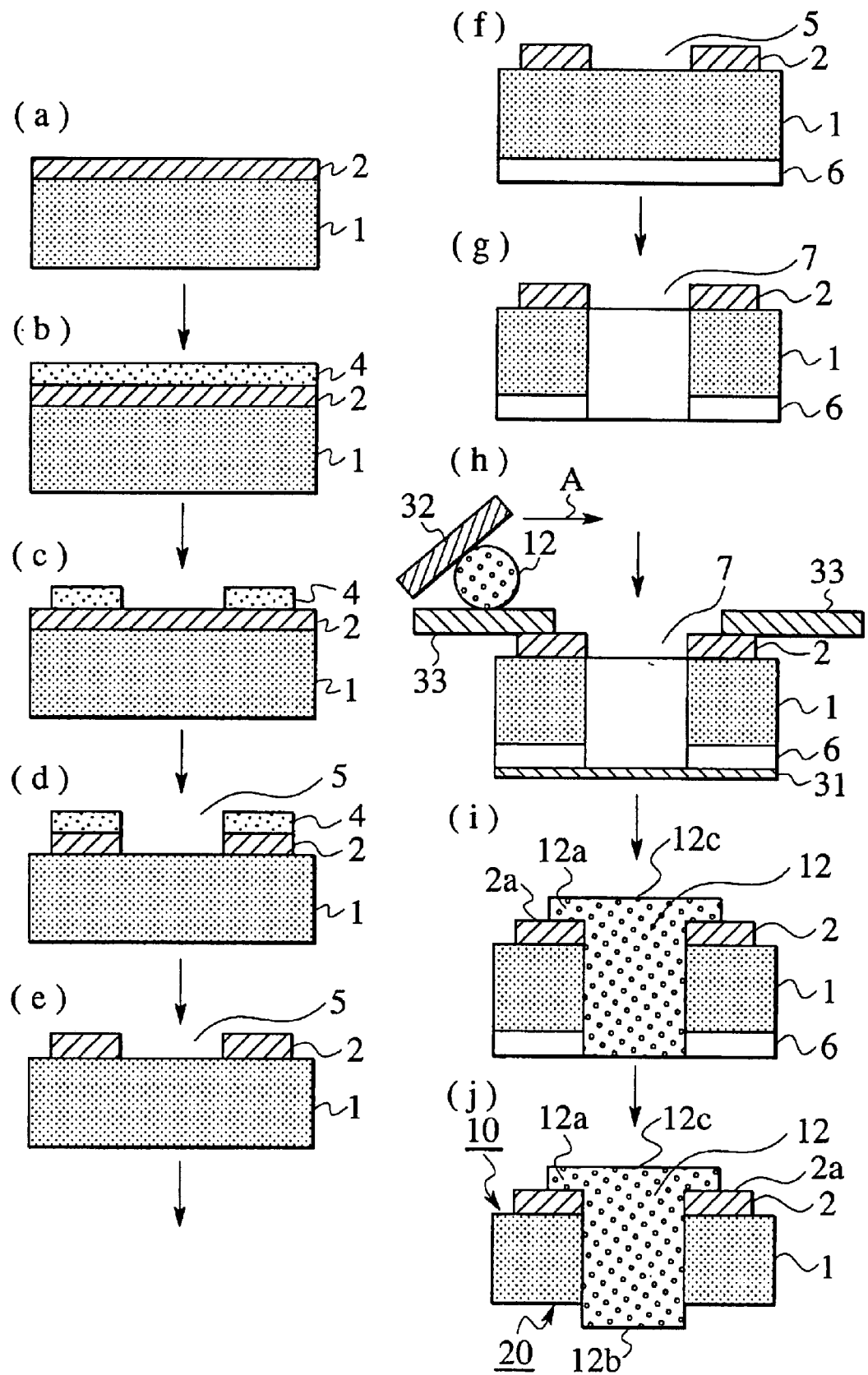
FIG. 12 shows cross sectional views of the intermediate structures of a multilayer wiring board assembly component for use in manufacturing a multilayer wiring board assembly in accordance with the still further embodiment of the present invention in the order of the manufacturing steps.
Figure 13:
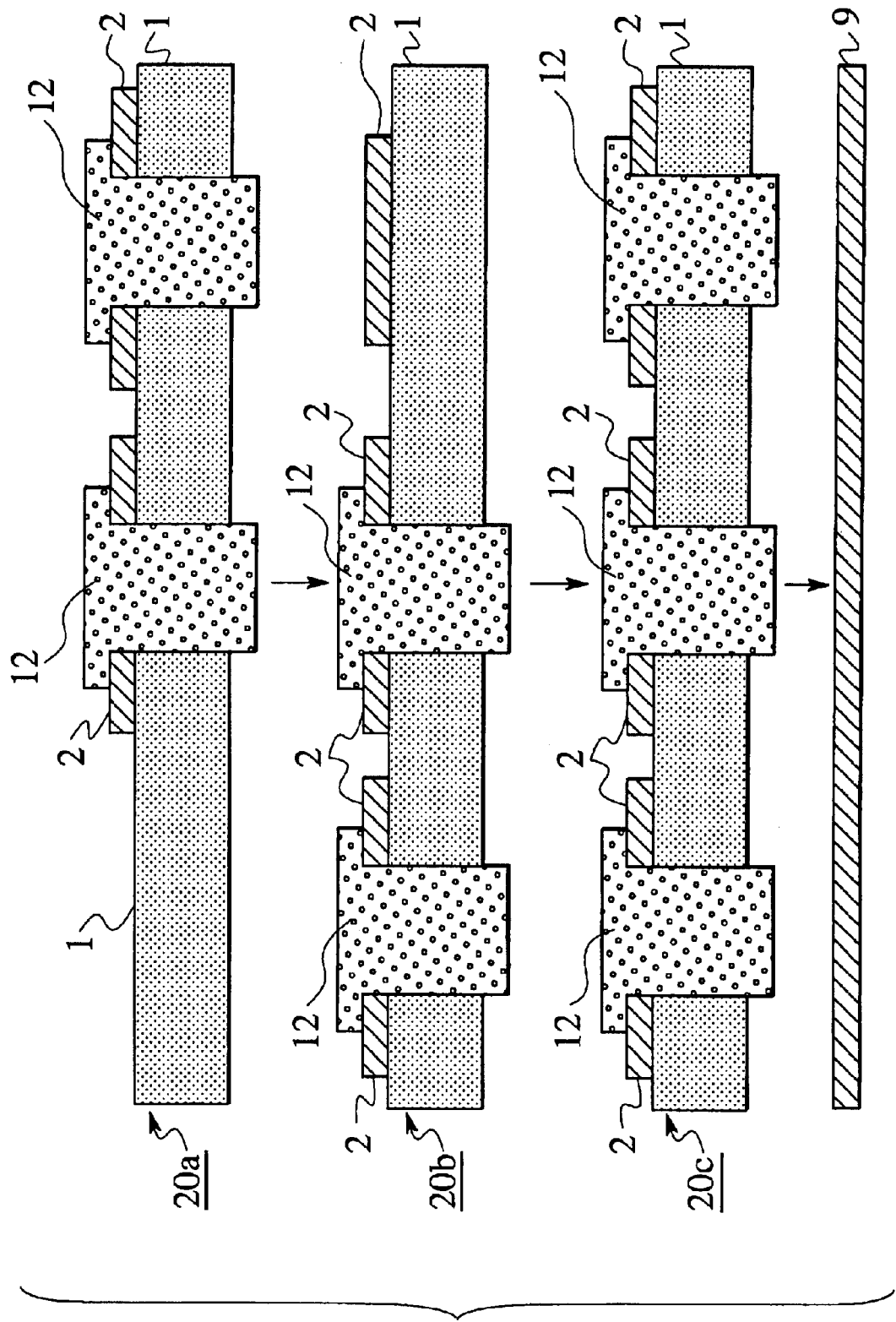
FIG. 13 shows cross sectional views showing the multilayer wiring board assembly in accordance with the still further embodiment of the present invention in the order of the manufacturing steps.
Figure 14:
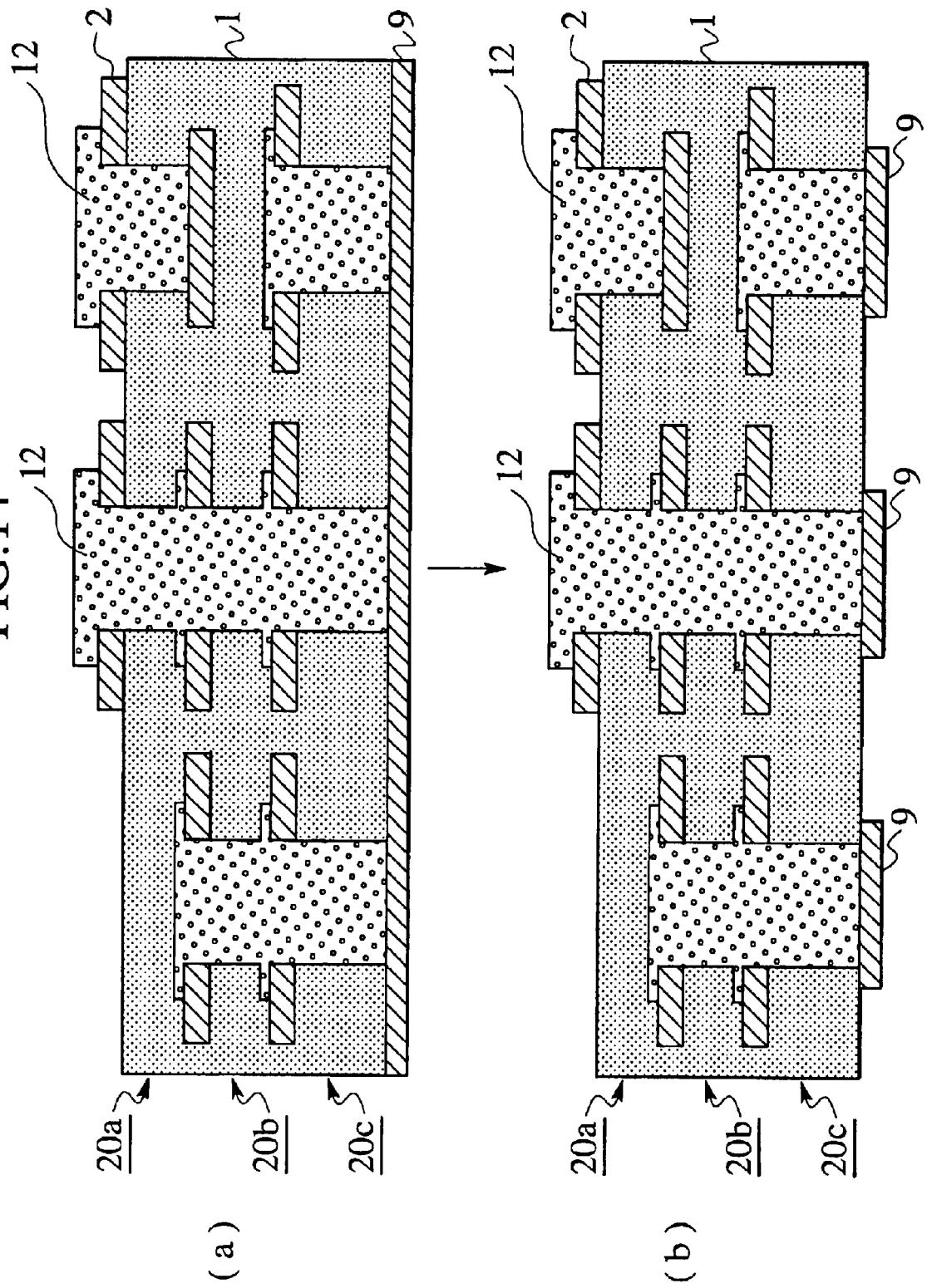
FIG. 14 shows cross sectional views showing the multilayer wiring board assembly in accordance with the still further embodiment of the present invention in the order of the manufacturing steps.

A multilayer wiring board assembly is laminated by stacking a plurality of the multilayer wiring board assembly components as illustrated in FIG. 12(i) (three units in the case of the embodiment as illustrated in FIG. 13 and FIG. 14). As illustrated in FIG. 13 and FIG. 14, since the through hole 7 of the multilayer wiring board assembly component is filled with the conductive paste 12, it is possible to make interlayer connection via-on-via.

In this manner, when the interlayer interconnection is made by via-on-via, the conductive paste 12 are connected directly to each other rather than through an intervening copper foil therebetween.

Next, the manufacturing process (method) of the multilayer wiring board assembly in accordance with the present invention will be explained with reference to FIG. 12.

At first, as illustrated in FIG. 12(a), a single sided copper plated resin film 10 is provided or prepared as the resin film 1 made of a thermoplastic polyimide film having a thickness of 15 to 100 micrometer with the copper foil 2 having a thickness of 5 to 18 micrometer-bonded to one surface.

Next, as illustrated in FIG. 12(b), a dry film (resist) 4 is laminated to the copper foil 2 bonded to the resin film 1 with a vacuum laminator or a roll laminator. Next, as illustrated in FIG. 12(c), the dry film 4 is exposed to radiation of a circuit pattern followed by developing the dry film 4.

Next, as illustrated in FIG. 12(d), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 12(e), a masking tape 6 having a thickness of 10 to 50 micrometer is bonded as a mask to the surface of the resin film 1 as illustrated in FIG. 12(f). The masking tape 6 may be made of a PET and the like.

Next, as illustrated in FIG. 12(g), the through hole 7 of 0.05 to 0.3 mm diameter is opened in the resin film 1 through the resin film 1 and the masking tape 6 by exposing them to a laser light through the opening 5 by means of a $CO_2$ laser and the like. Meanwhile, the through hole 7 may be opened by means of a drill in place of the laser exposure process. In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not be formed in advance, a $CO_2$ laser (capable of opening holes of 50 to 250 micrometer diameter) is not used for this purpose and therefore a larger hole of 200 micrometer diameter or larger has to be opened by means of a drill (capable of opening holes of 200 micrometer diameter or larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, a conductive paste is screen printed to fill the through hole 7 with the conductive paste 12. In this case, as illustrated in FIG. 12(h), an amount of the conductive paste 12 is placed on the copper foil 2 and spread to fill the through hole 7 therewith by moving a squeezee 32 made of an urethane, silicone and the like in the direction of arrow A, after a metallic mask (or a screen mask) 33 having a hole of a diameter larger than that of the through hole 7 is placed on the copper foil 2 in order that part of the conductive paste remains on the upper surface of the copper foil 2 beyond the perimeter of the opening 5, and after a breathable separate paper 31 as siliconized or fluoridized is placed for the purpose of preserving the conductive paste 12 at the leading end of the through hole 7 near the masking tape 6.

In this case, the separate paper 31 is provided with breathability for the purpose of enabling air to escape when the through hole 7 is filled with the conductive paste 12. Also, at least the upper surface of the separate paper 31 is siliconized or fluoridized as described above for the purpose of making easy to remove the separate paper 31 from the conductive paste 12 in contact with the separate paper 31 and preventing the conductive paste 12 from being detached from the through hole 7 when the separate paper 31 is removed. By this configuration, as illustrated in FIG. 12(i), after removing the metallic mask 33 and the separate paper 31, the conductive paste 12 is screen printed with a diameter larger than the opening 5 (the through hole 7) by about 10% to 50% so that part of the conductive paste remains on the upper surface of the copper foil 2 beyond the perimeter of the opening 5 thereof. By this configuration, there is formed the brim 12a which is connected to the land surface 2a of the copper foil 2 in the direction normal to the surface. In this case, however, the printing surface 12c of the conductive paste 12 is made flat.

Meanwhile, Ag, Cu, C, Cu coated with Ag and other conductive pastes can be used to form the conductive paste 12. Also, while the conductive paste 12 is formed by screen printing as described above, another suitable printing technique is used for this purpose.

Next, the projection 12b of the conductive paste 12 which is projecting through the resin film 1 in the surface opposed to the printing surface is formed by heating the conductive paste 12 in an oven at 80° C. to partially cure the conductive paste 12 and removing the masking tape 6 as illustrated in FIG. 12(j). By this process, the multilayer wiring board assembly component 20 is completely formed. Next, the press step for manufacturing a multilayer wiring board assembly by joining a plurality of the multilayer wiring board assembly components 20 as described above will be explained with reference to FIG. 13 and FIG. 14.

As illustrated in FIG. 13, a plurality of circuit patterns and a plurality of through holes 7 are formed on each of the multilayer wiring board assembly components (three multilayer wiring board assembly components) 20a, 20b and 20c. Also, the through holes 7 are filled with the conductive paste 12.

The formation of the multilayer wiring board assembly in accordance with the present embodiment is completed by laminating together the respective multilayer wiring board assembly components 20a to 20c by thermocompression with a most outer copper foil 9 at the same time or sequentially as illustrated in FIG. 14(a) and forming a circuit on the most outer copper foil 9 as illustrated in FIG. 14(b). The step of laminating the respective multilayer wiring board assembly components 20a to 20c and the most outer copper foil 9 to each other by thermocompression is carried out by heating them at 280° C. or thereabout and pressing them at 9 MPa or thereabout in order to embed the circuit pattern of the copper foil 2 and the brim 12a of the conductive paste 12 in the resin film 1 made of a thermoplastic polyimide having adhesivity and fluidity. At this time, the conductive paste 12 of the respective multilayer wiring board assembly components 20a to 20c are fixedly pressed and finally cured by thermocompression at the same time.

In accordance with this embodiment as described above, since the through holes 7 of the multilayer wiring board assembly component 20a to 20c are filled with the conductive paste 12, it is possible to make the interlayer interconnection between each adjacent layers by via-on-via. Also, since the projection 12b of the conductive paste 12 is formed in the printing surface, it becomes easy to make the electric connection between the conductive paste 12 having good electric connectivity when the interlayer interconnection is made by via-on-via.

Also, since the conductive paste 12 is embedded in the through hole 7 during printing operation in order that the printing surface thereof is laterally extended from the opening 5 of the copper foil 2, the brim 12a of the conductive paste 12 makes reliable electric contact with the inner side surface and the upper surface of the copper foil 2 beyond the perimeter of the opening 5 thereof, and therefore it is possible to connect the copper foil 2 to the conductive paste 12 without compromising the electric connectivity between the copper foil 2 and the fillers of the conductive paste.

Furthermore, since the copper plated resin film 10 is used in the manufacturing process of the multilayer wiring board assembly component, it becomes easy to preserve the is accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film 1 (the polyimide film) having a small thickness as it is. However, in accordance with this embodiment, the respective steps of holding a sample, opening a hole and filling the hole are conducted after bonding the copper foil 2 to the resin film 1 and therefore it becomes easy to open and fill holes with the conductive paste 12.

Furthermore, since a desired multilayer wiring board assembly can be formed only by preparing multilayer wiring board assembly components as described above and combining and joining them together, the press step of a multilayer wiring board assembly becomes easy without need for conducting press steps of multilayer wiring board assembly components.

Next, with reference to FIG. 15, FIG. 16 and FIG. 17, a multilayer wiring board assembly component and the multilayer wiring board assembly in accordance with a still further embodiment of the present invention-will be explained.

In the case of this embodiment, a multilayer wiring board assembly is laminated by the use of a plurality of multilayer wiring board assembly components, each of which is prepared by embedding a conductive paste in a through hole by the use of a plane table having a hole of a diameter larger than that of the through hole in order that the conductive paste is laterally extending beyond the perimeter of the opening of the through hole.

Next, the above described multilayer wiring board assembly component will be explained with reference to FIG. 15.

The multilayer wiring board assembly component 20 is a connection unit for use in the process of laminating a multilayer wiring board assembly and comprises an FPC as a base element made of a single sided copper plated resin film. Namely, as illustrated in FIG. 15(k), the multilayer wiring board assembly component 20 is composed of a copper plated resin film 10 composed of a resin film 1 having adhesivity and made of a thermoplastic polyimide (TPI) and the like and provided with a copper foil 2 bonded to one surface thereof, and a conductive paste 12 embedded in a through hole 7 (refer to FIG. 15(g)) passed through the resin film 10 to form an inner via hole. A predetermined circuit pattern is formed in the copper foil 2 by etching and the like. The conductive paste 12 is embedded in the through hole 7 from the masking tape 6 with the plane table 34 as explained in the following description by screen printing and so forth and laterally extending on the upper surface of the copper foil 2 as a brim 12a beyond the perimeter of the opening thereof with the printing surface 12c of the conductive paste 12 being flat and flush therewith in order that the leading end thereof is projected as a projection 12b through the opposed surface of the copper plated resin film 10 having the resin film 1.

While the resin film 1 is made of a material which is flexible, i.e., bendable in the case of the above described embodiment, the resin film 1 can be made of a rigid material such as a glass epoxy prepreg, an aramid-epoxy prepreg.

Also, a BT resin, a PPO, a PPE and the like can be used as the material for forming the above described resin film 1.

Figure 15:
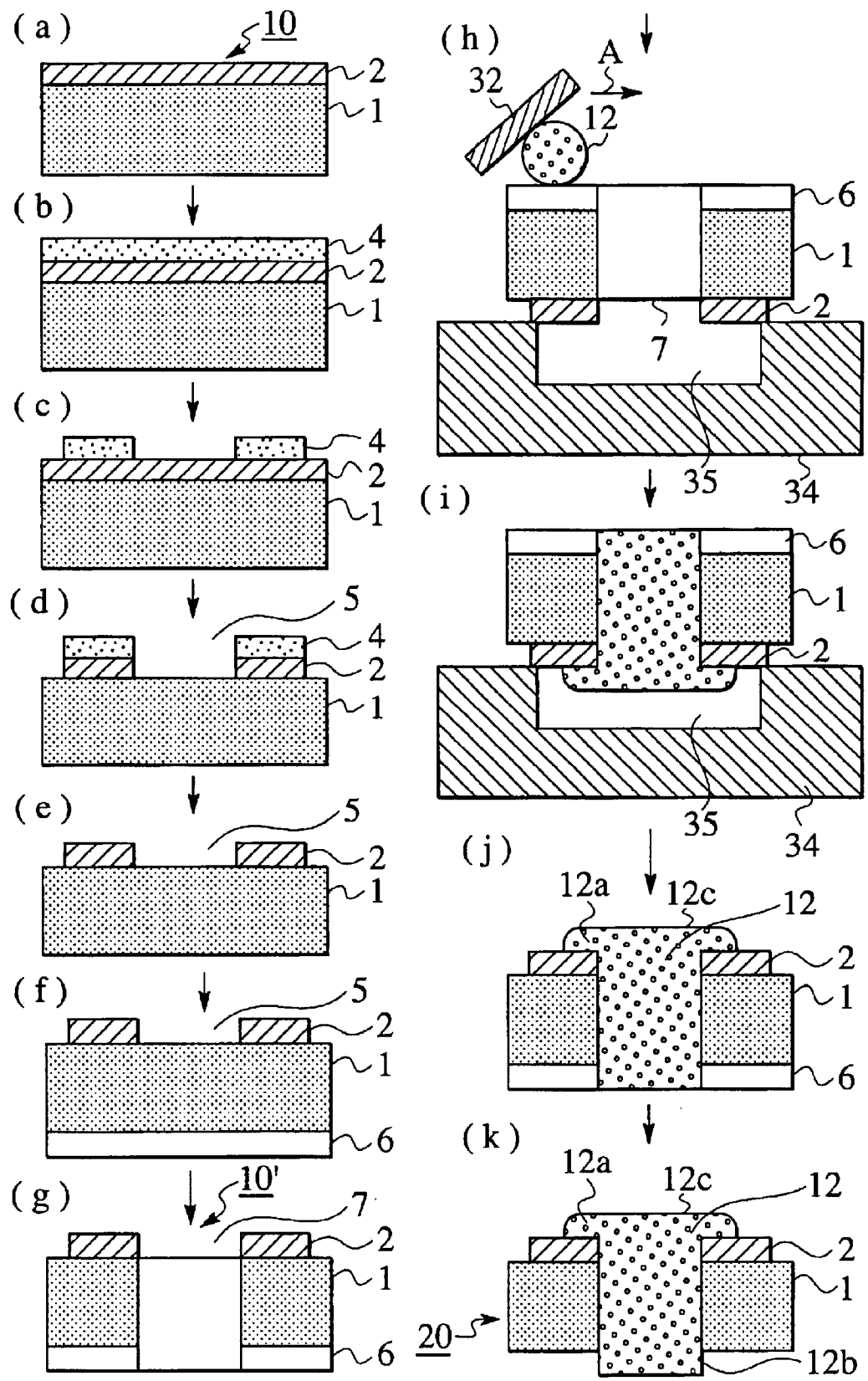
FIG. 15 shows cross sectional views of the intermediate structures of a multilayer wiring board assembly component for use in manufacturing a multilayer wiring board assembly in accordance with a still further embodiment of the present invention in the order of the manufacturing steps.
Figure 16:
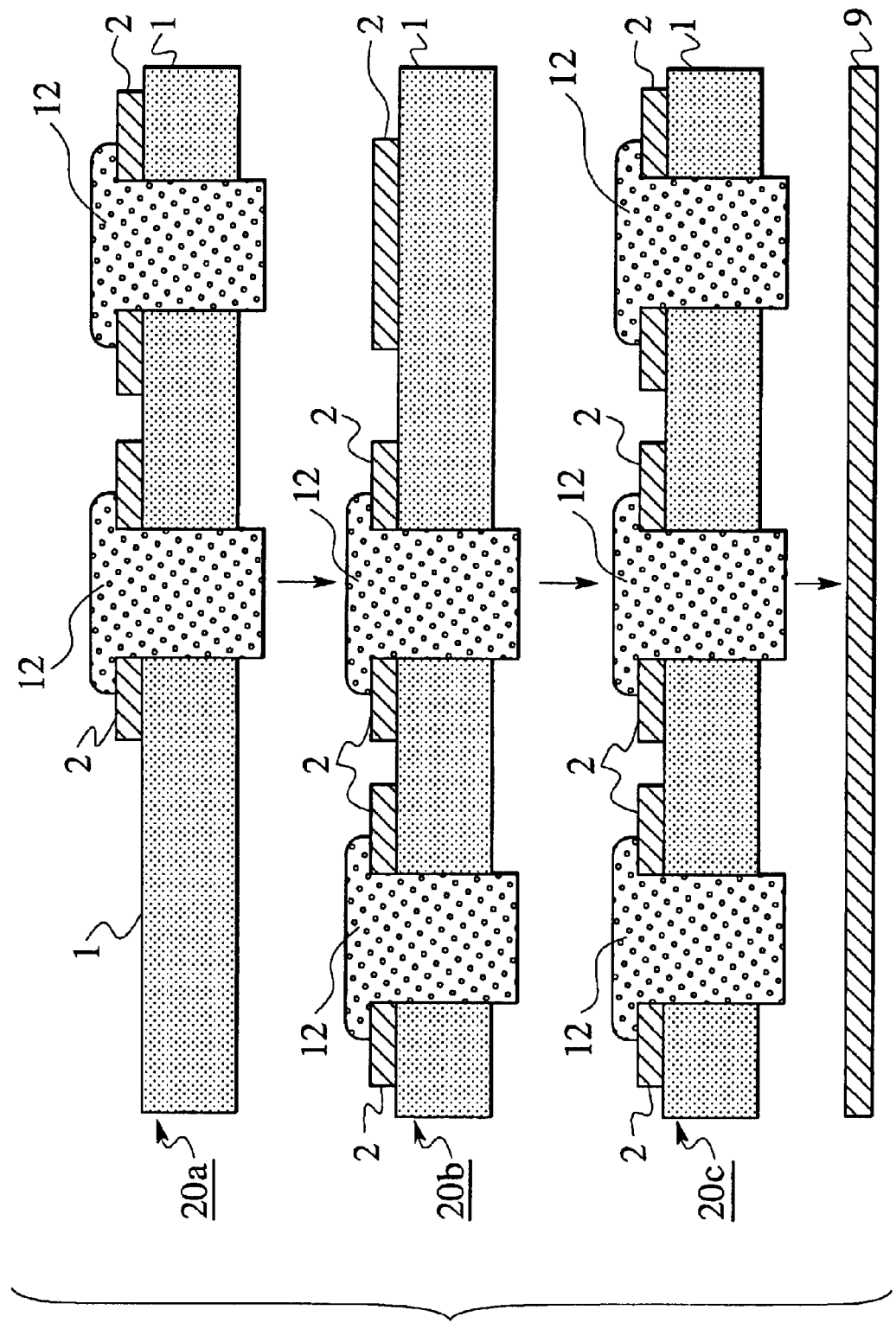
FIG. 16 shows cross sectional views showing the multilayer wiring board assembly in accordance with the still further embodiment of the present invention in the order of the manufacturing steps.
Figure 17:
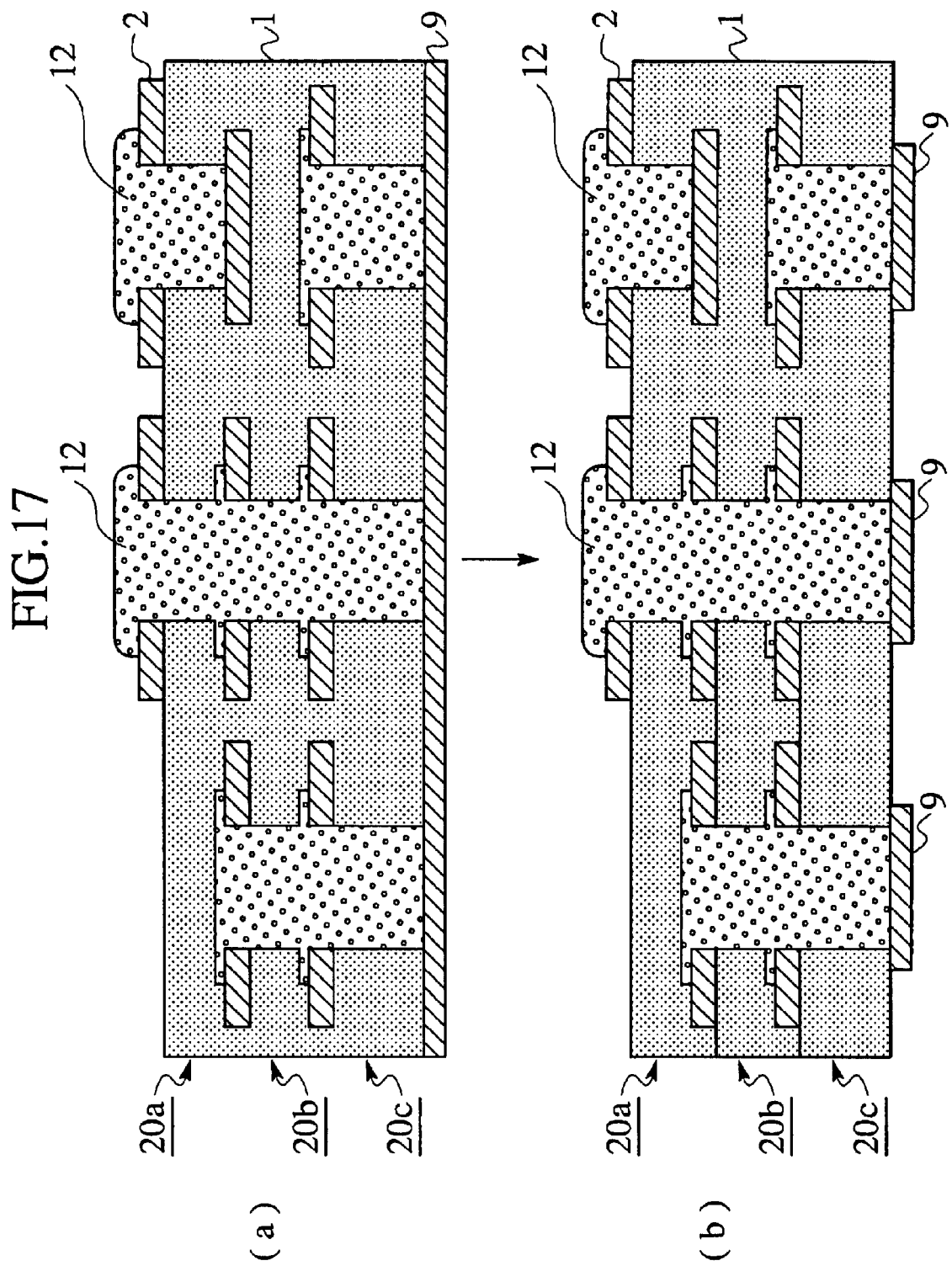
FIG. 17 shows cross sectional views showing the multilayer wiring board assembly in accordance with the still further embodiment of the present invention in the order of the manufacturing steps.

The multilayer wiring board assembly is laminated by stacking a plurality of the first multilayer wiring board assembly components as illustrated in FIG. 15(k) (three units in the case of the embodiment as illustrated in FIG. 16 and FIG. 17). As illustrated in FIG. 16 and FIG. 17, since the through hole 7 of the multilayer wiring board assembly component is filled with the conductive paste 12, it is possible to make interlayer connection via-on-via.

In this manner, when the interlayer interconnection is made by via-on-via, the conductive paste 12 are connected is directly to each other rather than through an intervening copper foil therebetween.

Next, the manufacturing process (method) of the multilayer wiring board assembly in accordance with the present invention will be explained with reference to FIG. 15.

At first, as illustrated in FIG. 15(a), a single sided copper plated resin film 10 is provided or prepared as the resin film 1 made of a thermoplastic polyimide film having a thickness of 15 to 100 micrometer with the copper foil 2 having a thickness of 5 to 18 micrometer bonded to one surface.

Next, as illustrated in FIG. 15(b), a dry film (resist) 4 is laminated to the copper foil 2 bonded to the resin film 1 with a vacuum laminator or a roll laminator. Next, as illustrated in FIG. 15(c), the dry film 4 is exposed to radiation of a circuit pattern followed by developing the dry film 4.

Next, as illustrated in FIG. 15(d), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 15(e), a masking tape 6 having a thickness of 10 to 50 micrometer is bonded as a mask to the surface of the resin film 1 as illustrated in FIG. 15(f). The masking tape 6 may be made of a PET and the like.

Next, as illustrated in FIG. 15(g), the through hole 7 of 0.05 to 0.3 mm diameter is opened in the resin film 1 through the resin film 1 and the masking tape 6 by exposing them to a laser light through the opening 5 by means of a $CO_2$ laser and the like. Meanwhile, the through hole 7 may be opened by means of a drill in place of the laser exposure process. In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not be formed in advance, a $CO_2$ laser (capable of opening holes of 50 to 250 micrometer diameter) is not used for this purpose and therefore a larger hole of 200 micrometer diameter or larger has to be opened by means of a drill (capable of opening holes of 200 micrometer diameter or larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, a conductive paste is screen printed to fill the through hole 7 with the conductive paste 12. In this case, as illustrated in FIG. 15(*h*), an amount of the conductive paste 12 is spread to fill the through hole 7 therewith by moving a squeezee 32 made of an urethane, silicone and the like in the direction of arrow A, after preparing the plane table 34 having a hole 35 of a diameter larger than that of the through hole 7, placing the copper plated resin film 10 as illustrated in FIG. 15(*g*) on the hole 35 of the plane table 34 with the copper foil 2 being positioned as the bottom of the multilayer wiring board assembly component (i.e. it is inverted), and preselecting the coefficient of viscosity of the conductive paste 12 and the printing condition in order that part of the conductive paste remains on the upper surface of the copper foil 2 beyond the perimeter of the opening 5 of the copper foil 2.

In this case, the coefficient of viscosity of the conductive paste 12 is predetermined lower than that of the conductive paste 12 in the case of the embodiment as illustrated in FIG. 12. The profile of the conductive paste 12 as described above is illustrated in FIG. 15(*i*). In this case, as illustrated in FIG. 15(*i*), the size of the hole 35 of the above described plane table 34 is predetermined to provide a sufficient space in order that the conductive paste 12 is not extending from the opening 5 of the copper foil 2 as to make contact with the plane table 34 after the filling step. Next, when the lanimate is removed from the plane table 34 and inverted, the conductive paste is screen printed in order that the diameter of the conductive paste 12 is larger than the diameter of the opening 5 (the through hole 7) by about 10% to 50% so that the conductive paste is laterally extending beyond the perimeter of the opening 5 thereof as illustrated in FIG. 15(*i*). By this configuration, there is formed the brim 12*a* which is connected to the land surface 2*a* of the copper foil 2 in the direction normal to the surface. In this case, however, the printing surface 12*c* of the conductive paste 12 is made flat. It is therefore possible to form the brim 12*a* of a smaller thickness with a higher degree of accuracy, as compared to the case utilizing a mask (refer to FIG. 12), by filling the through hole 7 with the conductive paste 12 by the use of the plane table 34.

Meanwhile, Ag, Cu, C, Cu coated with Ag and other conductive pastes can be used to form the conductive paste 12. Also, while the conductive paste 12 is formed by screen printing as described above, another suitable printing technique is used for this purpose.

Next, the projection 12*b* of the conductive paste 12 which is projecting through the resin film 1 in the surface opposed to the printing surface is formed by heating the conductive paste 12 in an oven at 80° C. to partially cure the conductive paste 12 and removing the masking tape 6 as illustrated in FIG. 15(*k*). By this process, the multilayer wiring board assembly component 20 is completely formed. Next, the press step for manufacturing a multilayer wiring board assembly by joining a plurality of the multilayer wiring board assembly components 20 as described above will be explained with reference to FIG. 16 and FIG. 17.

As illustrated in FIG. 16, a plurality of circuit patterns and a plurality of through holes 7 are formed on each of the multilayer wiring board assembly components (three multilayer wiring board assembly components) 20*a*, 20*b* and 20*c*. Also, the through holes 7 are filled with the conductive paste 12.

The formation of the multilayer wiring board assembly in accordance with the present embodiment is completed by laminating together the respective multilayer wiring board assembly components 20*a* to 20*c* by thermocompression with a most outer copper foil 9 at the same time or sequentially as illustrated in FIG. 17(*a*) and forming a circuit on the most outer copper foil 9 as illustrated in FIG. 17(*b*). The step of laminating the respective multilayer wiring board assembly components 20*a* to 20*c* and the most outer copper foil 9 to each other by thermocompression is carried out by heating them at 280° C. or thereabout and pressing them at 9 MPa or thereabout in order to embed the circuit pattern of the copper foil 2 and the brim 12*a* of the conductive paste 12 in the resin film 1 made of a thermoplastic polyimide having adhesivity and fluidity. At this time, the conductive paste 12 of the respective multilayer wiring board assembly components 20*a* to 20*c* are fixedly pressed and finally cured by thermocompression at the same time.

In accordance with this embodiment as described above, since the through holes 7 of the multilayer wiring board assembly component 20*a* to 20*c* are filled with the conductive paste 12, it is possible to make the interlayer interconnection between each adjacent layers by via-on-via. Also, since the projection 12*b* of the conductive paste 12 is formed in the printing surface, it becomes easy to make the electric connection between the conductive paste 12 having good electric connectivity when the interlayer interconnection is made by via-on-via.

Also, since the conductive paste 12 is embedded in the through hole 7 during printing operation in order that the printing surface thereof is laterally extended from the opening 5 of the copper foil 2, the brim 12*a* of the conductive paste 12 makes reliable electric contact with the inner side surface and the upper surface of the copper foil 2 beyond the perimeter of the opening 5 thereof, and therefore it is possible to connect the copper foil 2 to the conductive paste 12 without compromising the electric connectivity between the copper foil 2 and the fillers of the conductive paste.

Furthermore, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film 1 (the polyimide film) having a small thickness as it is. However, in accordance with this embodiment, the respective steps of holding a sample, opening a hole and filling the hole are conducted after bonding the copper foil 2 to the resin film 1 and therefore it becomes easy to open and fill holes with the conductive paste 12.

Furthermore, since a desired multilayer wiring board assembly can be formed only by preparing multilayer wiring board assembly components as described above and combining and joining them together, the press step of a multilayer wiring board assembly becomes easy without need for conducting press steps of multilayer wiring board assembly components.

Furthermore, in accordance with the present invention, the opening of the through hole near the copper foil is placed on the plane table having a hole of a diameter larger than that of the through hole followed by filling the through hole with the conductive paste from the leading end of the masking tape in order to form a brim laterally extending beyond the perimeter of the opening of the copper foil, and therefore it is possible to form the brim having a desired profile with a high degree of accuracy and having a smaller thickness than that in the case utilzing a mask. By this configuration, the multilayer wiring board assembly is fixedly laminated with a better electric connectivity.

Next, with reference to FIG. 18, FIG. 19 and FIG. 20, a multilayer wiring board assembly component and the multilayer wiring board assembly in accordance with a still further embodiment of the present invention will be explained.

In the case of this embodiment, the multilayer wiring board assembly is laminated by laminating together a plurality of multilayer wiring board assembly components, each of which is made by preparing a copper plated resin film made of a adhesive resin film which is provided with a copper foil bonded to one surface thereof, attaching masking tapes to the both surfaces of the copper plated resin film, opening a through hole in the copper plated resin film through the masking tape, filling the through hole with a conductive paste to form a conductive paste having end surfaces flush with the surfaces of the masking tape, removing the masking tape after the formation of the conductive paste to form projections of the conductive paste in the both surfaces thereof.

Next, the above described multilayer wiring board assembly component will be explained with reference to FIG. 18. The multilayer wiring board assembly component 20' is a connection unit for use in the process of laminating a multilayer wiring board assembly and comprises an FPC as a base element made of a single sided copper plated resin film. Namely, as illustrated in FIG. 18(*j*), the multilayer wiring board assembly component 20 is composed of a copper plated resin film 10 composed of a resin film 1 having adhesivity and made of a thermoplastic polyimide (TPI) and the like and provided with a copper foil 2 bonded to one surface thereof, and a conductive paste 12 embedded in a through hole 7 (refer to FIG. 18(*g*)) passed through the resin film 10 to form an inner via hole. The conductive paste 14 is formed to have an leading end projecting from the upper surface 2*c* of the copper foil 2 as a projection 14*c* and a tail end projecting from the lower surface of the resin film 1 as the projection 14*b*. Namely, as illustrated in FIGS. 18(*h*) through (*j*), the projections 14*c* and 14*b* are formed by removing the masking tapes 6*a* and 6*b* as described above after embedding the conductive paste 14 from the copper foil 2 by printing and the like in the through hole 7 of the copper plated resin film 10 with the masking tapes 6*a* and 6*b* on the both surfaces thereof.

While the resin film 1 is made of a material which is flexible, i.e., bendable in the case of the above described embodiment, the resin film 1 can be made of a rigid material such as a glass epoxy prepreg, an aramid-epoxy prepreg.

Also, a BT resin, a PPO, a PPE and the like can be used as the material for forming the above described resin film 1.

Next, the manufacturing process of the multilayer wiring board assembly component as described above will be explained with reference to FIG. 18.

Figure 18:
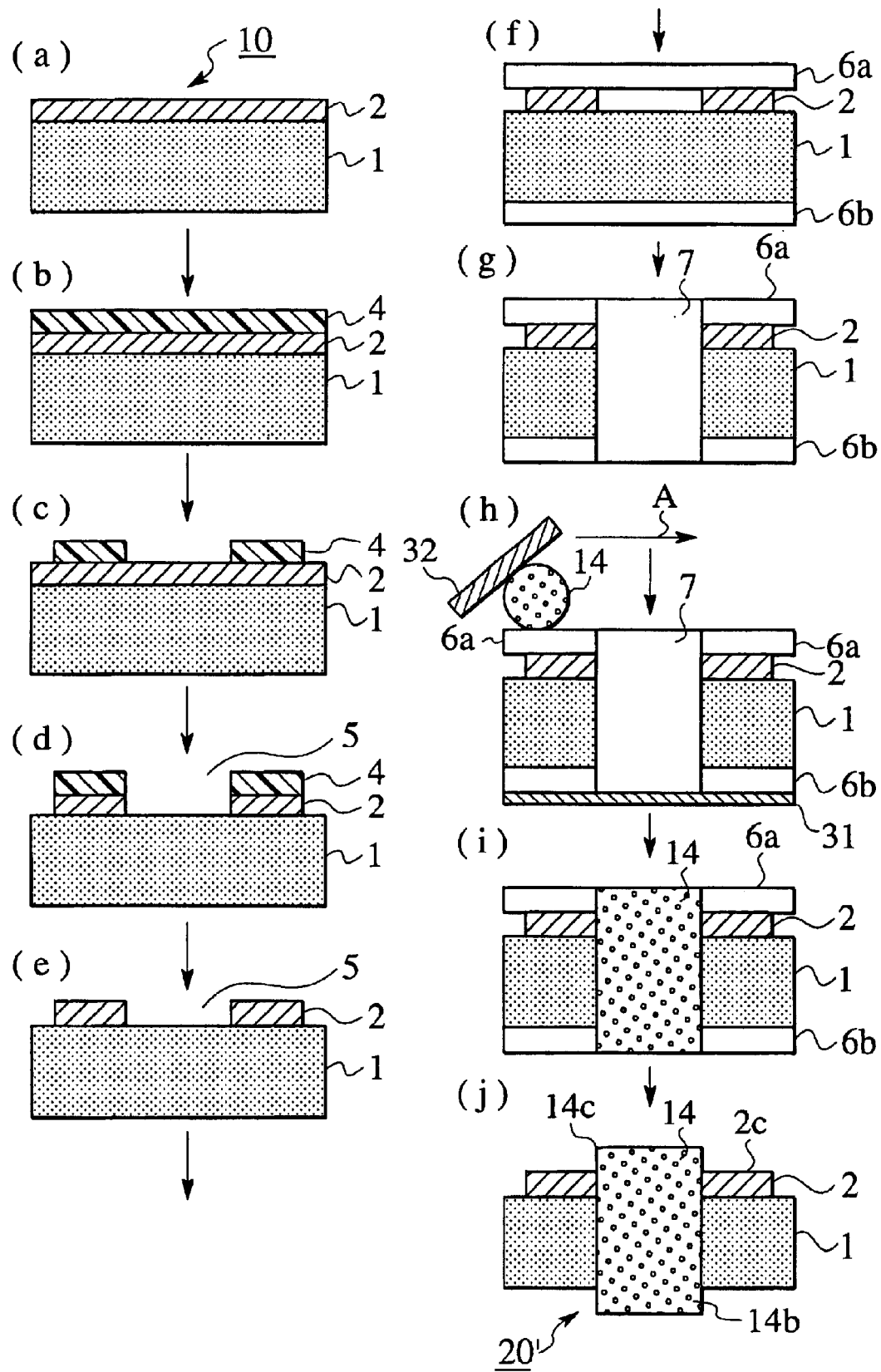
FIG. 18 shows cross sectional views of the intermediate structures of a multilayer wiring board assembly component for use in manufacturing a multilayer wiring board assembly in accordance with a still further embodiment of the present invention in the order of the manufacturing steps.

At first, as illustrated in FIG. 18(*a*), a single sided copper plated resin film 10 is provided or prepared as the resin film 1 made of a thermoplastic polyimide film having a thickness of 15 to 100 micrometer with the copper foil 2 having a thickness of 5 to 18 micrometer bonded to one surface.

Next, as illustrated in FIG. 18(*b*), a dry film (resist) 4 is laminated to the copper foil 2 bonded to the resin film 1 with a vacuum laminator or a roll laminator.

Next, as illustrated in. FIG. 18(*c*), the dry film 4 is exposed to radiation of a circuit pattern followed by developing the dry film 4.

Next, as illustrated in FIG. 18(*d*), a predetermined circuit pattern is formed by etching the copper foil 2 with the dry film 4 as a mask. In this step, the opening 5 is formed by the same etching process for use in the subsequent step of opening the through hole 7. Next, the dry film 4 is removed from the copper foil 2 as illustrated in FIG. 18(*e*).

Next, as illustrated in FIG. 18(*f*), the first masking tape 6*a* is bonded to the surface of the copper foil 2, which is attached to the resin film 1 in the form of a circuit pattern, while the second masking tape 6*b* is bonded to the surface of the resin film 1. The first and second masking tapes 6 may be made of a PET and the like.

Next, as illustrated in FIG. 18(*g*), the through hole 7 of 0.05 to 0.3 mm diameter is opened in the resin film 1 through the resin film 1 and the first and second masking tape 6*a* and 6*b* by exposing them to a laser light by means of a $CO_2$ laser and the like corresponding to the opening 5. Meanwhile, the through hole 7 may be opened by means of a drill in place of the laser exposure process.

In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not been formed in advance, a $CO_2$ laser (capable of opening holes of 50 to 250 micrometer diameter) is not used for this purpose and therefore a larger hole of 200 micrometer diameter or larger has to be opened by means of a drill (capable of opening holes of 200 micrometer diameter or larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 14 is embedded with the copper foil 2 as it is.

Next, as illustrated in FIGS. 18(*h*) and (*i*), the conductive paste 14 is placed on the first masking tape 6*a* and spread to fill the through hole 7 therewith by moving a squeezee 15 made of an urethane, silicone and the like in the direction of arrow A. At this time, a breathable separate paper 31 as siliconized or fluoridized is placed for the purpose of preserving the conductive paste 14 at the leading end of the through hole 7 near the resin film 1.

In this case, the separate paper 31 is provided with breathability for the purpose of enabling air to escape when the through hole 7 is filled with the conductive paste 14. Also, at least the upper surface of the separate paper 31 is siliconized or fluoridized as described above for the purpose of making easy to remove the separate paper 31 from the conductive paste 14 in contact with the separate paper 31 and preventing the conductive paste 14 from being detached from the through hole 7 when the separate paper 31 is removed.

Meanwhile, Ag, Cu, C, Cu coated with Ag and other conductive pastes can be used to form the conductive paste 14.

Next, the first projection 14*c* of the conductive paste 14 which is projecting through the upper surface 2*c* of the copper foil 2 and having a diameter equal to or smaller than the diameter of the through hole 7 is formed, as well as the second projection 14*b* of the conductive paste 14 which is projecting from the resin film 1 through the rare surface opposed to the printing surface and having a diameter equal to or smaller than the diameter of the through hole 7, as illustrated in FIG. 18(j), by removing the separate paper 31 and heating the conductive paste 14 in an oven at 80° C. to partially cure the conductive paste 14 and removing the first and second masking tapes 6a and 6b. By this process, the multilayer wiring board assembly component 20' is completely formed.

Generally speaking, in the case where a land surface is formed on the copper foil by the use of a metallic mask, the alignement of the metallic mask with holes of the substrate has to be achieved with sufficient precision such that it is necessary to excessively increase the diameter (the land diameter) of the brim of the conductive paste for securing the alignement.

Contrary to this, in accordance with the embodiments of the present invention as described above, the multilayer wiring board assembly component is formed by bonding the masking tape 6a on the copper foil 2, opening a through hole through the masking tape 6a and the copper foil 2, removing the masking tape 6a to form the first projection 14c. A plurality of such multilayer wiring board assembly components are laminated together in order that the first projection 14c is crushed and spread on the copper foil 2 to form the brim (land) without need for exact accurate alignment while it becomes possible to adjust the diameter of the brim (land) by changing the thickness of the masking tape 6a.

Next, the press step for manufacturing a multilayer wiring board assembly by joining a plurality of the multilayer wiring board assembly components 20 as described above will be explained with reference to FIG. 19 and FIG. 20.

Figure 19:
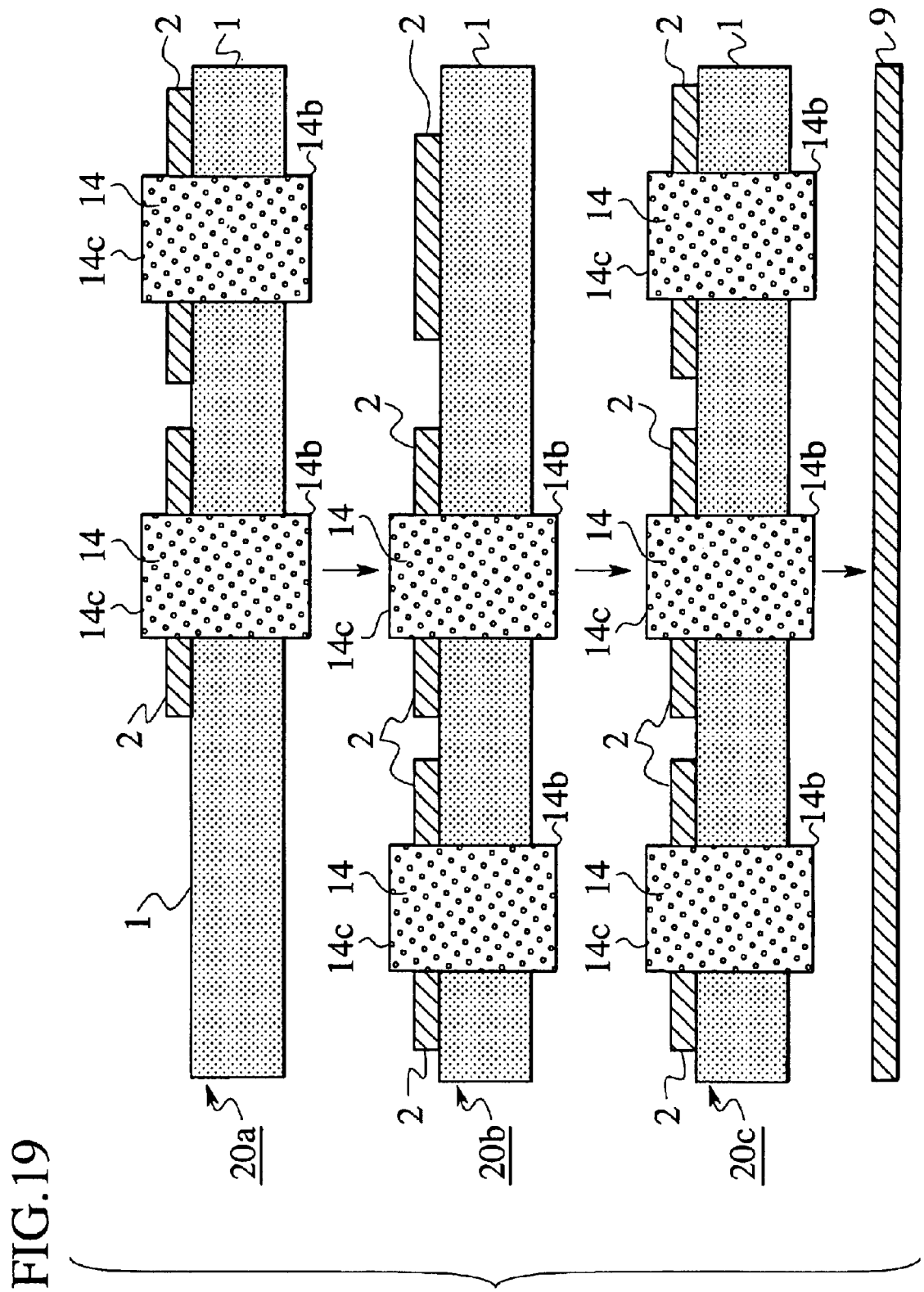
FIG. 19 shows cross sectional views showing the multilayer wiring board assembly in accordance with the still further embodiment of the present invention in the order of the manufacturing steps.
Figure 20:
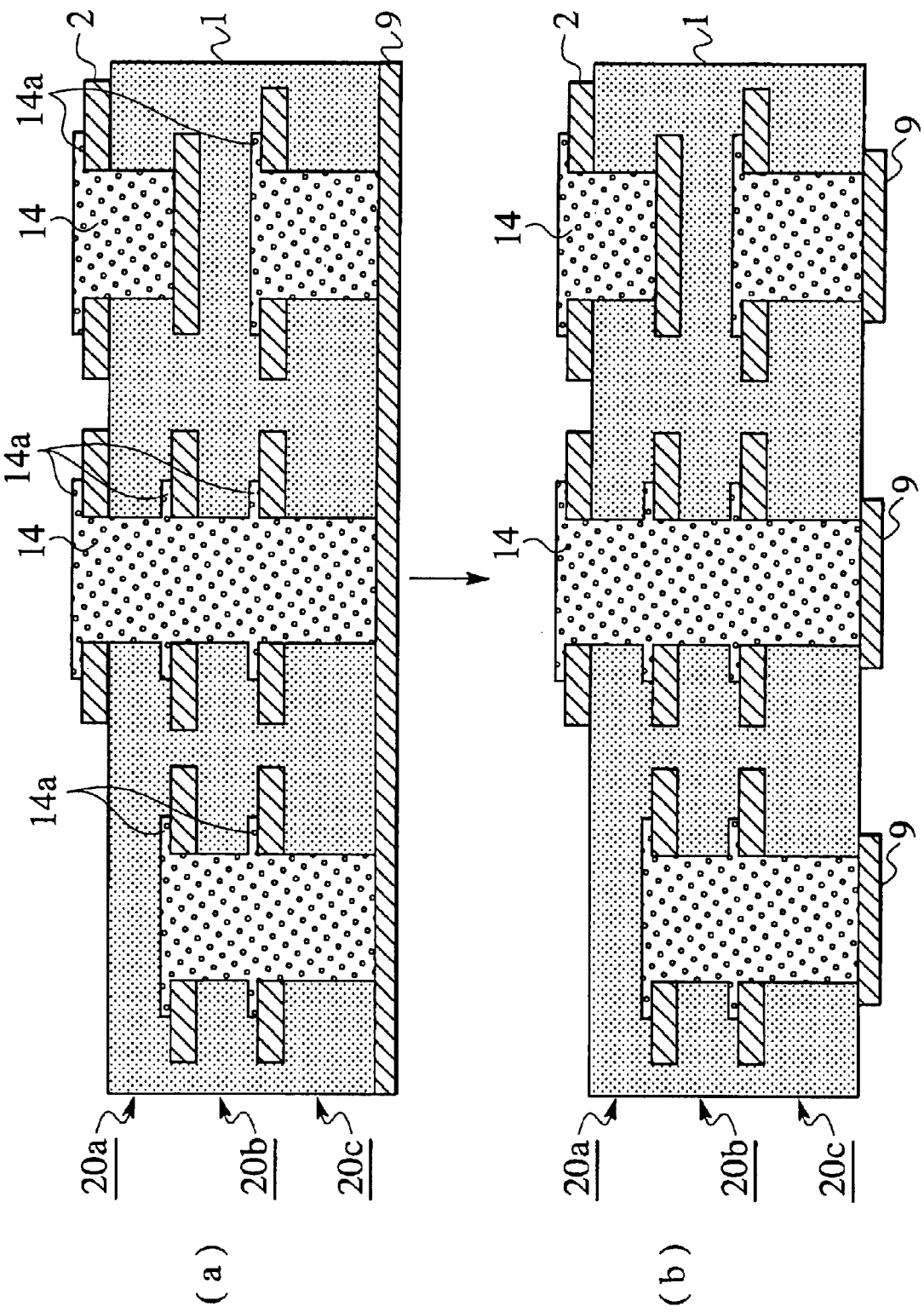
FIG. 20 shows cross sectional views showing the multilayer wiring board assembly in accordance with the still further embodiment of the present invention in the order of the manufacturing steps.

As illustrated in FIG. 19, a plurality of circuit patterns and a plurality of through holes 7 are formed on each of the multilayer wiring board assembly components (three multilayer wiring board assembly components) 20a, 20b and 20c. Also, the through holes 7 are filled with the conductive paste 14.

The formation of the multilayer wiring board assembly in accordance with the present embodiment is completed by laminating together the respective multilayer wiring board assembly components 20a to 20c by thermocompression with a most outer copper foil 9 at the same time or sequentially as illustrated in FIG. 20(a) and forming a circuit on the most is outer copper foil 9 as illustrated in FIG. 20(b). The step of laminating the respective multilayer wiring board assembly components 20a to 20c and the most outer copper foil 9 to each other by thermocompression is carried out by heating them at 280° C. or thereabout and pressing them at 9 MPa or thereabout in 20 order to embed the circuit pattern of the copper foil 2 and brims 14a of the-conductive paste 14 in the resin film 1 made of a thermoplastic polyimide having adhesivity and fluidity. At this time, the conductive paste 14 of the respective multilayer wiring board assembly components 20a to 20c are fixedly pressed and finally cured by thermocompression at the same time.

In accordance with this embodiment as described above, since the through holes 7 of the multilayer wiring board assembly component 20a to 20c are filled with the conductive paste 12, it is possible to make the interlayer interconnection between each adjacent layers by via-on-via. Also, since the projection 14b of the conductive paste 14 is formed in the printing surface, it becomes easy to make the electric connection between the conductive paste 14 having good electric connectivity when the interlayer interconnection is made by via-on-via.

In this case, as illustrated in FIG. 20(a), the first projection 14c of the above described multilayer wiring board assembly component 20' is squashed by compression of the conductive paste 14 as described above to form the brim 14a having a diameter larger than that of the through hole 7 and laterally extending on the copper foil 2 beyond the perimeter of the through hole 7 in order to increase the contact area of the conductive paste 14 with the copper foil 2 resulting in improved electric connectivity.

The step of laminating the respective multilayer wiring board assembly components and the outer copper foil 9 to each other by thermocompression is carried out by heating them at 280° C. or thereabout and pressing them at 9 MPa or thereabout.

In accordance with this embodiment as described above, since the first projection 14c of the above described multilayer wiring board assembly component 20' is squashed by compression of the conductive paste 14 to form the brim 14a having a diameter larger than that of the through hole 7 and laterally extending on the copper foil 2 beyond the perimeter of the through hole 7 resulting in improvement of electric connectivity.

Furthermore, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film 1 (the polyimide film) having a small thickness as it is. However, in accordance with this embodiment, the respective steps of holding a sample, opening a hole and filling the hole are conducted after bonding the copper foil 2 to the resin film 1 and therefore it becomes easy to open and fill holes with the conductive paste 12.

Furthermore, since a desired multilayer wiring board assembly can be formed only by preparing multilayer wiring board assembly components as described above and combining and joining them together, the press step of a multilayer wiring board assembly becomes easy without need for conducting press steps of multilayer wiring board assembly components.

As explained heretofore, in accordance with the present invention, it is possible to easily laminate together flexible FPCs having highly packing densities by via-on-via and chip-on-via.

Also, in accordance with the present invention, the contact area of a conductive paste with a copper foil is increased when compression bonding multilayer wiring board assembly components to each other, and therefore it is possible to improve electric connectivity.

Figure 21:
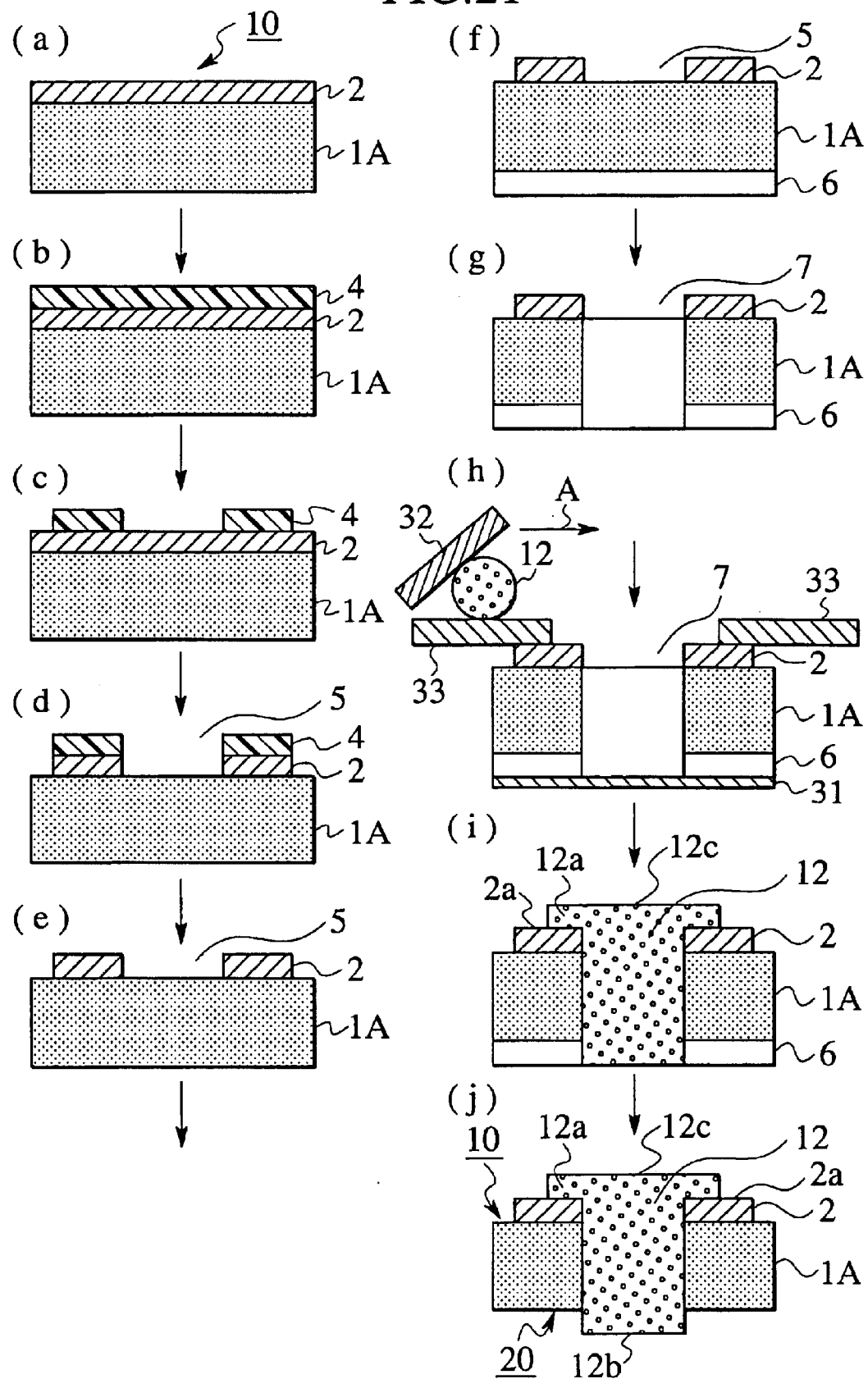
FIG. 21 shows cross sectional views of the intermediate structures of a multilayer wiring board assembly component for use in manufacturing a multilayer wiring board assembly )in accordance with a still further embodiment of the present invention in the order of the manufacturing steps.

Next, with reference to FIG. 21, FIG. 22 and FIG. 23, a multilayer wiring board assembly component and the multilayer wiring board assembly in accordance with a still further embodiment of the present invention will be explained.

In the case of this embodiment, the resin film 1 having adhesivity of the embodiment as illustrated in FIG. 1, FIG. 2 and FIG. 3 is made of a thermosetting resin (3A).

In the case utilizing a thermoplastic polyimide as the resin film 1 having adhesivity, the multilayer lamination (finally curing) is carried out at a temperature not lower than the glass transition temperature. However, since there occurs degradation of conductive resin components (the conductive paste) and oxdization of metallic fillers because of the heating process for multilayer lamination, the thermoplastic polyimide has to be made of a material selected among from those having lower glass transition temperatures.

However, the modulus of elasticity of a thermoplastic polyimide is lowered by heating and recovered again by cooling. Namely, a thermoplastic polyimide has a characteristic that the modulus of elasticity is reversible relative to the temperature change. Accordingly, in the case where a thermoplastic polyimide having a low glass transition temperature is used as a resin film having adhesivity, there sometime occurs peeling-off during a soldering process after manufacturing the multilayer wiring board assembly, during a heat resistant test and so forth. It is therefore inevitable to use a material having a higher glass transition temperature.

Accordingly, in order to solve the above described dilemma encountered when a thermoplastic polyimide is used, it is required that the polyimide resin film 1 can be compression bonded at a low temperature while maintaining the heat resistant feature of the polyimide.

For this purpose, the interlayer resin film 1A having adhesivity is formed by the use of a heat resistant resin such as a thermosetting resin (which is not hardened (uncured) in an initial state, and hardened (cured) at a temperature higher than the cure temperature while the initial state can not be recovered, even if cooled, as maintaining the hardened state) rather than the use of a thermoplastic adhesive material. It is therefore possible to manufacture a multilayer wiring board assembly having a good heat resisting property with little damage to the respective boards during the manufacturing process by selecting the cure temperature of the thermosetting resin to be lower than the temperature at which the resin contained in the conductive paste is not damaged and the filler is not oxidized.

Namely, the multilayer wiring board assembly component 20 is a connection unit for use in the process of laminating a multilayer wiring board assembly and comprises an FPC as a base element made of a single sided copper plated resin film. Namely, as illustrated in FIG. 21(j), the multilayer wiring board assembly component 20 is composed of a copper plated resin film 10 composed of a resin film 1A made of a thermosetting polyimide and provided with a copper foil 2 bonded to one surface thereof, and a conductive paste 12 embedded in a through hole 7 (refer to FIG. 21(g)) passed through the resin film 10 to form an inner via hole. A predetermined circuit pattern is formed in the copper foil 2 by etching and the like. The conductive paste 12 is embedded in the through hole 7 from the surface of the copper foil 2 by screen printing and so forth and laterally extending on the upper surface of the copper foil 2 as a brim 12a beyond the perimeter of the opening thereof with the printing surface 12c of the conductive paste 12 being flat and flush therewith in order that the leading end thereof is projected as a projection 12b through the opposed surface of the copper plated resin film 10 having the resin film 1A.

While the resin film 1A is made of a material which is flexible, i.e., bendable in the case of the above described embodiment, the resin film 1A can be made of a rigid material such as a glass epoxy prepreg, an aramid-epoxy prepreg.

Also, a BT resin, a PPO, a PPE and the like can be used as the material for forming the above described resin film 1A.

Also, the above described the resin film 1A is preferably made of a resin which is cured at 60° C. to 250° C.

Namely, the resin film 1A is preferably made of a resin whose the cure temperature is no higher than the heat resisting temperature of a resin contained in the conductive paste and no lower than the evaporation temperature of the volatile component that is mixed into the conductive paste.

Figure 22:
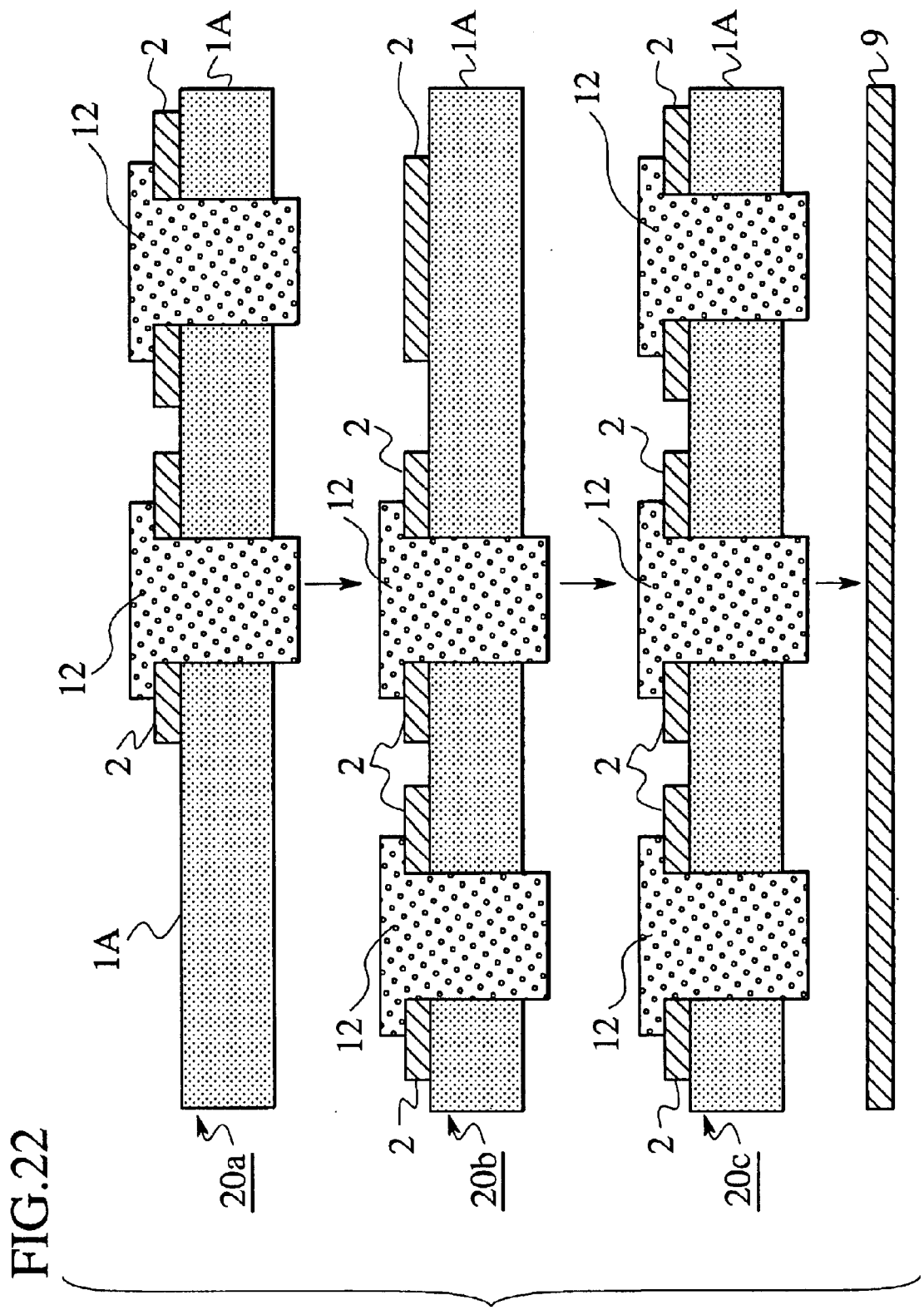
FIG. 22 shows cross sectional views showing the multilayer wiring board assembly in accordance with the still further embodiment of the present invention in the order of the manufacturing steps.
Figure 23:
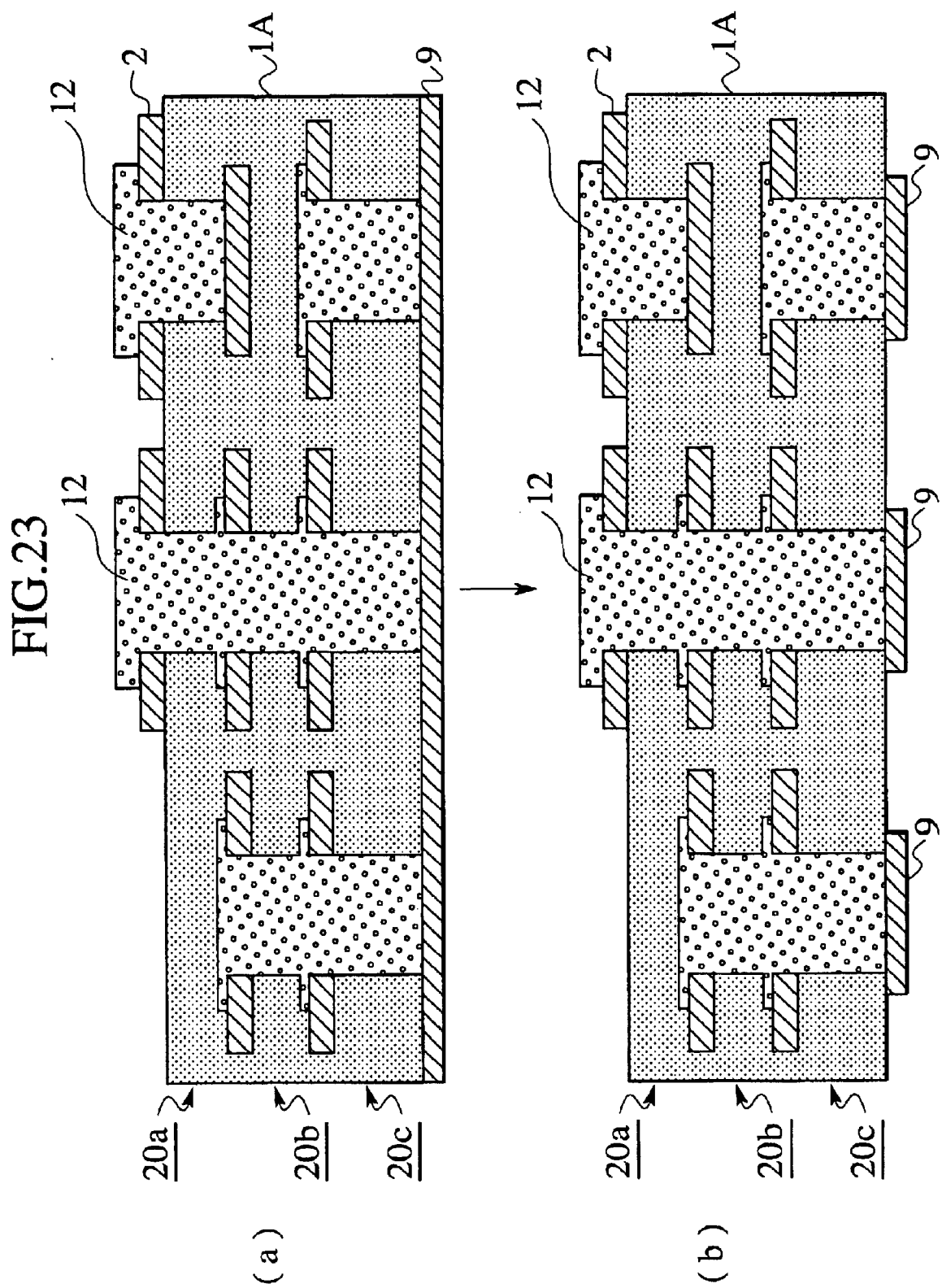
FIG. 23 shows cross sectional views showing the multilayer wiring board assembly in accordance with the still further embodiment of the present invention in the order of the manufacturing steps.

A multilayer wiring board assembly is laminated by stacking a plurality of the multilayer wiring board assembly components as illustrated in FIG. 21(j) (three units in the case of the embodiment as illustrated in FIG. 22 and FIG. 23). As illustrated in FIG. 22 and FIG. 23, since the through hole 7 of the multilayer wiring board assembly component is filled with the conductive paste 12, it is possible to make interlayer connection via-on-via.

In this manner, when the interlayer interconnection is made by via-on-via, the conductive paste 12 are connected directly to each other rather than through an intervening copper foil therebetween as explained in the description of "BACKGROUND OF THE INVENTION".

Next, the manufacturing process (method) of the multilayer wiring board assembly in accordance with the present invention will be explained with reference to FIG. 21 through FIG. 23.

(1) The manufacturing process of a multilayer wiring board assembly component (FIG. 21):

At first, as illustrated in FIG. 21(a), a single sided copper plated resin film 10 is provided or prepared as the resin film 1A made of a thermosetting polyimide film and the like having a thickness of 15 to 100 micrometer with the copper foil 2 having a thickness of 5 to 18 micrometer bonded to one surface.

Next, as illustrated in FIG. 21(b), a dry film (resist) 4 is laminated to the copper foil 2 bonded to the resin film 1A with a vacuum laminator or a roll laminator. Next, as illustrated in FIG. 21(c), the dry film 4 is exposed to radiation of a circuit pattern followed by developing the dry film 4.

Next, as illustrated in FIG. 21(d), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 21(e), a masking tape 6 having a thickness of 10 to 50 micrometer is bonded as a mask to the surface of the resin film 1A as illustrated in FIG. 21(f). The masking tape 6 may be made of a PET and the like.

Next, as illustrated in FIG. 21(g), the through hole 7 of 0.05 to 0.3 mm diameter is opened in the resin film 1 through the resin film 1A and the masking tape 6 by exposing them to a laser light through the opening 5 by means of a $CO_2$ laser and the like. Meanwhile, the through hole 7 may be opened by means of a drill in place of the laser exposure process.

In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not be formed in advance, a $CO_2$ laser (capable of opening holes of 56 to 250 micrometer diameter) is not used for this purpose and therefore a larger hole of 200 micrometer diameter or larger has to be opened by means of a drill (capable of opening holes of 200 micrometer diameter or is larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, as illustrated in FIGS. 21(h) and (i), the conductive paste 12 is placed on the copper foil 2 and a mask 33 spread to fill the through hole 7 therewith by moving a squeezee 32 made of an urethane, silicone and the like in the direction of arrow A. At this time, a breathable separate paper 31 as siliconized or fluoridized is placed for the purpose of preserving the conductive paste 12 at the leading end of the through hole 7 near the resin film 1A.

In this case, the separate paper 31 is provided with breathability for the purpose of enabling air to escape when the through hole 7 is filled with the conductive paste 12. Also, at least the upper surface of the separate paper 31 is siliconized or fluoridized as described above for the purpose of making easy to remove the separate paper 31 from the conductive paste 12 in contact with the separate paper 31 and preventing the conductive paste 12 from being detached from the through hole 7 when the separate paper 31 is removed.

At this time, the conductive paste 12 is screen printed with a diameter larger than the opening 5 (the through hole 7) by about 10% to 50% so that part of the conductive paste remains on the upper surface of the copper foil 2 beyond the perimeter of the opening 5 thereof. By this configuration, there is formed the brim 12a which is connected to the land surface 2a of the copper foil 2 in the direction normal to the surface. In this case, however, the printing surface 12c of the conductive paste 12 is made flat.

Meanwhile, Ag, Cu, C, Cu coated with Ag and other conductive pastes can be used to form the conductive paste 12. Also, while the conductive paste 12 is formed by screen printing as described above, another suitable printing technique is used for this purpose.

Next, after removing the separate paper 31, the projection 12b of the conductive paste 12 which is projecting through the resin film 1A in the surface opposed to the printing surface is formed by heating the conductive paste 12 in an oven at 80° C. partially cure the conductive paste 12 and removing the masking tape 6 as illustrated in FIG. 21(j). In this case where the resin film 1A is partially cured at the partial curing temperature of 80° C., it is made of a resin which can be finally (irreversibly) cured at a temperature higher than the partial curing temperature of 80° C. Meanwhile, it is possible to dispense with the partial curing process (for dissipating the solvent and air) when the conductive paste 12 is made of some type of a conductive paste.

By this process, the multilayer wiring board assembly component 20 is completely formed.

(2) The press process of the multilayer wiring board, assembly (FIG. 22 and FIG. 23):

As illustrated in FIG. 22, a plurality of circuit patterns and a plurality of through holes 7 are formed on each of the multilayer wiring board assembly components (three multilayer wiring board assembly components) 20a, 20b and 20c. Also, the through holes 7 are filled with the conductive paste 12.

The formation of the multilayer wiring board assembly in accordance with the present embodiment is completed by laminating together, at a time or successively, the respective multilayer wiring board assembly components 20a to 20c by thermocompression with a most outer copper foil 9 as illustrated in FIG. 23(a) and forming a circuit on the most outer copper foil 9. The step of laminating the respective is multilayer wiring board assembly components 20a to 20c and the most outer copper foil 9 to each other by thermocompression is carried out by heating them at 170° C. or thereabout and pressing them at 9 MPa or thereabout in order to embed the circuit pattern of the copper foil 2 and the brim 12a of the conductive paste 12 in the resin film 1A made of a thermosetting polyimide. At this time, the conductive paste 12 of the respective multilayer wiring board assembly components 20a to 20c are fixedly pressed and finally cured by thermocompression at the same time.

In accordance with this embodiment as described above, since the interlayer resin film 1A having adhesivity is formed by the use of a heat resistant resin such as a thermosetting resin (which is not hardened (uncured) in an initial state, and hardened (cured) at a temperature higher than the cure temperature while the initial state can not be recovered, even if cooled, as maintaining the hardened state) rather than the use of a thermoplastic adhesive material, it is possible to manufacture a multilayer wiring board assembly having a good heat resisting property with little damage to the respective boards during the manufacturing process by selecting the cure temperature of the thermosetting resin to be lower than the temperature at which the resin contained in the conductive paste is not damaged and the filler is not oxidized. Also, since the volatile component of the conductive paste is evaporated in genral at 100° C. or thereabout, the the resin film 1A is made of a resin which is cured at a temperature not lower than the evaporation temperature.

Furthermore, since the through holes 7 of the multilayer wiring board assembly component 20a to 20c are filled with the conductive paste 12, it is possible to make the interlayer interconnection between each adjacent layers by via-on-via. Also, since the projection 12b of the conductive paste 12 is formed in the printing surface, it becomes easy to make the electric connection between the conductive paste 12 having good electric connectivity when the interlayer interconnection is made by via-on-via.

Still further, since the conductive paste 12 is embedded in the through hole 7 during printing operation in order that the printing surface thereof is laterally extended from the opening 5 of the copper foil 2, the brim 12a of the conductive paste 12 makes reliable electric contact with the inner side surface and the upper surface of the copper foil 2 beyond the perimeter of the opening 5 thereof, and therefore it is possible to connect the copper foil 2 to the conductive paste 12 without compromising the electric connectivity between the copper foil 2 and the fillers of the conductive paste.

Still further, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film (the polyimide film) having a small thickness as it is. However, in accordance with this embodiment, the respective steps of holding a sample, opening a hole and filling the hole are conducted after bonding the copper foil 2 to the resin film 1A and therefore it becomes easy to open and fill holes with the conductive paste 12.

Furthermore, since a desired multilayer wiring board assembly can be formed only by preparing multilayer wiring board assembly components as described above and combining and joining them together, the press step of a multilayer wiring board assembly becomes easy without need for conducting press steps of multilayer wiring board assembly components.

Next, with reference to FIG. 24, FIG. 25 and FIG. 26, a multilayer wiring board assembly component and the multilayer wiring board assembly in accordance with a still further embodiment of the present invention will be explained.

In the case of this embodiment, the resin film 1 having adhesivity of the embodiment as illustrated in FIG. 1, FIG.

2 and FIG. 3 is made of a thermoplastic polyimide to which is given a thermosetting property (1B).

When a thermoplastic polyimide is used as the resin film 1 having adhesivity, the multilayer lamination (finally curing) is carried out at a temperature not lower than the glass transition temperature. However, since there occurs degradation of conductive resin components (the conductive paste) and oxdization of metallic fillers because of the heating process for multilayer lamination, the thermoplastic polyimide has to be made of a material selected among from those having lower glass transition temperatures.

However, the modulus of elasticity of a thermoplastic polyimide is lowered by heating and recovered by cooling again.

Namely, a thermoplastic polyimide has a characteristic that the modulus of elasticity is reversible relative to the temperature change. Accordingly, in the case where a thermoplastic polyimide having a low glass transition temperature is used as a resin film having adhesivity, there sometime occurs peeling-off in a soldering process after manufacturing the multilayer wiring board assembly, in a heat resistant test and so forth. It is therefore inevitable to use a material having a higher glass transition temperature.

Accordingly, in order to solve the above described dilemma in the use of a thermoplastic polyimide, it is required that the resin film 1 can be compression bonded at a low temperature while maintaining the heat resistant feature of the polyimide.

For this purpose, the interlayer resin film 1 is formed of a thermoplastic polyimide 1B to which is given a thermosetting property, and therefore it is possible to manufacture a multilayer wiring board assembly having a good heat resisting property without damaging the conductive resin components (the conductive paste).

Namely, the multilayer wiring board assembly component is a connection unit for use in the process of laminating a multilayer wiring board assembly and comprises an FPC as a base element made of a single sided copper plated resin film. Namely, as illustrated in FIG. 24(j), the multilayer wiring board assembly component 20 is composed of a copper plated resin film 10 composed of a resin film 1 having adhesivity and made of a thermoplastic polyimide (TPI) and provided with a copper foil 2 bonded to one surface thereof, and a conductive paste 12 embedded in a through hole 7 (refer to FIG. 24(g)) passed through the resin film 10 to form an inner via hole. A predetermined circuit pattern is formed in the copper foil 2 by etching and the like. The conductive paste 12 is embedded in the through hole 7 from the surface of the copper foil 2 by screen printing and so forth and laterally extending on the upper surface of the copper foil 2 as a brim 12a beyond the perimeter of the opening thereof with the printing surface 12c of the conductive paste 12 being flat and flush therewith in order that the leading end thereof is projected as a projection 12b through the opposed surface of the copper plated resin film 10 having the resin film 1B.

While the resin film 1B is made of a material which is flexible, i.e., bendable in the case of the above described embodiment, the resin film 1B can be made of a rigid material such as a glass epoxy prepreg, an aramid-epoxy prepreg.

Meanwhile, a BT resin, a PPO, a PPE and the like can be used as the material for forming the above described resin film 1B.

Also, the resin film 1B is made of a thermoplastic polyimide to which is given a thermosetting property having a cure temperature of 150° C. to 200° C., a modulus of elasticity of 600 to 1400 MPa and a glass transition temperature of 70° C. to 90° C.

Figure 24:
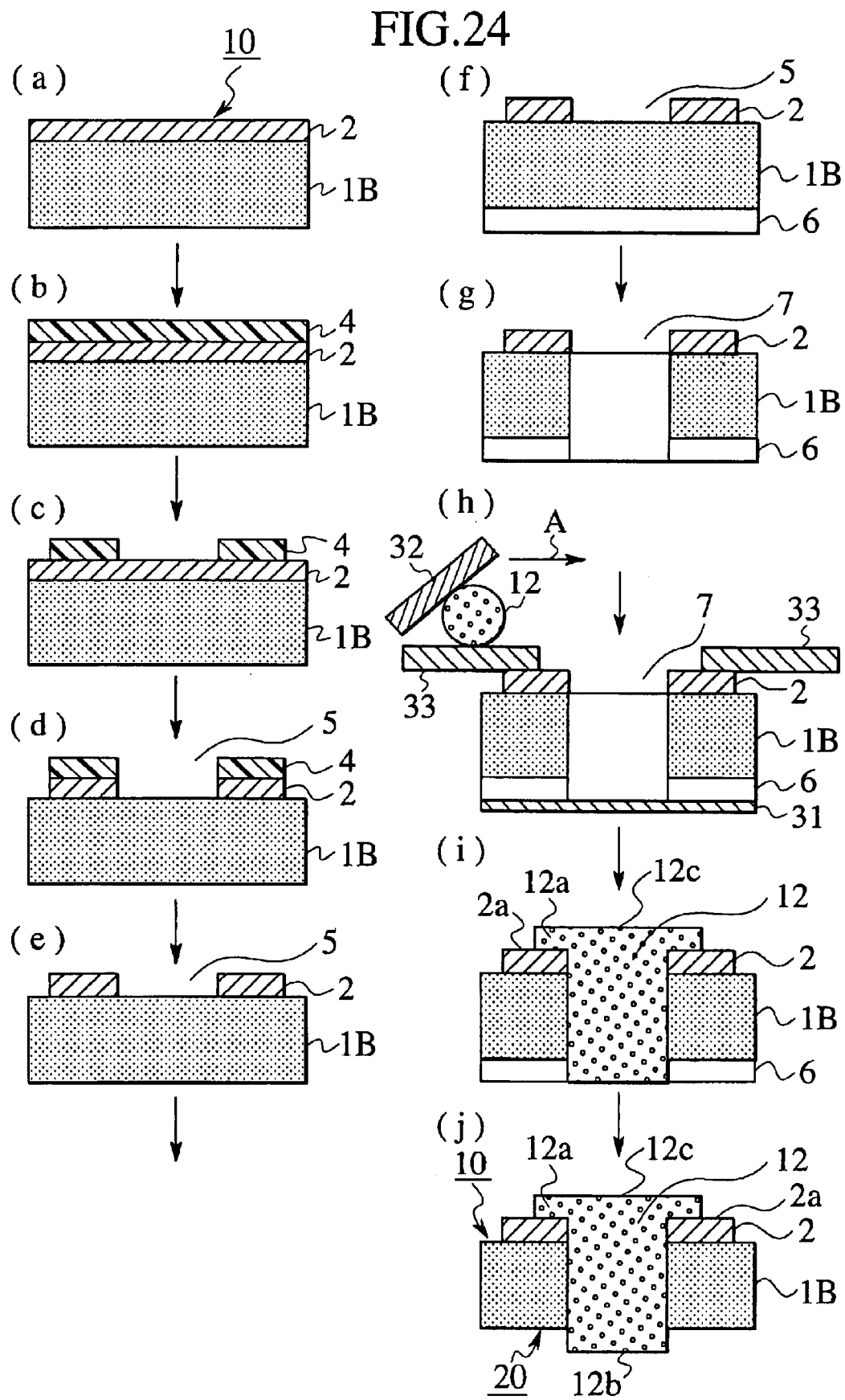
FIG. 24 shows cross sectional views of the intermediate structures of a multilayer wiring board assembly component for use in manufacturing a multilayer wiring board assembly in accordance with a still further embodiment of the present invention in the order of the manufacturing steps.
Figure 25:
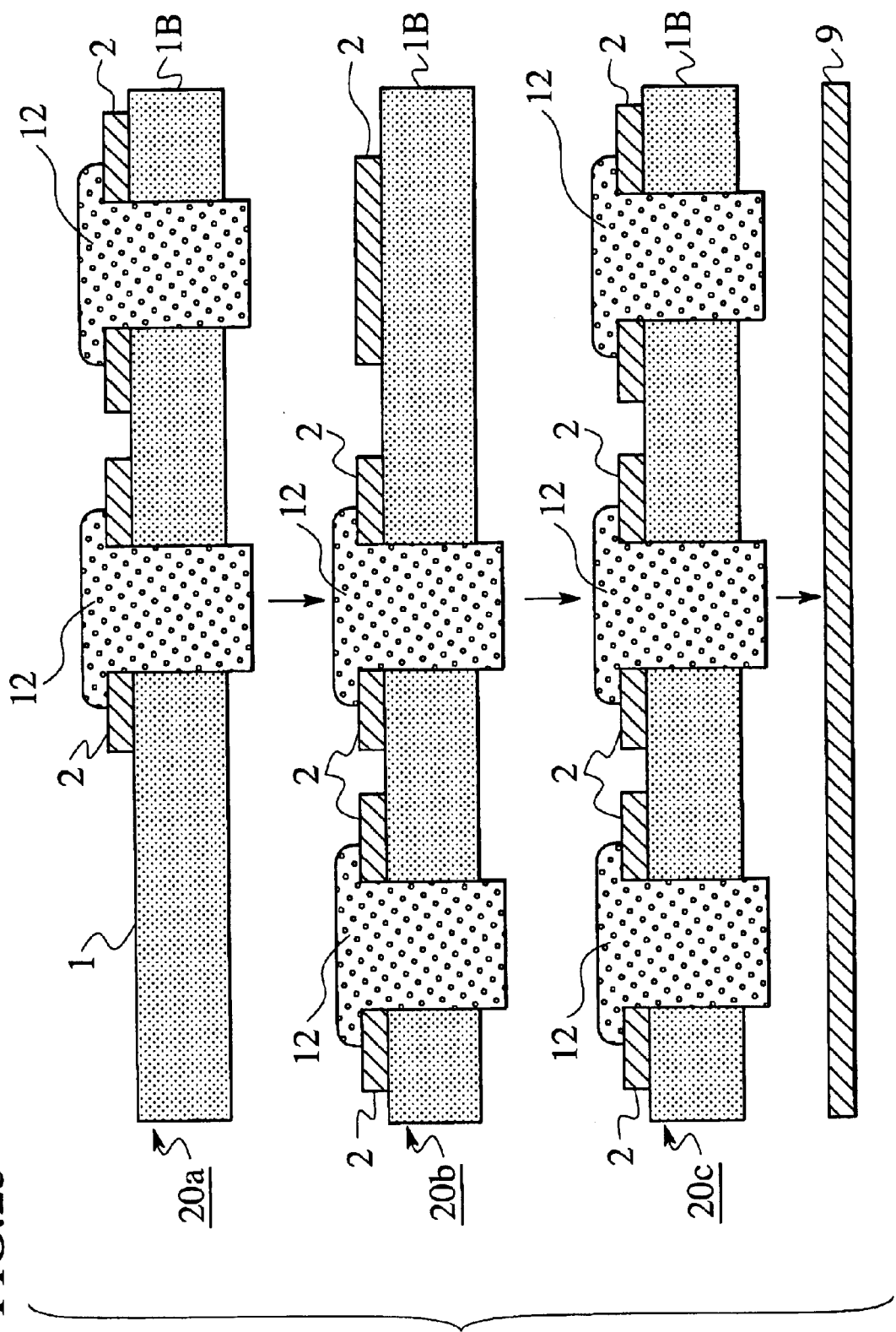
FIG. 25 shows cross sectional views showing the multilayer wiring board assembly in accordance with the still further embodiment of the present invention in the order of the manufacturing steps.

A multilayer wiring board assembly is laminated by stacking a plurality of the multilayer wiring board assembly components as illustrated in FIG. 24(j) (three units in the case of the embodiment as illustrated in FIG. 25 and FIG. 26). As illustrated in FIG. 25 and FIG. 26 since the through hole 7 of the multilayer wiring board assembly component is filled with the conductive paste 12, it is possible to make interlayer connection via-on-via.

In this manner, when the interlayer interconnection is made by via-on-via, the conductive paste 12 are connected directly to each other rather than through an intervening copper foil therebetween as explained in the description of "BACKGROUND OF THE INVENTION".

Next, the manufacturing process (method) of the multilayer wiring board assembly in accordance with the present invention will be explained with reference to FIG. 24 through FIG. 26.

(1) The manufacturing process of a multilayer wiring board assembly component (FIG. 24):

At first, as illustrated in FIG. 24(a), a single sided copper plated resin film 10 is provided or prepared as the resin film 1 made of a thermoplastic polyimide film to which is given a thermosetting property and having a thickness of 12.5 to 50 micrometer with the copper foil 2 having a thickness of 5 to 18 micrometer bonded to one surface.

Namely, in this case, a polyimide base bonding sheet made of a thermoplastic polyimide to which is given a thermosetting property is temporarily compression bonded, as the resin film 1B, under a pressure of 40 kgf/cm² for a short time (about 10 minutes) at a temperature higher than the glass transition temperature (70 to 90° C.) and lower than the cure temperature (when finally cured) during the press process (the lamination process) of the multilayer wiring board assembly as explained in the following description.

In this case, the polyimide base bonding sheet 1B as the above described thermoplastic polyimide to which is given a thermosetting property can be formed, for example, with a polyimide base bonding sheet selected among from the SPB series distributed by Nippon Steel Chemical Co., Ltd. Meanwhile, the manufacturing method of a polyimide base bonding sheet selected among from the SPB series distributed by Nippon Steel Chemical Co., Ltd. and other necessary information is disclosed in Japanese Patent Application No.Hei 10-37700 (Japanese Patent Published Application No.Hei 11-228825) filed in Feb. 19, 1998 and Japanese Patent Application No.Hei 10-145872 (Japanese Patent Published Application No.Hei 11-335555) filed in May. 27, 1998.

Next, as illustrated in FIG. 24(b), a dry film (resist) 4 is laminated to the copper foil 2 bonded to the resin film 1B with a vacuum laminator or a roll laminator. Next, as illustrated in FIG. 24(c), the dry film 4 is exposed to radiation of a circuit pattern followed by developing the dry film 4.

Next, as illustrated in FIG. 24(d), a predetermined circuit pattern is formed by etching the copper foil 2 with the dry film 4 as a mask. In this step, the opening 5 is formed by the same etching process for use in the subsequent step of opening the through hole 7. Next, after the dry film 4 is removed from the copper foil 2 as illustrated in FIG. 24(e), a masking tape 6 having a thickness of 10 to 50 micrometer is bonded as a mask to the surface of the resin film 1B as illustrated in FIG. 24(f). The masking tape 6 may be made of a PET and the like.

Next, as illustrated in FIG. 24(g), the through hole 7 of 0.05 to 0.3 mm diameter is opened in the resin film 1 through the resin film 1 and the masking tape 6 by exposing them to a laser light through the opening 5 by means of a $CO_2$ laser and the like. Meanwhile, the through hole 7 may be opened by means of a drill in place of the laser exposure process.

In this case, since the through hole 7 is formed through the opening 5 by means of a $CO_2$ laser, it is possible to open a smaller hole (50 to 250 micrometer diameter). Namely, if the through hole 7 were formed through the copper foil 2 in which the opening 5 had not be formed in advance, a $CO_2$ laser (capable of opening holes of 50 to 250 micrometer diameter) is not used for this purpose and therefore a larger hole of 200 micrometer diameter or larger has to be opened by means of a drill (capable of opening holes of 200 micrometer diameter or larger). Meanwhile, some other lasers such as a UV-YAG laser, an excimer laser may be used for this purpose of opening small holes. However, these lasers is too expensive to use for this purpose and therefore not practical.

Meanwhile, since the through hole 7 as described above is passed also through the copper foil 2, there are not generated voids, smear, as well as the like drawbacks, which are likely if the conductive paste 12 is embedded with the copper foil 2 as it is.

Next, as illustrated in FIGS. 24(*h*) and (*i*), the conductive paste 12 is placed on the copper foil 2 and the mask 33 and spread to fill the through hole 7 therewith by moving a squeezee 32 made of an urethane, silicone and the like in the direction of arrow A. At this time, a breathable separate paper 31 as siliconized or fluoridized is placed for the purpose of preserving the conductive paste 12 at the leading end of the through hole 7 near the resin film 1B.

In this case, the separate paper 31 is provided with breathability for the purpose of enabling air to escape when the through hole 7 is filled with the conductive paste 12. Also, at least the upper surface of the separate paper 31 is siliconized or fluoridized as described above for the purpose of making easy to remove the separate paper 31 from the conductive paste 12 in contact with the separate paper 31 and preventing the conductive paste 12 from being detached from the through hole 7 when the separate paper 31 is removed.

At this time, the conductive paste 12 is screen printed with a diameter larger than the opening 5 (the through hole 7) by about 10% to 50% so that part of the conductive paste remains on the upper surface of the copper foil 2 beyond the perimeter of the opening 5 thereof. By this configuration, there is formed the brim 12*a* which is connected to the land surface 2*a* of the copper foil 2 in the direction normal to the surface. In this case, however, the printing surface 12*c* of the conductive paste 12 is made flat.

Meanwhile, Ag, Cu, C, Cu coated with Ag and other conductive pastes can be used to form the conductive paste 12. Also, while the conductive paste 12 is formed by screen printing as described above, another suitable printing technique is used for this purpose.

Next, after removing the separate paper 31, the projection 12*b* of the conductive paste 12 which is projecting through the resin film 1B in the surface opposed to the printing surface is formed by heating the conductive paste 12 in an oven at 80° C. partially cure the conductive paste 12 and removing the masking tape 6 as illustrated in FIG. 24(*j*). By this process, the multilayer wiring board assembly component 20 is completely formed.

(2) The press process of the multilayer wiring board assembly (FIG. 25 and FIG. 26):

As illustrated in FIG. 25, a plurality of circuit patterns and a plurality of through holes 7 are formed on each of the multilayer wiring board assembly components (three multilayer wiring board assembly components) 20*a*, 20*b* and 20*c*. Also, the through holes 7 are filled with the conductive paste 12.

The formation of the multilayer wiring board assembly in accordance with the present embodiment is completed by laminating together, at a time or successively, the respective multilayer wiring board assembly components 20*a* to 20*c* by thermocompression with a most outer copper foil 9 as illustrated in FIG. 26(*a*) and forming a circuit on the most outer copper foil 9. The step of laminating the respective multilayer wiring board assembly components 20*a* to 20*c* and the most outer copper foil 9 to each other by thermocompression is carried out by heating them at 180° C. or thereabout and pressing (finally compression bonding) them at 40 kgf/cm² for 60 minutes or thereabout in order to embed the circuit pattern of the copper foil 2 and the brim 12*a* of the conductive paste 12 in the resin film 1B made of a thermoplastic polyimide having adhesivity and fluidity. At this time, the conductive paste 12 of the respective multilayer wiring board assembly components 20*a* to 20*c* are fixedly pressed and finally cured by thermocompression at the same time.

During the final compression bonding process, the conductive resin components (the conductive paste 12) shall not be deteriorated since the heating temperature is as low as 180° C.

Also, in this case, the multilayer wiring board assembly is not curled (warped). Namely, while the resin film having adhesivity is contracted or expanded during heating, the contraction or expansion can be cancelled out if there is a center line of symmetry in the cross section thereof. However, a polyimide film is a highly flexuous material and therefore tends to be curled (warped) when heated. However, since the heating temperature can be set as low as about 280 to 180° C. in accordance with this embodiment, no curl (warp) appears.

As detailedly explained in the above, in accordance with this embodiment, the resin film 1B having adhesivity is made of a thermoplastic polyimide base bonding sheet to which is given a thermosetting property so that it is possible to manufacture a multilayer wiring board assembly without deteriorating the conductive resin components (the conductive paste) and without forming curl (warp).

Also, since the through holes 7 of the multilayer wiring board assembly component 20*a* to 20*c* are filled with the conductive paste 12, it is possible to make the interlayer interconnection between each adjacent layers by via-on-via. Furthermore, since the projection 12*b* of the conductive paste 12 is formed in the printing surface, it becomes easy to make the electric connection between the conductive paste 12 having good electric connectivity when the interlayer interconnection is made by via-on-via.

Furthermore, since the conductive paste 12 is embedded in the through hole 7 during printing operation in order that the printing surface thereof is laterally extended from the opening 5 of the copper foil 2, the brim 12*a* of the conductive paste 12 makes reliable electric contact with the inner side surface and the upper surface of the copper foil 2 beyond the perimeter of the opening 5 thereof, and therefore it is possible to connect the copper foil 2 to the conductive paste 12 without compromising the electric connectivity between the copper foil 2 and the fillers of the conductive paste.

Still further, since the copper plated resin film 10 is used in the manufacturing process of the multilayer wiring board assembly component, it becomes easy to preserve the accuracy of alignment of dimensions and positions when holding a sample, opening a hole and filling the hole and, as a result, it is possible to save labor in the manufacturing works. Namely, in the case of a conventional case, the respective steps of holding a sample, opening a hole and filling the hole have to be conducted with a resin film (the polyimide film) having a small thickness as it is. However, in accordance with this embodiment, the respective steps of holding a sample, opening a hole and filling the hole are conducted after bonding the copper foil 2 to the resin film 1B and therefore it becomes easy to open and fill holes with the conductive paste 12.

Furthermore, since a desired multilayer wiring board assembly can be formed only by preparing multilayer wiring board assembly components as described above and combining and is joining them together, the press step of a multilayer wiring board assembly becomes easy without need for conducting press steps of multilayer wiring board assembly components.

Meanwhile, the profiles of the through hole 7 and the conductive paste 8 and 12 of the multilayer wiring board assembly component 20 as illustrated in FIGS. 1(*i*), 7(*j*), 8(*j*), 9(*e*), 12(*j*), 15(*k*), 18(*j*), 21(*j*) and 24(*j*) are usually circles as horizontally viewed (i.e., as viewed from above in FIGS. 1(*i*), 7(*j*), 8(*j*), 9(*e*), 12(*j*), 15(*k*), 18(*j*), 21(*j*) and 24(*j*)). While the present invention is not limited to those embodiments, other profiles are possible. As detailedly explained in the above, in accordance with the present invention, a through hole is opened through the copper plated resin film made of a resin film having adhesivity which is provided with a copper foil bonded to one surface thereof, and filled with a conductive paste, and therefore it becomes easy to form the through hole and embed the conductive paste because of the increase in thickness as compared with the case where a through hole is opened only through a resin film and filled with a conductive paste.

Also, in accordance with the present invention, the conductive paste of the multilayer wiring board assembly component is embedded in the through hole of the copper plated resin film by screen printing with a leading end of the conductive paste being projected from the resin film, and therefore it is possible to make reliable electric connection of the leading end of the conductive paste with the copper foil or the conductive paste of the multilayer wiring board assembly component and to improve electric connectivity between the respective layers when a plurality of the multilayer wiring board assembly components are laminated together. Particularly, in this case, direct connection between the conductive paste without the intermediary copper foil is effective to improve the electric connectivity.

As explained heretofore, in accordance with the present invention, it is possible to easily laminate together flexible FPCs having highly packing densities by via-on-via and chip-on-via.

Furthermore, since the resin film having adhesivity is made of a thermosetting resin in accordance with the present invention, it is possible to manufacture a multilayer wiring board assembly having a good heat resisting property with little damage to the respective boards during the manufacturing process.

Furthermore, the resin film having adhesivity is formed of a thermoplastic resin to which is given a thermosetting property in accordance with the present invention, and therefore it is possible to manufacture a multilayer wiring board assembly having a good heat resisting property without damaging the conductive resin components (the conductive paste).

Meanwhile, the resin film having adhesivity can be made of, for example, a thermoplastic resin such as a thermoplastic polyimide. In this case, the respective adjacent multilayer wiring board assembly components are fixedly joined by means of the resin film which is made soft by laminating the multilayer wiring board assembly components together and heating them, and therefore it is possible to make reliable electric connection of the conductive paste with the copper foil and the conductive paste of the adjacent multilayer wiring board assembly component. Also, in this case, smooth electrical connection can be achieved by finally curing the conductive paste at the same time as the multilayer wiring board assembly components are laminated together.

Furthermore, when a multilayer wiring board assembly component is laminated, it is preferred that the copper foil as the outermost layer is embedded in the resin film to which it is bonded. Namely, in this type of the multilayer wiring board assembly, plating is performed with gold and the like, taking into consideration the connection between an IC and the connection member such as solder and protection of the circuit from oxidation. However, when the circuit is exposed, the entirety of the electrode pattern including the sides has to be metallized to require much gold. Also, since the sides of the electrode pattern are metallized, the width of the circuit is increased making it difficult to form micropatterns and also increasing the rate of occurence of defective connections due to contamination of metallic impurities between circuits. Furthermore, if electrode patterns are closely located to each other, the plating solution is not uniformly applied making it difficult to uniformly perform the plating process.

At this point, since the copper foil as the outermost layer is embedded in the resin film, the side walls of the electrode pattern is not performed so that it is possible to reduce the amount of gold as required, to advance the miniaturization of circuits, to improve uniform application of the plating solution, and to prevent occurence of imperfect insulation due to contamination.

The foregoing description of the embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A multilayer wiring board assembly laminated with a plurality of multilayer wiring board assembly components, the multilayer wiring board assembly being manufactured by a method comprising:

preparing the plurality of multilayer wiring board assembly components, wherein each of the plurality of multilayer wiring board assembly components comprises:
a resin film having properties of adhesivity,
a copper foil bonded to one surface of the resin film,
a through hole opened through the copper foil and the resin film, and
a conductive paste embedded by screen printing in the through hole from a side of the copper foil such that a leading edge of the conductive paste is projected from the resin film; and laminating the multilayer wiring board assembly components with other multilayer wiring board assembly components such that the leading edge of the conductive paste is pressed against at least one of the conductive paste and the copper foil of an adjacent one of the multilayer wiring board assembly components, wherein the leading edge of the conductive paste is in close contact with at least one of the conductive paste and the copper foil of the adjacent one of the multilayer wiring board assembly components such that an electric connection having electric conductivity is formed.

2. The multilayer wiring board assembly as claimed in claim 1, wherein the conductive paste is embedded in the through hole with part of the conductive paste laterally extending beyond a perimeter of an opening of the through hole of the copper foil.

3. The multilayer wiring board assembly as claimed in claim 1, wherein the resin film comprises a thermoplastic adhesive.

4. The multilayer wiring board assembly as claimed in claim 1, wherein the resin film has properties-of adhesivity and fluidity.

5. The multilayer wiring board assembly as claimed in claim 1, wherein the laminating of the multilayer wiring board assembly components with the other multilayer wiring board assembly components comprises heating the multilayer wiring board assembly components and the other multilayer wiring board assembly components.

6. The multilayer wiring board assembly as claimed in claim 1, wherein the conductive paste is finally cured at a same time as the conductive paste is pressed.

* * * * *